(12) United States Patent
Li et al.

(10) Patent No.: US 12,426,375 B2
(45) Date of Patent: Sep. 23, 2025

(54) ARRAY SUBSTRATE, MANUFACTURING METHOD AND DISPLAY DEVICE

(71) Applicants: Fuzhou BOE Optoelectronics Technology Co., Ltd., Fujian (CN); BOE TECHNOLOGY GROUP CO., LTD., Beijing (CN)

(72) Inventors: Chunyu Li, Beijing (CN); Bo Hu, Beijing (CN); Xin Lin, Beijing (CN); Rong Zhou, Beijing (CN); Lifeng Lin, Beijing (CN); Jianshu Wang, Beijing (CN); Pei Hu, Beijing (CN)

(73) Assignees: Fuzhou BOE Optoelectronics Technology Co., Ltd., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/564,571

(22) PCT Filed: Feb. 28, 2023

(86) PCT No.: PCT/CN2023/078711
§ 371 (c)(1),
(2) Date: Nov. 27, 2023

(87) PCT Pub. No.: WO2024/178605
PCT Pub. Date: Sep. 6, 2024

(65) Prior Publication Data
US 2025/0089367 A1 Mar. 13, 2025

(51) Int. Cl.
*G09G 3/20* (2006.01)
*H10D 86/40* (2025.01)
*H10D 86/60* (2025.01)

(52) U.S. Cl.
CPC ............... *H10D 86/60* (2025.01); *G09G 3/20* (2013.01); *H10D 86/441* (2025.01); *G09G 2300/0426* (2013.01); *G09G 2310/08* (2013.01)

(58) Field of Classification Search
CPC ........ H10D 86/60; H10D 86/441; G09G 3/20; G09G 2300/0426; G09G 2310/08
See application file for complete search history.

(56) References Cited

U.S. PATENT DOCUMENTS 10,140,910 B2 * 11/2018 Wang ................... G09G 3/2092
11,288,993 B2 * 3/2022 Feng ..................... G11C 19/28
(Continued)

FOREIGN PATENT DOCUMENTS

| CN | 108766334 A | 11/2018 |
|---|---|---|
| CN | 109309100 A | 2/2019 |

(Continued)

*Primary Examiner* — Sejoon Ahn
(74) *Attorney, Agent, or Firm* — McCoy Russell LLP

(57) ABSTRACT

An array substrate includes a driving circuit arranged on the base substrate, and the driving circuit includes a pull-up node control circuit, a first pull-down node control circuit, and an output circuit; the pull-up node control circuit controls a potential of the pull-up node; the first pull-down node control circuit controls to write a first control voltage provided by the first control voltage line into the first pull-down node; the output circuit controls the driving signal output terminal to output a driving signal under the control of the potential of the pull-up node; the array substrate also includes a first conductive portion arranged on the base substrate; the first conductive portion is electrically connected to the first control voltage line.

17 Claims, 30 Drawing Sheets

(56) References Cited

U.S. PATENT DOCUMENTS

| | | | |
|---|---|---|---|
| 2013/0056736 A1 | 3/2013 | Kim et al. | |
| 2013/0146931 A1* | 6/2013 | Liu | H10D 86/411 |
| | | | 438/22 |
| 2015/0214508 A1 | 7/2015 | Sakairi | |
| 2018/0166521 A1* | 6/2018 | Bae | H10D 86/00 |
| 2020/0035184 A1 | 1/2020 | Luo et al. | |
| 2020/0193932 A1 | 6/2020 | Liu et al. | |
| 2020/0225516 A1* | 7/2020 | Qiu | H10D 86/441 |
| 2020/0226997 A1* | 7/2020 | Watanabe | G09G 3/3607 |
| 2020/0227498 A1* | 7/2020 | Cheng | H10K 59/123 |
| 2020/0227560 A1* | 7/2020 | Itoh | H10D 86/60 |
| 2020/0227561 A1* | 7/2020 | Yamazaki | H10D 99/00 |
| 2020/0228728 A1* | 7/2020 | Kenjo | H04N 5/2628 |
| 2021/0012747 A1* | 1/2021 | Wang | G06F 1/3206 |
| 2021/0012750 A1* | 1/2021 | Kwon | G09G 5/10 |
| 2021/0013235 A1* | 1/2021 | Toda | H10D 86/60 |
| 2021/0013246 A1* | 1/2021 | Zhang | H10D 86/423 |
| 2021/0013297 A1* | 1/2021 | Okabe | G09F 9/30 |
| 2022/0208070 A1* | 6/2022 | Dong | G09G 3/2092 |
| 2022/0302240 A1 | 9/2022 | Zhang et al. | |
| 2022/0344480 A1 | 10/2022 | Wang et al. | |
| 2023/0012488 A1 | 1/2023 | Ma et al. | |
| 2023/0207570 A1* | 6/2023 | Noh | H10D 86/481 |
| | | | 257/72 |
| 2023/0298509 A1 | 9/2023 | Liu et al. | |
| 2024/0107805 A1* | 3/2024 | Jeong | H10D 30/6755 |

FOREIGN PATENT DOCUMENTS

| | | |
|---|---|---|
| CN | 209357444 U | 9/2019 |
| CN | 110767665 A | 2/2020 |
| CN | 108831403 B | 9/2020 |
| CN | 108877722 B | 12/2020 |
| CN | 112164366 A | 1/2021 |
| CN | 112634974 A | 4/2021 |
| CN | 113393799 A | 9/2021 |
| CN | 113838404 A | 12/2021 |
| CN | 114913805 A | 8/2022 |
| CN | 115295556 A | 11/2022 |
| CN | 115359831 A | 11/2022 |
| KR | 102323630 B1 | 11/2021 |
| WO | 2022001442 A1 | 1/2022 |
| WO | 2022252024 A1 | 12/2022 |

* cited by examiner

ARRAY SUBSTRATE, MANUFACTURING METHOD AND DISPLAY DEVICE

CROSS REFERENCE TO RELATED APPLICATION

The present disclosure is the U.S. national phase of PCT Application No. PCT/CN2023/078711 filed on Feb. 28, 2023, which are incorporated herein by reference in their entireties.

TECHNICAL FIELD

The present disclosure relates to the field of display technology, in particular to an array substrate, a manufacturing method and a display device.

BACKGROUND

In the related art, when switching between the 17T1C driving circuit and the 21T1C driving circuit, since the structure of the 17T1C driving circuit is different from that of the 21T1C driving circuit, the number of masks that need to be changed is large, which results in a high cost for mask when improving the product compatibility.

SUMMARY

In one aspect, the present disclosure provides in some embodiments an array substrate, comprising a driving circuit arranged on a base substrate, wherein the driving circuit includes a pull-up node control circuit, a first pull-down node control circuit, and an output circuit; the pull-up node control circuit is electrically connected to a pull-up node, and is configured to control a potential of the pull-up node; the first pull-down node control circuit is electrically connected to a first control voltage line and a first pull-down node, and is configured to control to write a first control voltage provided by the first control voltage line into the first pull-down node; the output circuit is electrically connected to the pull-up node and a driving signal output terminal respectively, and is configured to control the driving signal output terminal to output a driving signal under the control of the potential of the pull-up node; the array substrate further includes a first conductive portion arranged on the base substrate; the first conductive portion is electrically connected to the first control voltage line.

Optionally, a shortest distance between an orthographic projection of the first conductive portion on the base substrate and an orthographic projection of the first control voltage line on the base substrate is greater than or equal to 4 um and less than or equal to 12 um.

Optionally, the first conductive portion is formed by a first gate pattern; or, the first conductive portion is formed by the first gate pattern and a first active pattern; the first gate pattern is electrically connected to the first control voltage line.

Optionally, the first pull-down node control circuit comprises a second transistor; a gate electrode of the second transistor is electrically connected to a first connection structure, a first electrode of the second transistor is electrically connected to the first control voltage line, a second electrode of the second transistor is electrically connected to the first pull-down node.

Optionally, the first connection structure is electrically connected to the first control voltage line.

Optionally, the first pull-down node control circuit is further configured to write a first voltage signal provided by a first voltage line into the first pull-down node; the array substrate further includes a second conductive portion arranged on the base substrate; the second conductive portion is electrically connected to the pull-up node.

Optionally, the second conductive portion is formed by a third gate pattern; or, the second conductive portion is formed by the third gate pattern and a third active pattern; the third gate pattern is electrically connected to the pull-up node.

Optionally, a shortest distance between an orthographic projection of the second conductive portion on the base substrate and an orthographic projection of the first control voltage line on the base substrate is greater than or equal to 4 um; a shortest distance between the orthographic projection of the second conductive portion on the base substrate and an orthographic projection of the first voltage line on the base substrate is greater than or equal to 4 um and less than or equal to 12 um.

Optionally, the first pull-down node control circuit comprises a fourth transistor; a gate electrode of the fourth transistor is electrically connected to the pull-up node, a first electrode of the fourth transistor is electrically connected to the first pull-down node, and a second electrode of the fourth transistor is electrically connected to the first voltage line.

Optionally, the driving circuit further comprises a second pull-down node control circuit; the second pull-down node control circuit is electrically connected to a second control voltage line and a second pull-down node, and is configured to control to write a second control voltage provided by the second control voltage line into the second pull-down node; the array substrate further includes a third conductive portion arranged on the base substrate; the third conductive portion is electrically connected to the second control voltage line.

Optionally, the third conductive portion is formed by a fifth gate pattern; or, the third conductive portion is formed by the fifth gate pattern and a fifth active pattern.

Optionally, a shortest distance between an orthographic projection of the third conductive portion on the base substrate and an orthographic projection of the second control voltage line on the base substrate is greater than or equal to 4 um and less than or equal to 12 um.

Optionally, the second pull-down node control circuit comprises a sixth transistor; a gate electrode of the sixth transistor is electrically connected to a second connection structure, a first electrode of the sixth transistor is electrically connected to the second control voltage line, and a second electrode of the sixth transistor is electrically connected to the second pull-down node.

Optionally, the second connection structure is electrically connected to the second control voltage line.

Optionally, the second pull-down node control circuit is further configured to write the first voltage signal provided by the first voltage line into the second pull-down node; the array substrate further includes a fourth conductive portion arranged on the base substrate; the fourth conductive portion is electrically connected to the pull-up node.

Optionally, the fourth conductive portion is formed by a seventh gate pattern; or, the fourth conductive portion is formed by the seventh gate pattern and a seventh active pattern; the seventh gate pattern is electrically connected to the pull-up node.

Optionally, a shortest distance between an orthographic projection of the fourth conductive portion on the base substrate and an orthographic projection of the second control voltage line on the base substrate is greater than or equal to 4 um, and a shortest distance between the orthographic projection of the fourth conductive portion on the base substrate and an orthographic projection of the first voltage line on the base substrate is greater than or equal to 4 um and less than or equal to 12 um.

Optionally, the second pull-down node control circuit comprises an eighth transistor; a gate electrode of the eighth transistor is electrically connected to the pull-up node, a first electrode of the eighth transistor is electrically connected to the second pull-down node, and a second electrode of the eighth transistor is electrically connected to the first voltage line.

Optionally, the array substrate further comprises a first source-drain metal pattern and a third source-drain metal pattern arranged on the base substrate; the first source-drain metal pattern includes a first electrode of a first transistor and a second electrode of the first transistor; the first electrode of the first transistor is electrically connected to the first control voltage line, and the second electrode of the first transistor is electrically connected to the first connection structure; an orthographic projection of at least part of the first electrode of the first transistor on the base substrate overlaps an orthographic projection of the first conductive portion on the base substrate, and an orthographic projection of at least part of the second electrode of the first transistor on the base substrate overlaps the orthographic projection of the first conductive portion on the base substrate; the third source-drain metal pattern includes a first electrode of a third transistor and a second electrode of the third transistor; the first electrode of the third transistor is electrically connected to the first connection structure, and the second electrode of the third transistor is electrically connected to the first voltage line; an orthographic projection of at least part of the first electrode of the third transistor on the base substrate overlaps an orthographic projection of the second conductive portion on the base substrate, and an orthographic projection of at least part of the second electrode of the third transistor on the base substrate overlaps the orthographic projection of the second conductive portion on the base substrate.

Optionally, the array substrate further comprises a fifth source-drain metal pattern arranged on the base substrate and a seventh source-drain metal pattern arranged on the base substrate; the fifth source-drain metal pattern includes a first electrode of a fifth transistor and a second electrode of the fifth transistor; the first electrode of the fifth transistor is electrically connected to the second control voltage line, and the second electrode of the fifth transistor is electrically connected to the second connection structure; an orthographic projection of at least part of the first electrode of the fifth transistor on the base substrate overlaps an orthographic projection of a third conductive portion on the base substrate, and an orthographic projection of at least part of the second electrode of the fifth transistor on the base substrate overlaps the orthographic projection of the third conductive portion on the base substrate; the seventh source-drain metal pattern includes a first electrode of a seventh transistor and a second electrode of the seventh transistor; the first electrode of the seventh transistor is electrically connected to the second connection structure, and the second electrode of the seventh transistor is electrically connected to the first voltage line; an orthographic projection of at least part of the first electrode of the seventh transistor on the base substrate overlaps an orthographic projection of a fourth conductive portion on the base substrate, and an orthographic projection of at least part of the second electrode of the seventh transistor on the base substrate overlaps the orthographic projection of the fourth conductive portion on the base substrate.

Optionally, the pull-up node control circuit comprises a ninth transistor, a tenth transistor, an eleventh transistor, a twelfth transistor, and a thirteenth transistor; a gate electrode of the ninth transistor is electrically connected to a first input terminal, a first electrode of the ninth transistor is electrically connected to a second input terminal, and a second electrode of the ninth transistor is electrically connected to the pull-up node; a gate electrode of the tenth transistor is electrically connected to a reset terminal, a first electrode of the tenth transistor is electrically connected to the pull-up node, and a second electrode of the tenth transistor is electrically connected to the first voltage line; a gate electrode of the eleventh transistor is electrically connected to a start voltage line, a first electrode of the eleventh transistor is electrically connected to the pull-up node, and a second electrode of the eleventh transistor is electrically connected to the first voltage line; a gate electrode of the twelfth transistor is electrically connected to the first pull-down node, a first electrode of the twelfth transistor is electrically connected to the pull-up node, and a second electrode of the twelfth transistor is electrically connected to the first voltage line; a gate electrode of the thirteenth transistor is electrically connected to a second pull-down node, a first electrode of the twelfth transistor is electrically connected to the pull-up node, and a second electrode of the twelfth transistor is connected to the first voltage line.

Optionally, the driving circuit further comprises a first pull-down reset circuit and a second pull-down reset circuit; the first pull-down reset circuit includes a fourteenth transistor; the second pull-down reset circuit includes a fifteenth transistor; a gate electrode of the fourteenth transistor is electrically connected to a first input terminal, a first electrode of the fourteenth transistor is electrically connected to the first pull-down node, and a second electrode of the fourteenth transistor is electrically connected to the first voltage line; a gate electrode of the fifteenth transistor is electrically connected to the first input terminal, a first electrode of the fifteenth transistor is electrically connected to a second pull-down node, and a second electrode of the fifteenth transistor is electrically connected to the first voltage line.

Optionally, the output circuit comprises a sixteenth transistor; a gate electrode of the sixteenth transistor is electrically connected to the pull-up node, and a first electrode of the sixteenth transistor is electrically connected to a clock signal line, and a second electrode of the sixteenth transistor is electrically connected to the driving signal output terminal; the first electrode of the ninth transistor includes N first electrode portions, and the second electrode of the ninth transistor includes N second electrode portions; the first electrode of the sixteenth transistor includes M first electrode portions, and the second electrode of the sixteenth transistor includes M second electrode portions; an nth first electrode portion of the ninth transistor and an nth second electrode portion of the ninth transistor are arranged in an nth first source-drain area; an mth first electrode portion of the sixteenth transistor and an mth second electrode portion of the sixteenth transistor are arranged in an mth second source-drain area; N and M are integers greater than 1, n is a positive integer less than or equal to N, and m is a positive integer less than or equal to M.

Optionally, an active pattern included in transistors in the driving circuit include at least one strip-shaped active pattern portion; or, the active pattern included in the transistors in the driving circuit is a block-shaped active pattern.

In a second aspect, an embodiment of the present disclosure provides a method of manufacturing the array substrate, includes: forming the pull-up node control circuit, the first pull-down node control circuit, and the output circuit on the base substrate; forming the first conductive portion and the first control voltage line on the base substrate, and electrically connecting the first conductive portion to the first control voltage line.

Optionally, the forming the first conductive portion and the first control voltage line on the base substrate, and electrically connecting the first conductive portion to the first control voltage line includes: forming a first metal layer on the base substrate, performing a patterning process on the first metal layer to form a first gate pattern, the first gate pattern including the first conductive portion; forming a second metal layer on a side of the first metal layer away from the base substrate, performing a patterning on the second metal layer using a first mask to form the first control voltage line; electrically connecting the first gate pattern to the first control voltage line, wherein the first conductive portion and the second metal layer do not overlap in a direction perpendicular to the base substrate.

Optionally, the forming the first conductive portion and the first control voltage line on the base substrate, and electrically connecting the first conductive portion to the first control voltage line includes: forming a first metal layer on the base substrate, performing a patterning process on the first metal layer to form a first gate pattern, the first gate pattern including the first conductive portion; forming a second metal layer on a side of the first metal layer away from the base substrate, performing a patterning process on the second metal layer using a second mask to form the first control voltage line, and a first electrode of a first transistor and a second electrode of the first transistor; wherein an orthographic projection of the first electrode of the first transistor on the base substrate at least partially overlaps an orthographic projection of the first conductive portion on the base substrate, and an orthographic projection of the second electrode of the first transistor on the base substrate at least partially overlaps the orthographic projection of the first conductive portion on the base substrate.

Optionally, the method further includes: forming a conductive layer on a side of the second metal layer away from the substrate, and performing a patterning process on the conductive layer to form a first connection structure; electrically connecting the first electrode of the first transistor to the first control voltage line, and electrically connecting the second electrode of the first transistor to the first connection structure; an orthographic projection of at least part of the first electrode of the first transistor on the base substrate overlapping the orthographic projection of the first conductive portion on the base substrate, and an orthographic projection of at least part of the second electrode of the first transistor on the base substrate overlapping the orthographic projection of the first conductive portion on the base substrate.

Optionally, the method further includes: performing a patterning process on the first metal layer to form a third gate pattern included in a second conductive portion; electrically connecting the third gate pattern to the pull-up node.

Optionally, the method further includes: performing a patterning process on the second metal layer to form a first voltage line, a first electrode of a third transistor, and a second electrode of the third transistor; electrically connecting the first electrode of the third transistor to the first connection structure, and electrically connecting the second electrode of the third transistor to the first voltage line; an orthographic projection of at least part of the first electrode of the third transistor on the base substrate overlapping an orthographic projection of the second conductive portion on the base substrate, and an orthographic projection of at least part of the second electrode of the third transistor on the base substrate overlapping the orthographic projection of the second conductive portion on the base substrate.

Optionally, the method further includes: performing a patterning process on the first metal layer to form a fifth gate pattern included in a third conductive portion; performing a patterning process on the second metal layer to form a second control voltage line; electrically connecting the fifth gate pattern to the second control voltage line.

Optionally, the method further includes: performing a patterning process on the second metal layer to form a first electrode of a fifth transistor and a second electrode of the fifth transistor; performing a patterning process on the first conductive portion to form a second connection structure; electrically connecting the first electrode of the fifth transistor to the second control voltage line, and electrically connecting the second electrode of the fifth transistor to the second connection structure; an orthographic projection of at least part of the first electrode of the fifth transistor on the base substrate overlapping an orthographic projection of a third conductive portion on the base substrate, and an orthographic projection of at least part of the second electrode of the fifth transistor on the base substrate overlapping the orthographic projection of the third conductive portion on the base substrate.

Optionally, the method further includes: performing a patterning process on the first metal layer to form a seventh gate pattern included in a fourth conductive portion; electrically connecting the seventh gate pattern to the pull-up node.

Optionally, the method further includes: performing a patterning process on the second metal layer to form a first voltage line, a first electrode of a seventh transistor, and a second electrode of the seventh transistor; electrically connecting the first electrode of the seventh transistor to the second connection structure, and electrically connecting the second electrode of the seventh transistor to the first voltage line; an orthographic projection of at least part of the first electrode of the seventh transistor on the base substrate overlapping an orthographic projection of a fourth conductive portion on the base substrate, and an orthographic projection of at least part of the second electrode of the seventh transistor on the base substrate overlapping the orthographic projection of the fourth conductive portion on the base substrate.

In a third aspect, an embodiment of the present disclosure provides a display device including the array substrate.

BRIEF DESCRIPTION OF THE DRAWINGS

FIG. 10 is a layout diagram of the second part of the 21T1C driving circuit shown in FIG. 2;

FIG. 15 is a layout diagram of the second part of the 21T1C driving circuit shown in FIG. 2;

FIG. 20 is a layout diagram of the fourth part of the 21T1C driving circuit shown in FIG. 2;

FIG. 25 is a layout diagram of the fifth part of the 21T1C driving circuit shown in FIG. 2;

FIG. 30 is a layout diagram of the sixth part of the 21T1C driving circuit shown in FIG. 2;

FIG. 34 is a layout diagram of the seventh part of the 21T1C driving circuit shown in FIG. 2;

FIG. 38 is a layout diagram of the eighth part of the 21T1C driving circuit shown in FIG. 2;

DETAILED DESCRIPTION

Figures 1, 2:
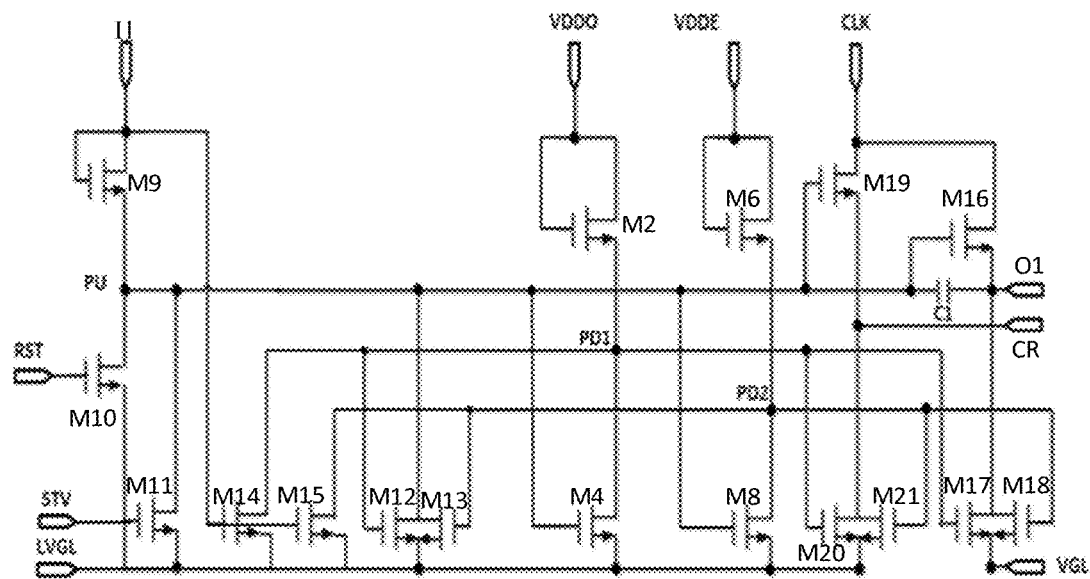
FIG. 1 is a circuit diagram of a 17T1C driving circuit according to at least one embodiment of the present disclosure.
FIG. 2 is a circuit diagram of a 21T1C driving circuit according to at least one embodiment of the present disclosure.

The following will clearly and completely describe the technical solutions in the embodiments of the present disclosure with reference to the accompanying drawings. Obviously, the described embodiments are only some of the embodiments of the present disclosure, not all of them. Based on the embodiments in the present disclosure, all other embodiments obtained by those ordinary skill in the art without making creative work belong to the protection scope of the present disclosure. The embodiment of the present disclosure may be implemented separately or combined, which is not limited herein.

The transistors used in all the embodiments of the present disclosure may be thin film transistors or field effect transistors or other devices with the same characteristics. In the embodiments of the present disclosure, in order to distinguish the two electrodes of the transistor except the gate electrode, one electrode is called the first electrode, and the other electrode is called the second electrode.

In actual operation, when the transistor is a thin film transistor or a field effect transistor, the first electrode may be a drain electrode, and the second electrode may be a source electrode; or, the first electrode may be a source electrode, and the second electrode may be a drain electrode.

The array substrate described in the embodiments of the present disclosure includes a driving circuit arranged on the base substrate, and the driving circuit includes a pull-up node control circuit, a first pull-down node control circuit, and an output circuit;

The pull-up node control circuit is electrically connected to a pull-up node, and is configured to control a potential of the pull-up node;

The first pull-down node control circuit is electrically connected to a first control voltage line and a first pull-down node, and is configured to control to write a first control voltage provided by the first control voltage line into the first pull-down node;

The output circuit is electrically connected to the pull-up node and a driving signal output terminal respectively, and is configured to control the driving signal output terminal to output a driving signal under the control of the potential of the pull-up node;

The array substrate also includes a first conductive portion arranged on the base substrate;

The first conductive portion is electrically connected to the first control voltage line.

In at least one embodiment of the present disclosure, the first conductive portion may include a first gate pattern. In the 17T1C driving circuit, only the first conductive portion is provided without the first transistor. In the 21T1C driving circuit, the first transistor is provided, at least one embodiment of the present disclosure can realize the switching between the 17T1C driving circuit and the 21T1C driving circuit only by adding a mask (the mask can be the mask used when making the source-drain metal layer), thereby effectively improving product compatibility and saving the mask cost.

In at least one embodiment of the present disclosure, the first conductive portion may be a metal structure. In this case, the impedance of the driving circuit may be reduced by arranging the first conductive portion.

In at least one embodiment of the present disclosure, a shortest distance between an orthographic projection of the first conductive portion on the base substrate and an orthographic projection of the first control voltage line on the base substrate is greater than or equal to 4 um and less than or equal to 12 um, to facilitate wiring, facilitate electrical connection between the first control voltage line and the first conductive portion, and facilitate maintenance.

In specific implementation, the shortest distance between the orthographic projection of the first conductive portion on the base substrate and the orthographic projection of the first control voltage line on the base substrate is greater than or equal to 4 um to facilitate maintenance; the shortest distance between the orthographic projection of the first conductive portion on the base substrate and the orthographic projection of the first control voltage line on the base substrate is less than or equal to 12 um, so as to facilitate wiring and facilitate the electrical connection between the first control voltage line and the first conductive portion.

As shown in FIG. 1, at least one embodiment of the 17T1C driving circuit may include a pull-up node control circuit, a first pull-down node control circuit, an output circuit, a second pull-down node control circuit, a first pull-down reset circuit, a second pull-down reset circuit and a carry output circuit;

The first pull-down node control circuit includes a second transistor M2 and a fourth transistor M4;

a gate electrode of the second transistor M2 is electrically connected to the first control voltage line VDDO, a first electrode of the second transistor M2 is electrically connected to the first control voltage line VDDO, and a second electrode of the second transistor M2 is electrically connected to the first pull-down node PD1;

A gate electrode of the fourth transistor M4 is electrically connected to the pull-up node PU, a first electrode of the fourth transistor M4 is electrically connected to the first pull-down node PD1, and a second electrode of the fourth transistor M4 is electrically connected to the first voltage line LVGL;

The second pull-down node control circuit includes a sixth transistor M6 and an eighth transistor M8;

A gate electrode of the sixth transistor M6 is electrically connected to the second control voltage line VDDE, a first electrode of the sixth transistor M6 is electrically connected to the second control voltage line VDDE, and a second electrode of the sixth transistor M6 is electrically connected to the second pull-down node PD2;

A gate electrode of the eighth transistor M8 is electrically connected to the pull-up node PU, a first electrode of the eighth transistor M8 is electrically connected to the second pull-down node PD2, and a second electrode of the eighth transistor M8 is electrically connected to the first voltage line LVGL;

The pull-up node control circuit includes a ninth transistor M9, a tenth transistor M10, an eleventh transistor M11, a twelfth transistor M12, and a thirteenth transistor M13;

A gate electrode of the ninth transistor M9 is electrically connected to the first input terminal I1, a first electrode of the ninth transistor M9 is electrically connected to the first input terminal I1, and a second electrode of the ninth transistor M9 is electrically connected to the pull-up node PU;

A gate electrode of the tenth transistor M10 is electrically connected to the reset terminal RST, a first electrode of the tenth transistor M10 is electrically connected to the pull-up node PU, and a second electrode of the tenth transistor M10 is electrically connected to the first voltage line LVGL;

A gate electrode of the eleventh transistor M11 is electrically connected to a start voltage line STV, a first electrode of the eleventh transistor M11 is electrically connected to the pull-up node PU, and a second electrode of the eleventh transistor M11 is electrically connected to the first voltage line LVGL;

A gate electrode of the twelfth transistor M12 is electrically connected to the first pull-down node PD1, a first electrode of the twelfth transistor M12 is electrically connected to the pull-up node PU, and a second electrode of the twelfth transistor M12 is electrically connected to the first voltage line LVGL;

A gate electrode of the thirteenth transistor M13 is electrically connected to the second pull-down node PD2, a first electrode of the thirteenth transistor M13 is electrically connected to the pull-up node PU, and a second electrode of the thirteenth transistor M13 is electrically connected to the first voltage line LVGL;

The first pull-down reset circuit includes a fourteenth transistor M14; the second pull-down reset circuit includes a fifteenth transistor M15;

A gate electrode of the fourteenth transistor M14 is electrically connected to the first input terminal I1, a first electrode of the fourteenth transistor M14 is electrically connected to the first pull-down node PD1, and a second electrode of the fourteenth transistor M14 is electrically connected to the first voltage line LVBL;

A gate electrode of the fifteenth transistor M15 is electrically connected to the first input terminal I1, a first electrode of the fifteenth transistor M15 is electrically connected to the second pull-down node PD2, and a second electrode of the fifteenth transistor M15 is electrically connected to the first voltage line LVGL;

The output circuit includes a sixteenth transistor M16, a seventeenth transistor M17, an eighteenth transistor M18 and a first capacitor C1;

A gate electrode of the sixteenth transistor M16 is electrically connected to the pull-up node PU, a first electrode of the sixteenth transistor M16 is electrically connected to a clock signal line CLK, and a second electrode of the sixteenth transistor M16 is electrically connected to the driving signal output terminal O1;

A gate electrode of the seventeenth transistor M17 is electrically connected to the first pull-down node PD1, a first electrode of the seventeenth transistor M17 is electrically connected to the driving signal output terminal O1, and a second electrode of the seventeenth transistor M17 is electrically connected to the second voltage line VGL;

A gate electrode of the eighteenth transistor M18 is electrically connected to the second pull-down node PD2, a first electrode of the eighteenth transistor M18 is electrically connected to the driving signal output terminal O1, and a second electrode of the eighteenth transistor M18 is electrically connected to the second voltage line VGL;

A first electrode plate of the first capacitor C1 is electrically connected to the pull-up node PU, and a second electrode plate of the first capacitor C1 is electrically connected to the driving signal output terminal O1;

The carry output circuit includes a nineteenth transistor M19, a twentieth transistor M20 and a twenty-first transistor M21;

A gate electrode of the nineteenth transistor M19 is electrically connected to the pull-up node PU, a first electrode of the nineteenth transistor M19 is electrically connected to the clock signal line CLK, and a second electrode of the nineteenth transistor M19 is electrically connected to the carry signal output terminal CR;

A gate electrode of the twentieth transistor M20 is electrically connected to the first pull-down node PD1, a first electrode of the twentieth transistor M20 is electrically connected to the carry signal output terminal CR, and a second electrode of the twentieth transistor M20 is electrically connected to the first voltage line LVGL;

A gate electrode of the twenty-first transistor M21 is electrically connected to the second pull-down node PD2, a first electrode of the twenty-first transistor M21 is electrically connected to the carry signal output terminal CR, and a second electrode of the twenty-first transistor M21 is electrically connected to the first voltage line LVGL.

In at least one embodiment of the present disclosure, the first electrode of the ninth transistor may also be electrically connected to the second input terminal; the first input terminal may be the same input terminal as the second input terminal, or the first input terminal can be different from the second input terminal.

Optionally, the first voltage line LVGL can be a first low voltage line, the second voltage line VGL can be a second low voltage line, and the first low voltage signal provided by the first voltage line LVGL can be the same as the second low voltage signal provided by the second voltage line VGL, or, the first low voltage signal provided by the first voltage line LVGL may be different from the second low voltage signal provided by the second voltage line VGL, the voltage value of the first low voltage signal is smaller than the voltage value of the second low voltage signal.

As shown in FIG. 2, the 21T1C driving circuit may include a pull-up node control circuit, a first pull-down node control circuit, an output circuit, a second pull-down node control circuit, a first pull-down reset circuit, a second pull-down reset circuit and a carry output circuit;

The first pull-down node control circuit includes a first transistor M1, a second transistor M2, a third transistor M3 and a fourth transistor M4;

Both the gate electrode of the first transistor M1 and the first electrode of the first transistor M1 are electrically connected to the first control voltage line VDDO, and the second electrode of the first transistor M1 is electrically connected to the first pull-down control node PDCN1;

The gate electrode of the second transistor M2 is electrically connected to the first pull-down control node PDCN1, the first electrode of the second transistor M2 is electrically connected to the first control voltage line VDDO, and the second electrode of the second transistor M2 is electrically connected to the first pull-down node PD1;

The gate electrode of the third transistor M3 is electrically connected to the pull-up node PU, the first electrode of the third transistor M3 is electrically connected to the first pull-down control node PDCN1, and the second electrode of the third transistor M3 is electrically connected to the first voltage line LVGL;

The gate electrode of the fourth transistor M2 is electrically connected to the pull-up node PU, the first electrode of the fourth transistor M4 is electrically connected to the first pull-down node PD1, and the second electrode of the fourth transistor M4 is electrically connected to the first voltage line LVGL;

The second pull-down node control circuit includes a fifth transistor M5, a sixth transistor M6, a seventh transistor M7 and an eighth transistor M8;

Both the gate electrode of the fifth transistor M5 and the first electrode of the fifth transistor M5 are electrically connected to the second control voltage line VDDE, and the second electrode of the fifth transistor M5 is electrically connected to the second pull-down control node PDCN2;

The gate electrode of the sixth transistor M6 is electrically connected to the second pull-down control node PDCN2, the first electrode of the sixth transistor M6 is electrically connected to the second control voltage line VDDE, and the second electrode of the sixth transistor M6 is electrically connected to the second pull-down node PD2;

The gate electrode of the seventh transistor M7 is electrically connected to the pull-up node PU, the first electrode of the seventh transistor M7 is electrically connected to the second pull-down control node PDCN2, and the second electrode of the seventh transistor M7 is electrically connected to the first voltage line LVGL;

The gate electrode of the eighth transistor M8 is electrically connected to the pull-up node PU, the first electrode of the eighth transistor M8 is electrically connected to the second pull-down node PD2, and the second electrode of the eighth transistor M8 is electrically connected to the first voltage line LVGL;

The pull-up node control circuit includes a ninth transistor M9, a tenth transistor M10, an eleventh transistor M11, a twelfth transistor M12, and a thirteenth transistor M13;

The gate electrode of the ninth transistor M9 is electrically connected to the first input terminal I1, the first electrode of the ninth transistor M9 is electrically connected to the first input terminal I1, and the second electrode of the ninth transistor M9 is connected to the pull-up node PU;

The gate electrode of the tenth transistor M10 is electrically connected to the reset terminal RST, the first electrode of the tenth transistor M10 is electrically connected to the pull-up node PU, and the second electrode of the tenth transistor M10 is electrically connected to the first voltage line LVGL;

The gate electrode of the eleventh transistor M11 is electrically connected to the start voltage line STV. Optionally, a plurality of cascaded gate driving circuits are arranged in the non-display area of the display panel, at least part of the gate driving circuits or all of the gate driving circuits are electrically connected to the start voltage line STV, and are used for performing a total reset function, that is, to reset the gate driving circuits between adjacent frames, and the first electrode of the eleventh transistor M11 is electrically connected to the pull-up node PU, and the second electrode of the eleventh transistor M11 is electrically connected to the first voltage line LVGL;

The gate electrode of the twelfth transistor M12 is electrically connected to the first pull-down node PD1, the first electrode of the twelfth transistor M12 is electrically connected to the pull-up node PU, and the second electrode of the twelfth transistor M12 is electrically connected to the first voltage line LVGL;

The gate electrode of the thirteenth transistor M13 is electrically connected to the second pull-down node PD2, the first electrode of the thirteenth transistor M13 is electrically connected to the pull-up node PU, and the second electrode of the thirteenth transistor M13 is electrically connected to the first voltage line LVGL;

The first pull-down reset circuit includes a fourteenth transistor M14; the second pull-down reset circuit includes a fifteenth transistor M15;

The gate electrode of the fourteenth transistor M14 is electrically connected to the first input terminal I1, the first electrode of the fourteenth transistor M14 is electrically connected to the first pull-down node PD1, and the second electrode of the fourteenth transistor M14 is electrically connected to the first voltage line LVGL;

The gate electrode of the fifteenth transistor M15 is electrically connected to the first input terminal I1, the first electrode of the fifteenth transistor M15 is electrically connected to the second pull-down node PD2, and the second electrode of the fifteenth transistor M15 electrically connected to the first voltage line LVGL;

The output circuit includes a sixteenth transistor M16, a seventeenth transistor M17, an eighteenth transistor M18 and a first capacitor C1;

The gate electrode of the sixteenth transistor M16 is electrically connected to the pull-up node PU, the first electrode of the sixteenth transistor M16 is electrically connected to the clock signal line CLK, and the second electrode of the sixteenth transistor M16 is electrically connected to the driving signal output terminal O1;

The gate electrode of the seventeenth transistor M17 is electrically connected to the first pull-down node PD1, the first electrode of the seventeenth transistor M17 is electrically connected to the driving signal output terminal O1, and the second electrode of the seventeenth transistor M17 is electrically connected to the second voltage line VGL;

The gate electrode of the eighteenth transistor M18 is electrically connected to the second pull-down node PD2, the first electrode of the eighteenth transistor M18 is electrically connected to the driving signal output terminal O1, and the second electrode of the eighteenth transistor M18 is electrically connected to the second voltage line VGL;

The first electrode plate of the first capacitor C1 is electrically connected to the pull-up node PU, and the second electrode plate of the first capacitor C1 is electrically connected to the driving signal output terminal O1;

The carry output circuit includes a nineteenth transistor M19, a twentieth transistor M20 and a twenty-first transistor M21;

The gate electrode of the nineteenth transistor M19 is electrically connected to the pull-up node PU, the first electrode of the nineteenth transistor M19 is electrically connected to the clock signal line CLK, and the second electrode of the nineteenth transistor M19 is electrically connected to the carry signal output terminal CR;

The gate electrode of the twentieth transistor M20 is electrically connected to the first pull-down node PD1, the first electrode of the twentieth transistor M20 is electrically connected to the carry signal output terminal CR, and the second electrode of the twentieth transistor M20 is electrically connected to the first voltage line LVGL;

The gate electrode of the twenty-first transistor M21 is electrically connected to the second pull-down node PD2, the first electrode of the twenty-first transistor M21 is electrically connected to the carry signal output terminal CR, and the second electrode of the twenty-first transistor M21 is electrically connected to the first voltage line LVGL.

In at least one embodiment of the present disclosure, the pull-up node control circuit may also only include the ninth transistor and the tenth transistor, so as to control the potential of the pull-up node under the control of the input signal provided by the input terminal and the reset signal provided by the reset terminal. Optionally, the first conductive portion is formed by a first gate pattern; or, the first conductive portion is formed by a first gate pattern and a first active pattern;

The first gate pattern is electrically connected to the first control voltage line.

Figure 3A:
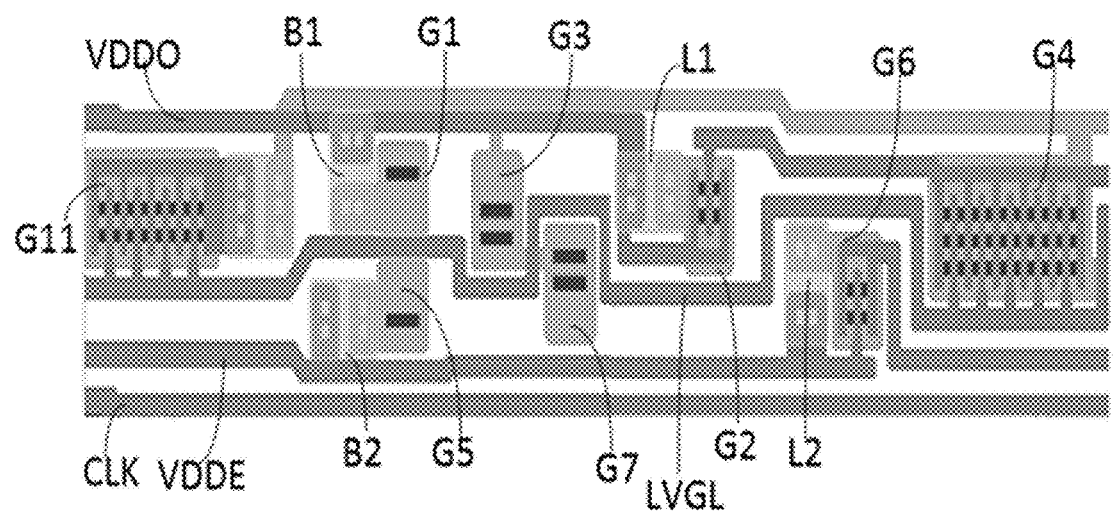
FIGS. 3A and 3B are layout diagrams of the first part of the 17T1C driving circuit shown in FIG. 1.
Figure 3B:
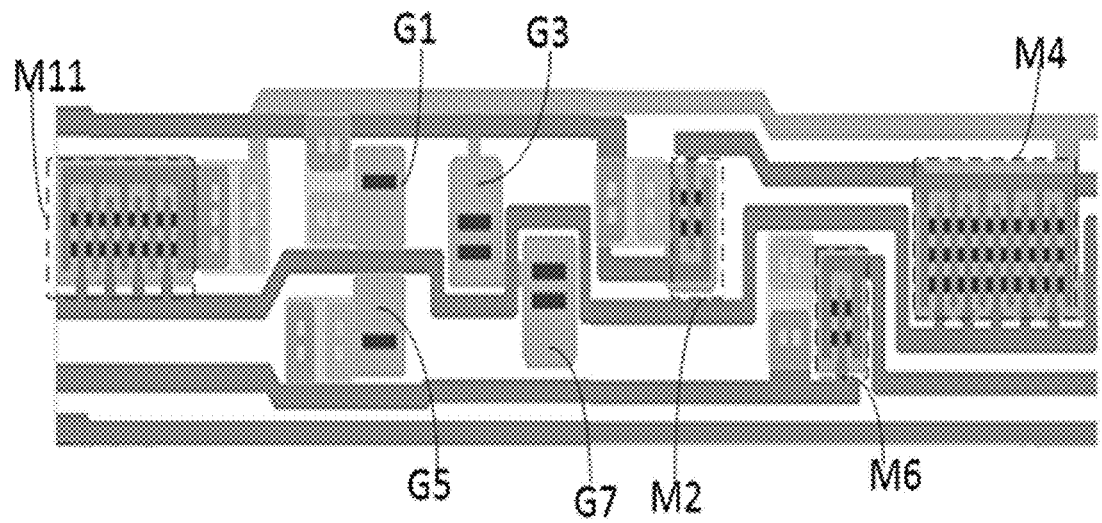
Figure 4A:
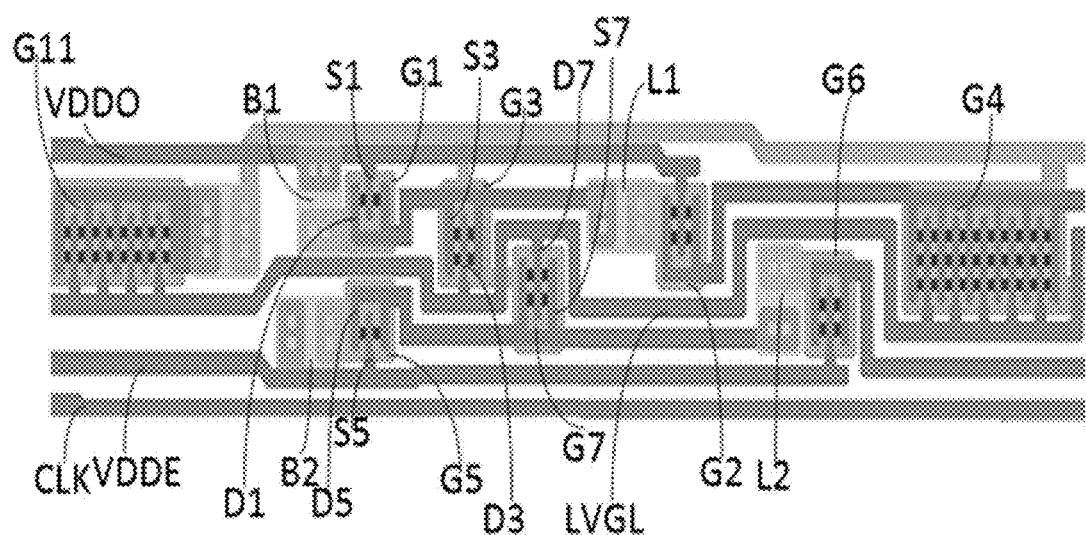
FIGS. 4A and 4B are the layout diagrams of the first part of the 21T1C driving circuit shown in FIG. 2.
Figure 4B:
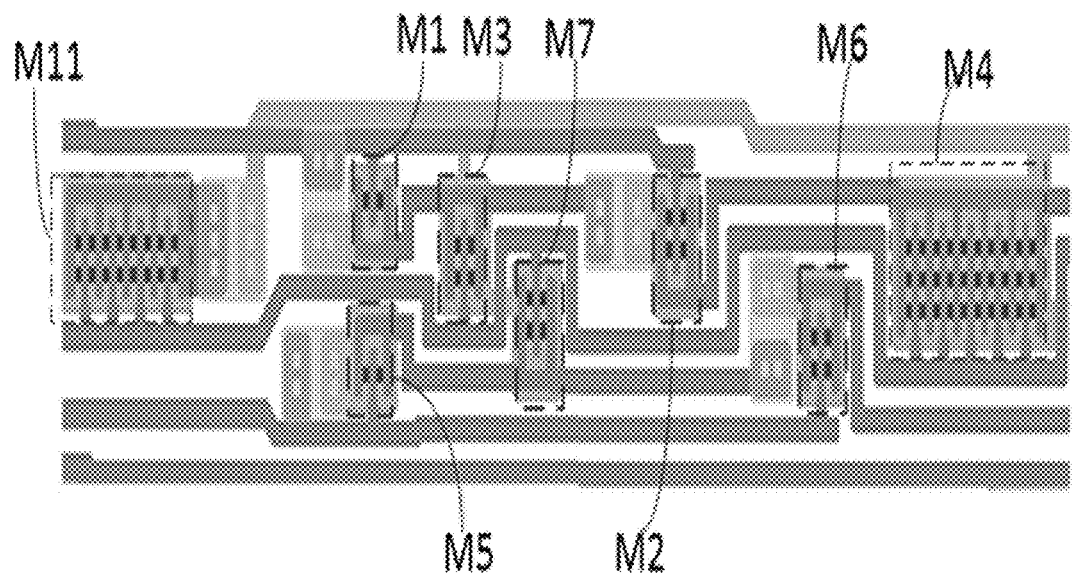
Figure 5:
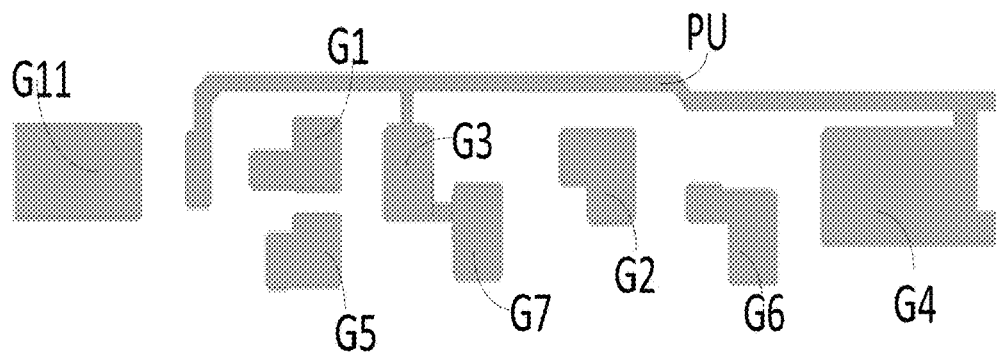
FIG. 5 is a layout diagram of the gate metal layer in FIG. 3A.
Figure 6:
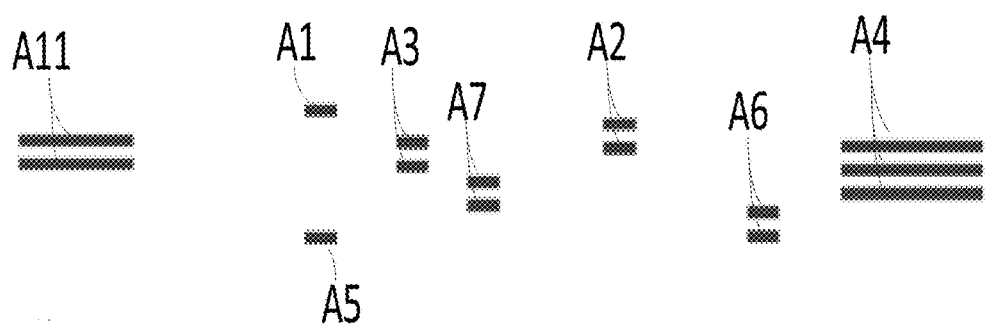
FIG. 6 is a layout diagram of the semiconductor layer in FIG. 3A.
Figure 7A:
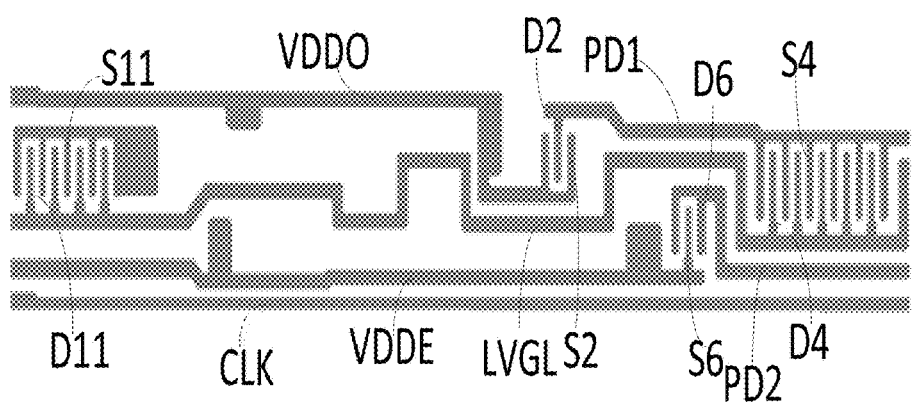
FIGS. 7A and 7B are layout diagrams of a source-drain metal layer in FIG. 3A.
Figure 7B:
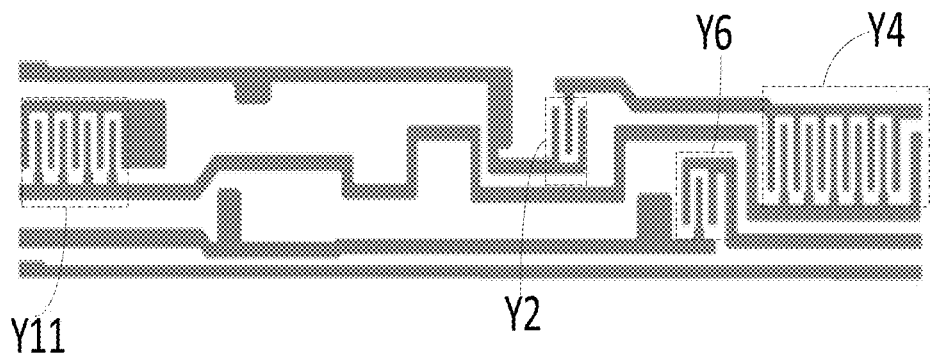
Figure 8:
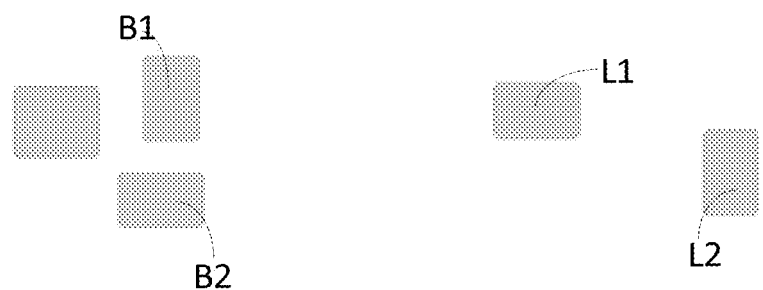
FIG. 8 is a layout diagram of the conductive layer in FIG. 3A.
Figure 9A:
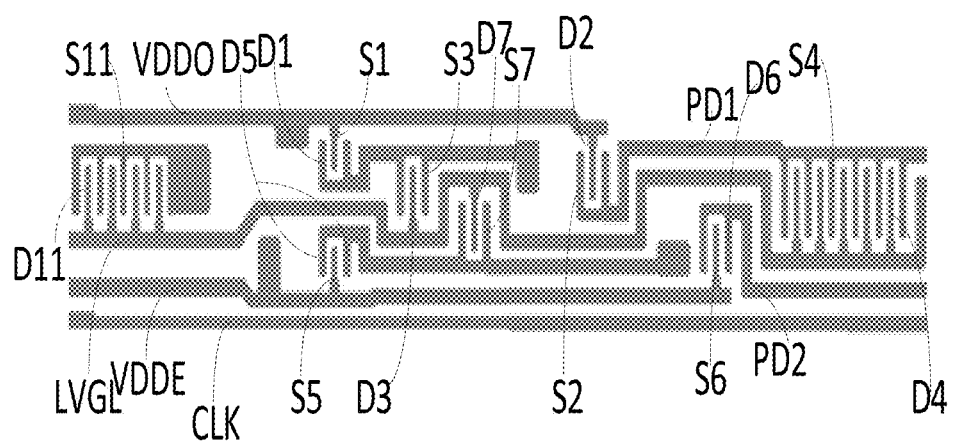
FIGS. 9A and 9B are layout diagrams of the source-drain metal layer in FIG. 4A.
Figure 9B:
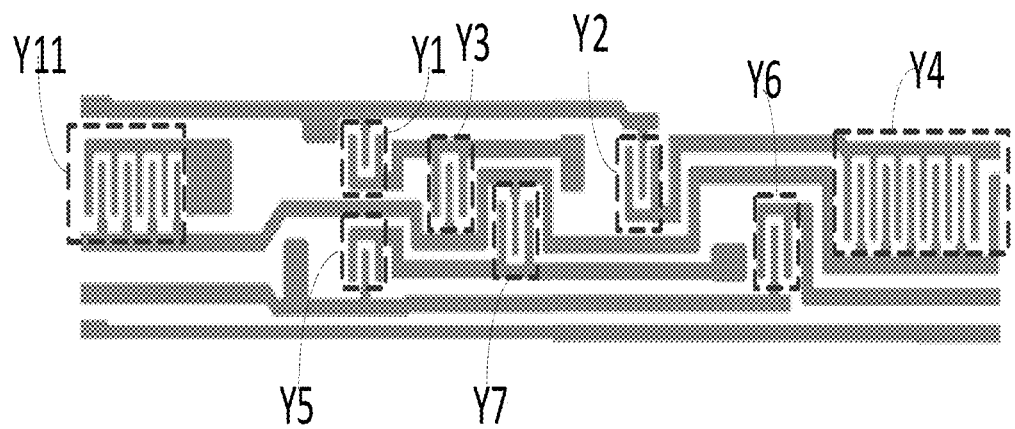

FIGS. 3A and 3B are layout diagrams of the first part of the 17T1C driving circuit shown in FIG. 1;

FIG. 4A and FIG. 4B are the layout diagrams of the first part of the 21T1C driving circuit shown in FIG. 2;

FIG. 5 is a layout diagram of the gate metal layer in FIG. 3A, FIG. 6 is a layout diagram of the semiconductor layer in FIG. 3A, FIG. 7A and FIG. 7B are the layout diagrams of the source-drain metal layer in FIG. 3A, and FIG. 8 is a layout diagram of the conductive layer in FIG. 3A;

FIGS. 9A and 9B are layout diagrams of the source-drain metal layer in FIG. 4A.

The layout of the gate metal layer in FIG. 4A is shown in FIG. 5, the layout of the semiconductor layer in FIG. 4A is shown in FIG. 6, and the conductive layer in FIG. 4A is shown in FIG. 8.

Optionally, the first pull-down node control circuit includes a second transistor;

A gate electrode of the second transistor is electrically connected to a first connection structure, a first electrode of the second transistor is electrically connected to the first control voltage line, and a second electrode of the second transistor is electrically connected to the first pull-down node.

In at least one embodiment of the present disclosure, the first connection structure is electrically connected to the first control voltage line.

As shown in FIG. 5, the one labeled G1 is the first gate pattern, and the one labeled G2 is the gate electrode of the second transistor;

In FIG. 7A and FIG. 9A, the one labeled VDDO is the first control voltage line, the one labeled S2 is the first electrode of the second transistor, and the one labeled D2 is the second electrode of the second transistor;

In FIG. 8, the one labeled B1 is the first connection portion, and the one labeled L1 is the first connection structure;

In FIG. 6, the one labeled A1 is the first active pattern, and the one labeled A2 is the second active pattern;

As shown in FIG. 3A and FIG. 4A, the first gate pattern G1 is electrically connected to the first connection portion B1 through a via hole, and the first connection portion B1 is electrically connected to the first control voltage line VDDO through a via hole. Optionally, the first connection portion B1 can be arranged on the same layer as the pixel electrode or common electrode included in the display area, and the first connection portion B1 can be formed on an indium tin oxide (ITO) electrode layer;

The gate electrode G2 of the second transistor is electrically connected to the first connection structure L1 through the via hole, and the first connection structure L1 is electrically connected to the first control voltage line VDDO through the via hole. Optionally, the first connection structure L1 may arranged at the same layer as the pixel electrodes or common electrodes included in the display area, and the first connection structure can be formed on the ITO electrode layer;

The first electrode S2 of the second transistor is electrically connected to the first control voltage line VDDO, and the second electrode D2 of the second transistor is electrically connected to the first pull-down node PD1.

As shown in FIGS. 7A and 9A, the first pull-down node PD1 may be electrically connected to the second electrode D2 of the second transistor and the first electrode of the fourth transistor, respectively.

In at least one embodiment of the present disclosure, the first pull-down node control circuit is further configured to write the first voltage signal provided by the first voltage line into the first pull-down node;

The array substrate further includes a second conductive portion arranged on the base substrate;

The second conductive portion is electrically connected to the pull-up node.

Optionally, the second conductive portion is formed by a third gate pattern; or, the second conductive portion is formed by the third gate pattern and a third active pattern;

The third gate pattern is electrically connected to the pull-up node.

In at least one embodiment of the present disclosure, the third gate pattern may be directly electrically connected to the pull-up node, or the third gate pattern may be indirectly electrically connected to the pull-up node.

In specific implementation, when the third gate pattern is indirectly electrically connected to the pull-up node, other components may be arranged between the third gate pattern and the pull-up node, or, a connection line between the third gate pattern and the pull-up node is switched between different conductive layers; but it is not limited thereto.

In FIG. 5, the one labeled G3 is the third gate pattern included in the second conductive portion.

As shown in FIG. 3A and FIG. 4A, the third gate pattern G3 is electrically connected to the pull-up node PU, and the pull-up node PU may be electrically connected to the gate electrode G4 of the fourth transistor.

In FIG. 5, the one labeled PU is a pull-up node.

Optionally, the shortest distance between the orthographic projection of the second conductive portion on the base substrate and the orthographic projection of the first control voltage line on the base substrate is greater than or equal to 4 um, so as to facilitate maintenance;

The shortest distance between the orthographic projection of the second conductive portion on the base substrate and the orthographic projection of the first voltage line on the base substrate is greater than or equal to 4 um and less than or equal to 12 um, so as to facilitate wiring and facilitate the electrical connection between the second conductive portion and the first voltage line, and facilitate maintenance.

The shortest distance between the orthographic projection of the second conductive portion on the base substrate and the orthographic projection of the first voltage line on the base substrate is greater than or equal to 4 um to facilitate maintenance;

The shortest distance between the orthographic projection of the second conductive portion on the base substrate and the orthographic projection of the first voltage line on the base substrate is less than or equal to 12 um, to facilitate the electrical connection between the second conductive portion and the first voltage line.

In at least one embodiment of the present disclosure, the first pull-down node control circuit includes a fourth transistor;

The gate electrode of the fourth transistor is electrically connected to the pull-up node, the first electrode of the fourth transistor is electrically connected to the first pull-down node, and the second electrode of the fourth transistor is electrically connected to the first voltage line.

In FIG. 6, the one labeled A3 is the third active pattern, and the one labeled A4 is the fourth active pattern;

In FIG. 5, the one labeled G4 is the gate electrode of the fourth transistor, and the gate electrode G4 of the fourth transistor is electrically connected to the pull-up node PU.

In FIG. 7A and FIG. 9A, the one labeled S4 is the first electrode of the fourth transistor, the one labeled D4 is the second electrode of the fourth transistor, the one labeled LVGL is the first voltage line, and the one labeled PD1 is the first pull-down node.

As shown in FIG. 3A and FIG. 4A, the gate electrode G4 of the fourth transistor is electrically connected to the pull-up node PU, the first electrode S4 of the fourth transistor is electrically connected to the first pull-down node PD1, and the second electrode D4 of the fourth transistor is electrically connected to the first voltage line LVGL.

In at least one embodiment of the present disclosure, the driving circuit further includes a second pull-down node control circuit;

The second pull-down node control circuit is electrically connected to the second control voltage line and the second pull-down node, and is configured to control to write the second control voltage provided by the second control voltage line into the second pull-down node;

The array substrate further includes a third conductive portion arranged on the base substrate;

The third conductive portion is electrically connected to the second control voltage line.

Optionally, the third conductive portion is formed by a fifth gate pattern; or, the third conductive portion is formed by the fifth gate pattern and a fifth active pattern.

In FIG. 5, the one labeled G5 is the fifth gate pattern included in the third conductive portion.

In FIG. 6, the one labeled A5 is the fifth active pattern.

In FIG. 7A and FIG. 9A, the one labeled VDDE is the second control voltage line.

In FIG. 8, the one labeled B2 is the second connection portion.

As shown in FIG. 3A and FIG. 4A, the fifth gate pattern G5 is electrically connected to the second connection portion B2 through a via hole;

The second connection portion B2 is electrically connected to the second control voltage line VDDE through the via hole.

In at least one embodiment of the present disclosure, the shortest distance between the orthographic projection of the third conductive portion on the base substrate and the orthographic projection of the second control voltage line on the base substrate is greater than or equal to 4 um and less than or equal to 12 um, to facilitate wiring, facilitate the electrical connection between the third conductive portion and the second control voltage line, and facilitate maintenance.

In specific implementation, the shortest distance between the orthographic projection of the third conductive portion on the base substrate and the orthographic projection of the second control voltage line on the base substrate is greater than or equal to 4 um to facilitate maintenance; the shortest distance between the orthographic projection of the third conductive portion on the base substrate and the orthographic projection of the second control voltage line on the base substrate is less than or equal to 12 um, so as to facilitate wiring and facilitate the electrical connection between the third conductive portion and the second control voltage line.

Optionally, the second pull-down node control circuit includes a sixth transistor;

A gate electrode of the sixth transistor is electrically connected to a second connection structure, a first electrode of the sixth transistor is electrically connected to the second control voltage line, and a second electrode of the sixth transistor is electrically connected to the second pull-down node.

In at least one embodiment of the present disclosure, the second connection structure is electrically connected to the second control voltage line.

As shown in FIG. 5, the one labeled G6 is the gate electrode of the sixth transistor.

As shown in FIG. 6, the one labeled A6 is the sixth active pattern.

In FIG. 7A and FIG. 9A, the one labeled S6 is the first electrode of the sixth transistor, and the one labeled D6 is the second electrode of the sixth transistor;

In FIG. 8, the one labeled L2 is the second connection structure.

As shown in FIG. 3A and FIG. 4A, the gate electrode G6 of the sixth transistor is electrically connected to the second connection structure L2 through the via hole, and the second connection structure L2 is electrically connected to the second control voltage line VDDE through the via hole;

The first electrode S6 of the sixth transistor is electrically connected to the second control voltage line VDDE;

The second electrode D6 of the sixth transistor is electrically connected to the second pull-down node PD2, and the second pull-down node PD2 may be electrically connected to the first electrode of the eighth transistor.

In FIG. 7A and FIG. 9A, the one labeled PD2 is the second pull-down node.

In at least one embodiment of the present disclosure, the second pull-down node control circuit is further configured to write the first voltage signal provided by the first voltage line into the second pull-down node;

The array substrate further includes a fourth conductive portion arranged on the base substrate;

The fourth conductive portion is electrically connected to the pull-up node.

Optionally, the fourth conductive portion is formed by a seventh gate pattern; or, the fourth conductive portion is formed by the seventh gate pattern and a seventh active pattern;

The seventh gate pattern is electrically connected to the pull-up node.

As shown in FIG. 5, the one labeled G7 is the seventh gate pattern included in the fourth conductive portion;

As shown in FIG. 5, the seventh gate pattern G7 is electrically connected to the pull-up node PU.

In FIG. 6, the one labeled A7 is the seventh active pattern.

Optionally, a shortest distance between an orthographic projection of the fourth conductive portion on the base substrate and the orthographic projection of the second control voltage line on the base substrate is greater than or equal to 4 um to facilitate maintenance;

The shortest distance between the orthographic projection of the fourth conductive portion on the base substrate and the orthographic projection of the first voltage line on the base substrate is greater than or equal to 4 um and less than or equal to 12 um, so as to facilitate wiring and facilitate the electrical connection between the fourth conductive portion and the first voltage line, and facilitate maintenance.

In specific implementation, the shortest distance between the orthographic projection of the fourth conductive portion on the base substrate and the orthographic projection of the first voltage line on the base substrate is greater than or equal to 4 um, so as to facilitate maintenance; the shortest distance between the orthographic projection of the fourth conductive portion on the base substrate and the orthographic projection of the first voltage line on the base substrate is less than or equal to 12 um, so as to facilitate wiring and facilitate the electrical connection between the fourth conductive portion and the first voltage line.

In at least one embodiment of the present disclosure, the second pull-down node control circuit includes an eighth transistor;

A gate electrode of the eighth transistor is electrically connected to the pull-up node, a first electrode of the eighth transistor is electrically connected to the second pull-down node, and a second electrode of the eighth transistor is electrically connected to the first voltage line.

Figure 10:
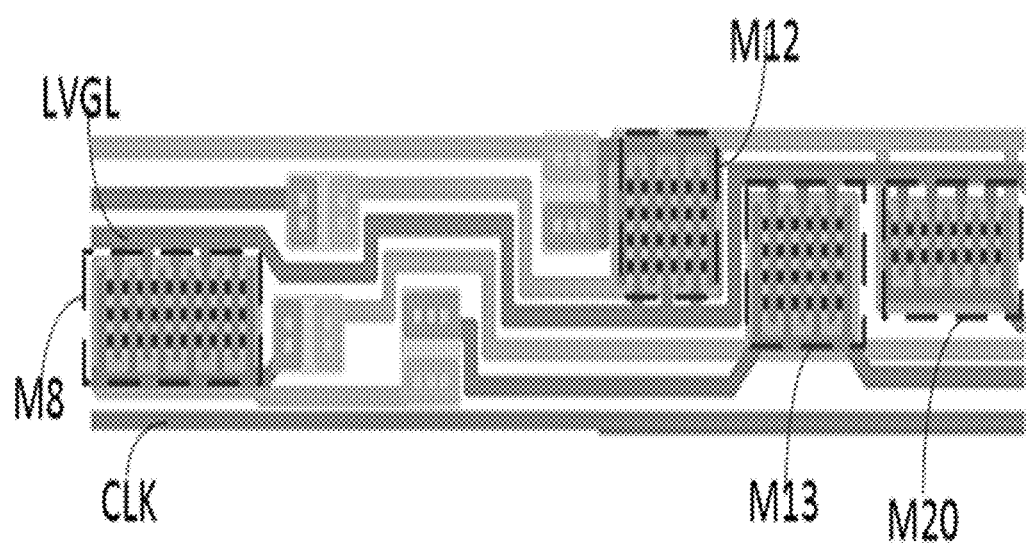
FIG. 10 is a layout diagram of the second part of the 17T1C driving circuit shown in FIG. 1.
Figure 11:
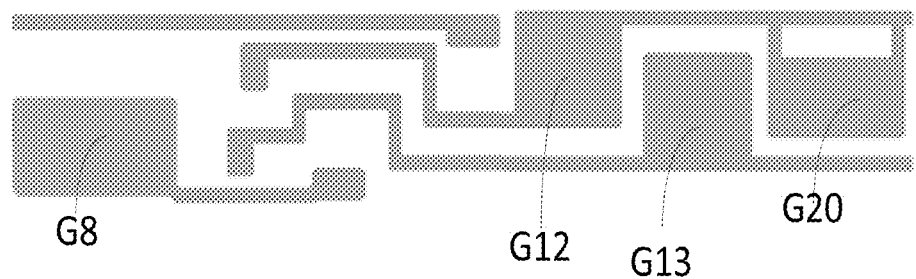
FIG. 11 is a layout diagram of the gate metal layer in FIG. 10.
Figure 12:
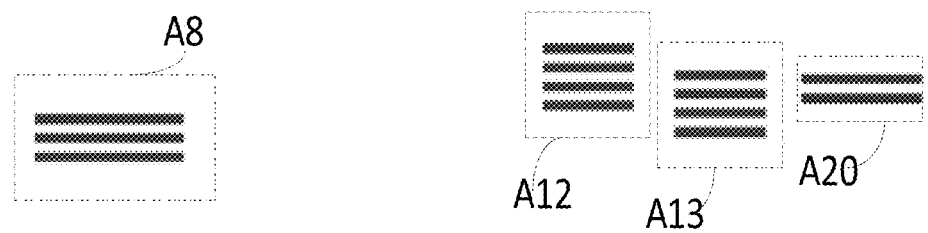
FIG. 12 is a layout diagram of the semiconductor layer in FIG. 10.
Figure 13A:
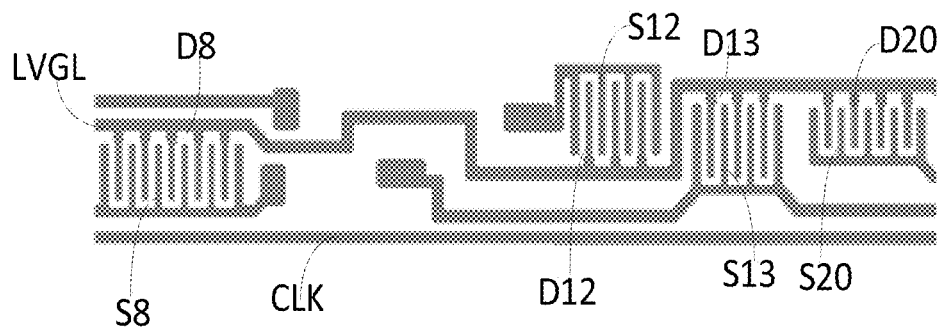
FIGS. 13A and 13B are layout diagrams of the source-drain metal layer in FIG. 10.
Figure 13B:
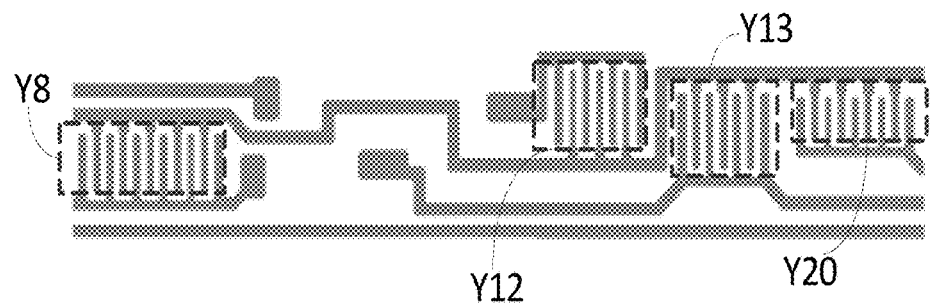
Figure 14:
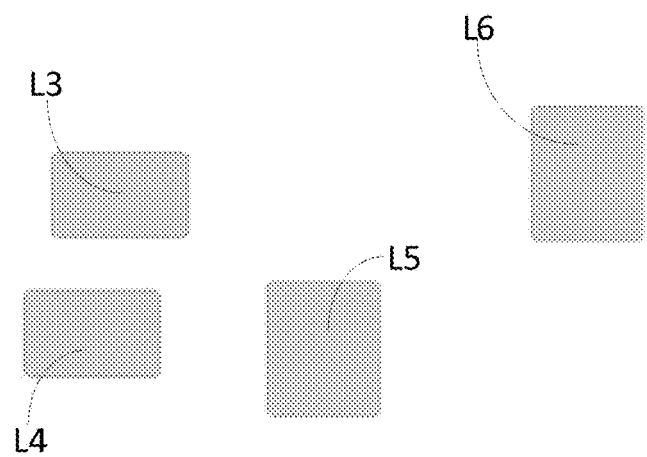
FIG. 14 is a layout diagram of the conductive layer in FIG. 10.

FIG. 10 is a layout diagram of the second part of the 17T1C driving circuit shown in FIG. 1, and FIG. 10 is a layout diagram of the second part of the 21T1C driving circuit shown in FIG. 2;

FIG. 11 is a layout diagram of the gate metal layer in FIG. 10, FIG. 12 is a layout diagram of the semiconductor layer in FIG. 10, FIG. 13A and FIG. 13B are the layout diagrams of the source-drain metal layer in FIG. 10, FIG. 14 is the layout diagram of the conductive layer in FIG. 10;

As shown in FIG. 11, the one labeled G8 is the gate electrode of the eighth transistor;

In FIG. 12, the one labeled A8 is an eighth active pattern;

In FIG. 13A, the one labeled S8 is the first electrode of the eighth transistor, and the one labeled D8 is the second electrode of the eighth transistor.

As shown in FIG. 10, the second electrode D8 of the eighth transistor is electrically connected to the first voltage line LVGL.

In at least one embodiment corresponding to FIG. 3A, FIG. 4A and FIG. 10, the gate electrode G8 of the eighth transistor is electrically connected to the gate electrode G4 of the fourth transistor, that is, the gate electrode G8 of the eighth transistor is electrically connected to the pull-up node;

The first electrode S8 of the eighth transistor is electrically connected to the second electrode D6 of the sixth transistor, that is, the first electrode S8 of the eighth transistor is electrically connected to the second pull-down node.

The array substrate according to at least one embodiment of the present disclosure further includes a first source-drain metal pattern and a third source-drain metal pattern arranged on the base substrate;

The first source-drain metal pattern includes a first electrode of the first transistor and a second electrode of the first transistor;

The first electrode of the first transistor is electrically connected to the first control voltage line, and the second electrode of the first transistor is electrically connected to the first connection structure;

An orthographic projection of at least part of the first electrode of the first transistor on the base substrate overlaps an orthographic projection of the first conductive portion on the base substrate, and an orthographic projection of at least part of the second electrode of the first transistor on the base substrate overlaps the orthographic projection of the first conductive portion on the base substrate;

The third source-drain metal pattern includes a first electrode of a third transistor and a second electrode of the third transistor;

The first electrode of the third transistor is electrically connected to the first connection structure, and the second electrode of the third transistor is electrically connected to the first voltage line;

An orthographic projection of at least part of the first electrode of the third transistor on the base substrate overlaps an orthographic projection of the second conductive portion on the base substrate, and an orthographic projection of at least part of the second electrode of the third transistor on the base substrate overlaps the orthographic projection of the second conductive portion on the base substrate.

During specific implementation, the orthographic projection of at least part of the first electrode of the first transistor on the base substrate overlaps an orthographic projection of the first gate pattern included in the first conductive portion on the base substrate, the orthographic projection of at least part of the second electrode of the first transistor on the base substrate overlaps the orthographic projection of the first gate pattern included in the first conductive portion on the base substrate;

The orthographic projection of at least part of the first electrode of the third transistor on the base substrate overlaps the orthographic projection of the third gate pattern included in the second conductive portion on the base substrate, the orthographic projection of at least part of the second electrode of the third transistor on the base substrate overlaps the orthographic projection of the third gate pattern included in the second conductive portion on the base substrate.

The array substrate according to at least one embodiment of the present disclosure further includes a first source-drain metal pattern and a third source-drain metal pattern arranged on the base substrate;

As shown in FIG. 9A, the first source-drain metal pattern includes a first electrode S1 of the first transistor and a second electrode D1 of the first transistor;

As shown in FIG. 4A, the first electrode S1 of the first transistor is electrically connected to the first control voltage line VDDO, and the second electrode D1 of the first transistor is electrically connected to the first connection structure L1;

The orthographic projection of at least part of the first electrode S1 of the first transistor on the base substrate overlaps the orthographic projection of the first gate pattern G1 on the base substrate, and the orthographic projection of at least part of the second electrode D1 of the first transistor on the base substrate overlaps the orthographic projection of the first gate pattern G1 on the base substrate;

As shown in FIG. 9A, the third source-drain metal pattern includes a first electrode S3 of the third transistor and a second electrode D3 of the third transistor;

As shown in FIG. 4A, the first electrode S3 of the third transistor is electrically connected to the first connection structure L1, and the second electrode D3 of the third transistor is electrically connected to the first voltage line LVGL;

The orthographic projection of at least part of the first electrode S3 of the third transistor on the base substrate overlaps the orthographic projection of the third gate pattern G3 on the base substrate, and the orthographic projection of at least part of the second electrode D3 of the third transistor on the base substrate overlaps the orthographic projection of the third gate pattern G3 on the base substrate.

In at least one embodiment of the present disclosure, the array substrate further includes a fifth source-drain metal pattern arranged on the base substrate; the array substrate further includes a seventh source-drain metal pattern arranged on the base substrate;

The fifth source-drain metal pattern includes a first electrode of a fifth transistor and a second electrode of the fifth transistor;

The first electrode of the fifth transistor is electrically connected to the second control voltage line, and the second electrode of the fifth transistor is electrically connected to the second connection structure;

The orthographic projection of at least part of the first electrode of the fifth transistor on the base substrate overlaps the orthographic projection of the third conductive portion on the base substrate, and the orthographic projection of at least part of the second electrode of the fifth transistor on the base substrate overlaps an orthographic projection of the third conductive portion on the base substrate;

The seventh source-drain metal pattern includes a first electrode of a seventh transistor and a second electrode of the seventh transistor;

The first electrode of the seventh transistor is electrically connected to the second connection structure, and the second electrode of the seventh transistor is electrically connected to the first voltage line;

An orthographic projection of at least part of the first electrode of the seventh transistor on the base substrate overlaps an orthographic projection of the fourth conductive portion on the base substrate, and an orthographic projection of at least part of the second electrode of the seventh transistor on the base substrate overlaps the orthographic projection of the fourth conductive portion on the base substrate.

During specific implementation, the orthographic projection of at least part of the first electrode of the fifth transistor on the base substrate overlaps the orthographic projection of the fifth gate pattern included in the third conductive portion on the base substrate, the orthographic projection of at least part of the second electrode of the fifth transistor on the base substrate overlaps the orthographic projection of the fifth gate pattern included in the third conductive portion on the base substrate; the orthographic projection of at least part of the first electrode of the seventh transistor on the base substrate overlaps the orthographic projection of the seventh gate pattern included in the fourth conductive portion on the base substrate, the orthographic projection of at least part of the second electrode of the seventh transistor on the base substrate overlaps the orthographic projection of the seventh gate pattern included in the fourth conductive portion on the base substrate.

In at least one embodiment of the present disclosure, the array substrate further includes a fifth source-drain metal pattern arranged on the base substrate; the array substrate further includes a seventh source-drain metal pattern arranged on the base substrate;

As shown in FIG. 9A, the fifth source-drain metal pattern includes a first electrode S5 of the fifth transistor and a second electrode D5 of the fifth transistor;

As shown in FIG. 4A, the first electrode S5 of the fifth transistor is electrically connected to the second control voltage line VDDE, and the second electrode D5 of the fifth transistor is electrically connected to the second connection structure L2;

The orthographic projection of at least part of the first electrode S5 of the fifth transistor on the base substrate overlaps the orthographic projection of the fifth gate pattern G5 on the base substrate, and the orthographic projection of at least part of the second electrode D5 of the fifth transistor on the base substrate overlaps the orthographic projection of the fifth gate pattern G5 on the base substrate;

As shown in FIG. 9A, the seventh source-drain metal pattern includes a first electrode S7 of the seventh transistor and a second electrode D7 of the seventh transistor;

As shown in FIG. 4A, the first electrode S7 of the seventh transistor is electrically connected to the second connection structure L2, and the second electrode D7 of the seventh transistor is electrically connected to the first voltage line LVGL;

The orthographic projection of at least part of the first electrode S7 of the seventh transistor on the base substrate overlaps the orthographic projection of the seventh gate pattern G7 on the base substrate, and the orthographic projection of at least part of the second electrode D7 of the seventh transistor on the base substrate overlaps the orthographic projection of the seventh gate pattern G7 on the base substrate.

Optionally, the pull-up node control circuit includes a ninth transistor, a tenth transistor, an eleventh transistor, a twelfth transistor, and a thirteenth transistor;

A gate electrode of the ninth transistor is electrically connected to the first input terminal, a first electrode of the ninth transistor is electrically connected to the second input terminal, and a second electrode of the ninth transistor is electrically connected to the pull-up node;

A gate electrode of the tenth transistor is electrically connected to the reset terminal, a first electrode of the tenth transistor is electrically connected to the pull-up node, and a second electrode of the tenth transistor is electrically connected to the first voltage line;

A gate electrode of the eleventh transistor is electrically connected to the start voltage line, a first electrode of the eleventh transistor is electrically connected to the pull-up node, and a second electrode of the eleventh transistor is electrically connected to the first voltage line;

A gate electrode of the twelfth transistor is electrically connected to the first pull-down node, a first electrode of the twelfth transistor is electrically connected to the pull-up node, and a second electrode of the twelfth transistor is electrically connected to the first voltage line;

A gate electrode of the thirteenth transistor is electrically connected to the second pull-down node, a first electrode of the twelfth transistor is electrically connected to the pull-up node, and a second electrode of the twelfth transistor is connected to the first voltage line.

In at least one embodiment of the present disclosure, the driving circuit further includes a first pull-down reset circuit and a second pull-down reset circuit; the first pull-down reset circuit includes a fourteenth transistor; the second pull-down reset circuit includes a fifteenth transistor;

A gate electrode of the fourteenth transistor is electrically connected to the first input terminal, a first electrode of the fourteenth transistor is electrically connected to the first pull-down node, and a second electrode of the fourteenth transistor is electrically connected to the first voltage line;

A gate electrode of the fifteenth transistor is electrically connected to the first input terminal, a first electrode of the fifteenth transistor is electrically connected to the second pull-down node, and a second electrode of the fifteenth transistor is electrically connected to the first voltage line.

The output circuit includes a sixteenth transistor, a seventeenth transistor, an eighteenth transistor and a first capacitor;

A gate electrode of the sixteenth transistor is electrically connected to the pull-up node, a first electrode of the sixteenth transistor is electrically connected to the clock signal line, and a second electrode of the sixteenth transistor is electrically connected to the driving signal output terminal;

A gate electrode of the seventeenth transistor is electrically connected to the first pull-down node, a first electrode of the seventeenth transistor is electrically connected to the driving signal output terminal, and a second electrode of the seventeenth transistor is electrically connected to the second voltage terminal;

A gate electrode of the eighteenth transistor is electrically connected to the second pull-down node, a first electrode of the eighteenth transistor is electrically connected to the driving signal output terminal, and a second electrode of the eighteenth transistor is electrically connected to the second voltage terminal;

A first electrode plate of the first capacitor is electrically connected to the pull-up node, and a second electrode plate of the first capacitor is electrically connected to the driving signal output terminal.

In at least one embodiment of the present disclosure, the pull-up node control circuit may also only include a ninth transistor and a tenth transistor; the ninth transistor controls to connect or disconnect the pull-up node and the second input terminal under the control of the first input signal provided by the first input terminal, and the tenth transistor controls to connect or disconnect the pull-up node and the first voltage line under the control of the reset signal provided by the reset terminal.

In at least one embodiment of the present disclosure, the first input terminal and the second input terminal may be the same input terminal; or, the first input terminal may be different from the second input terminal.

In at least one embodiment of the present disclosure, the driving circuit further includes a carry output circuit;

The carry output circuit is electrically connected to the carry signal output terminal, the pull-up node, the first pull-down node, and the second pull-down node, and is configured to control the carry signal output terminal to output a carry signal under the control of the potential of the pull-up node, the potential of the first pull-down node, and the potential of the second pull-down node;

The carry output circuit includes a nineteenth transistor, a twentieth transistor and a twenty-first transistor;

A gate electrode of the nineteenth transistor is electrically connected to the pull-up node, a first electrode of the nineteenth transistor is electrically connected to the clock signal line, and a second electrode of the nineteenth transistor is electrically connected to the carry signal output terminal;

A gate electrode of the twentieth transistor is electrically connected to the first pull-down node, a first electrode of the twentieth transistor is electrically connected to the carry signal output terminal, and a second electrode of the twentieth transistor is electrically connected to the first voltage terminal;

A gate electrode of the twenty-first transistor is electrically connected to the second pull-down node, a first electrode of the twenty-first transistor is electrically connected to the carry signal output terminal, and a second electrode of the twenty-first transistor is electrically connected to the first voltage terminal.

Optionally, the first pull-down node control circuit and the second pull-down node control circuit are arranged in a first area;

The eleventh transistor is arranged on a side of the first area away from the display area;

The ninth transistor, the tenth transistor, the twelfth transistor, and the thirteenth transistor are arranged on a side of the first area close to the display area.

In at least one embodiment of the present disclosure, the first pull-down node control circuit and the second pull-down node control circuit are arranged in the first area;

The fourteenth transistor and the fifteenth transistor are arranged on a side of the first area close to the display area.

Optionally, the first electrode of the seventeenth transistor is connected to the first electrode of the eighteenth transistor, and the second electrode of the seventeenth transistor is connected to the second electrode of the eighteenth transistor;

The first pull-down node control circuit and the second pull-down node control circuit are arranged in the first area; the sixteenth transistor, the seventeenth transistor, the eighteenth transistor and the first capacitor are arranged in a side of the first area close to the display area.

Optionally, the first electrode of the twentieth transistor is connected to the first electrode of the twenty-first transistor, and the second electrode of the twentieth transistor is connected to the second electrode of the twenty-first transistor;

The nineteenth transistor, the twentieth transistor and the twenty-first transistor are arranged on a side of the first area close to the display area.

Figure 15:
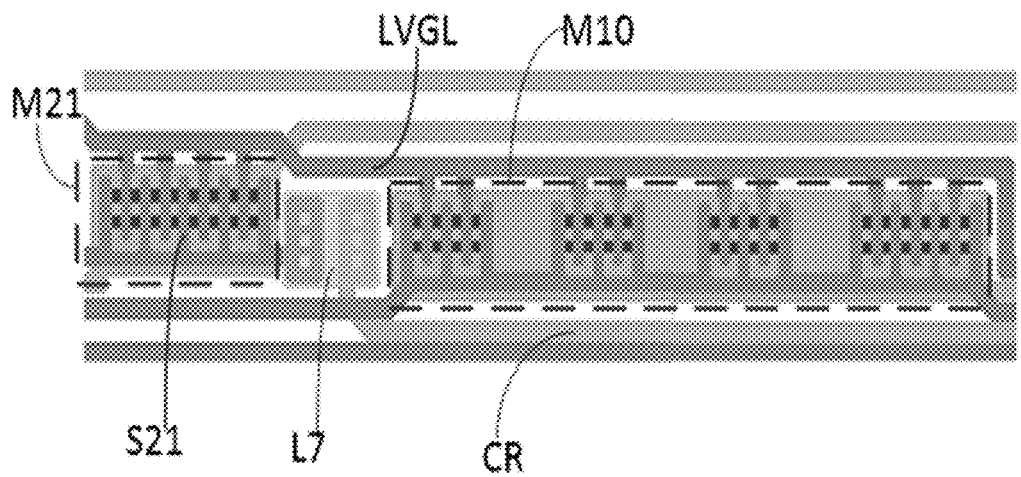
FIG. 15 is a layout diagram of the third part of the 17T1C driving circuit shown in FIG. 1.

FIG. 15 is a layout diagram of the third part of the 17T1C driving circuit shown in FIG. 1, and FIG. 15 is a layout diagram of the second part of the 21T1C driving circuit shown in FIG. 2.

Figure 16:
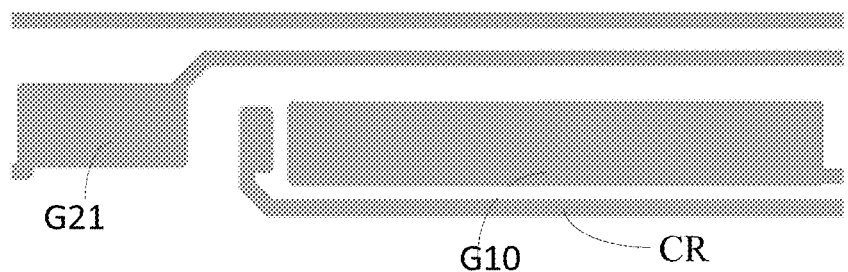
FIG. 16 is a layout diagram of the gate metal layer in FIG. 15.
Figure 17:
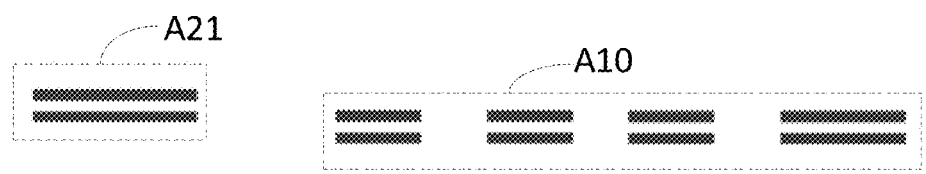
FIG. 17 is a layout diagram of the semiconductor layer in FIG. 15.
Figure 18A:
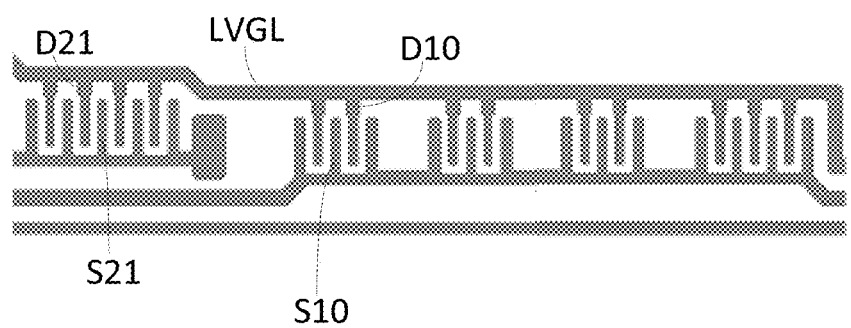
FIGS. 18A and 18B are layout diagrams of the source-drain metal layer in FIG. 15.
Figure 18B:
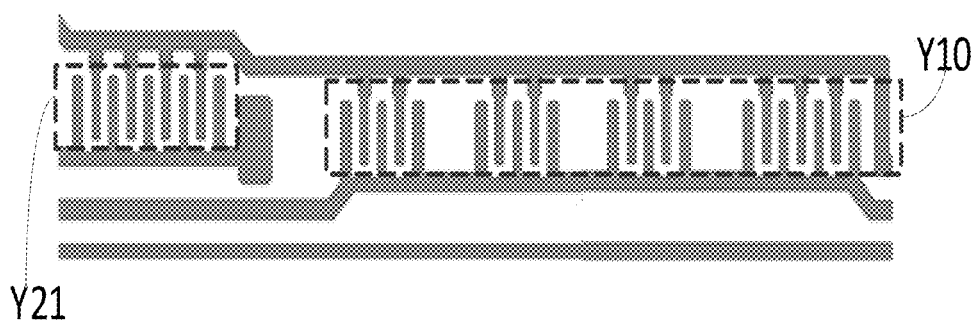
Figure 19:
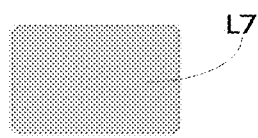
FIG. 19 is a layout diagram of the conductive layer in FIG. 15.

FIG. 16 is a layout diagram of the gate metal layer in FIG. 15, FIG. 17 is a layout diagram of the semiconductor layer in FIG. 15, FIG. 18A and FIG. 18B are layout diagrams of the source-drain metal layer in FIG. 15, FIG. 19 is a layout diagram of the conductive layer in FIG. 15.

Figure 20:
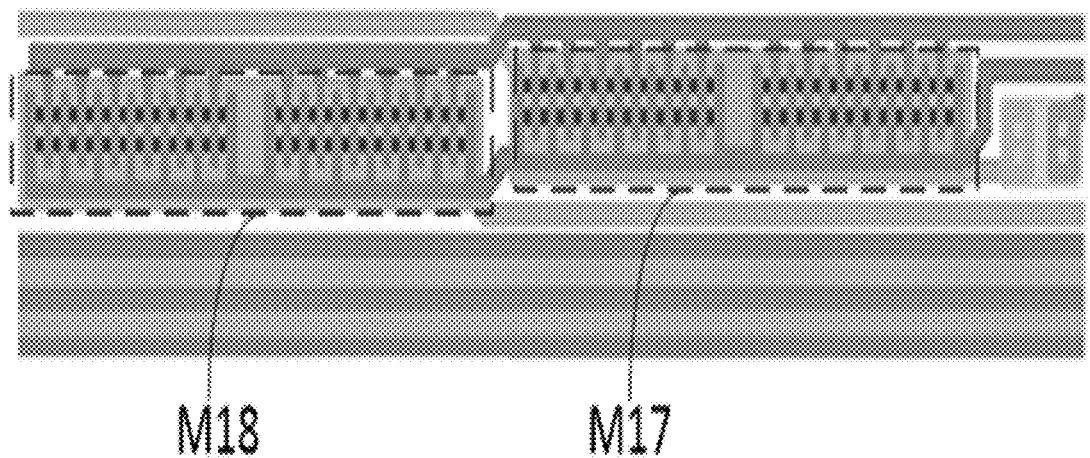
FIG. 20 is a layout diagram of the fourth part of the 17T1C driving circuit shown in FIG. 1.

FIG. 20 is a layout diagram of the fourth part of the 17T1C driving circuit shown in FIG. 1, and FIG. 20 is a layout diagram of the fourth part of the 21T1C driving circuit shown in FIG. 2.

Figure 21:
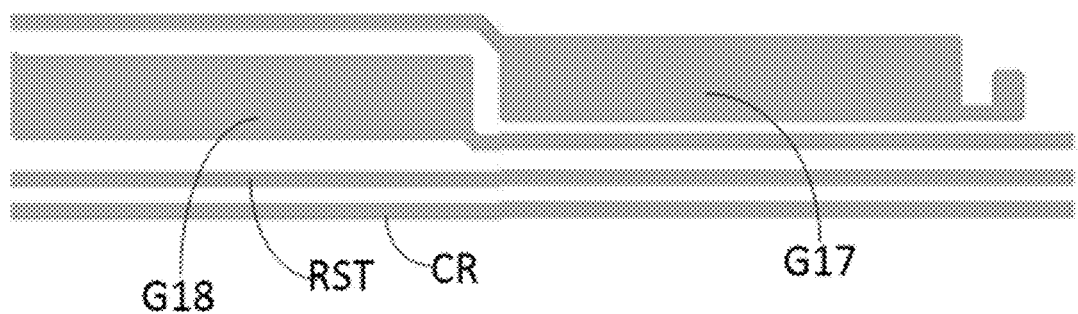
FIG. 21 is a layout diagram of the gate metal layer in FIG. 20.
Figure 22:
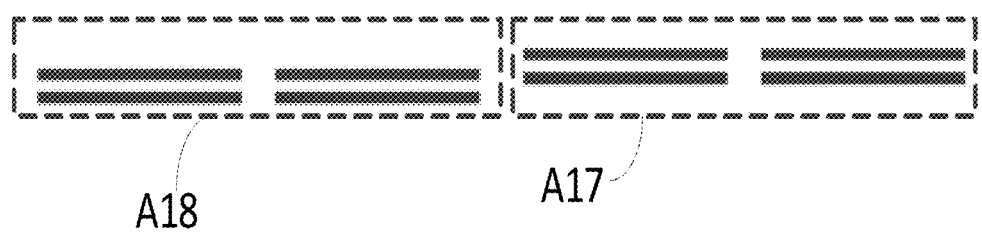
FIG. 22 is a layout diagram of the semiconductor layer in FIG. 20.
Figure 23A:
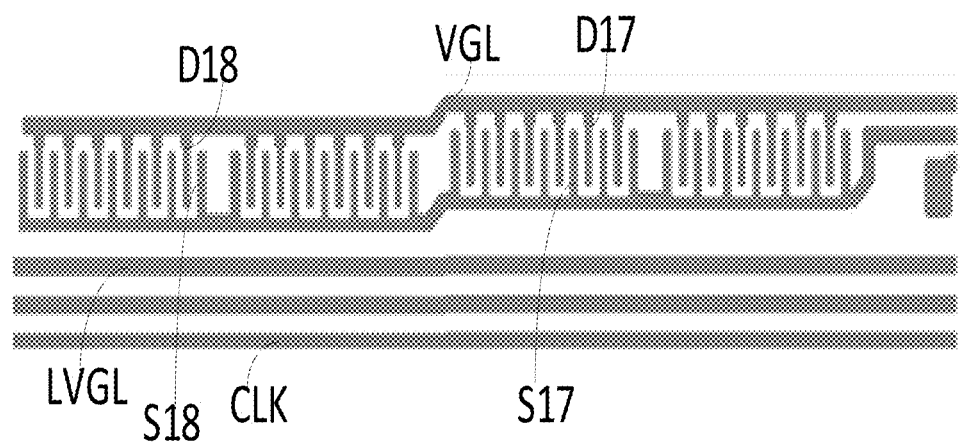
FIGS. 23A and 23B are layout diagrams of the source-drain metal layer in FIG. 20.
Figure 23B:
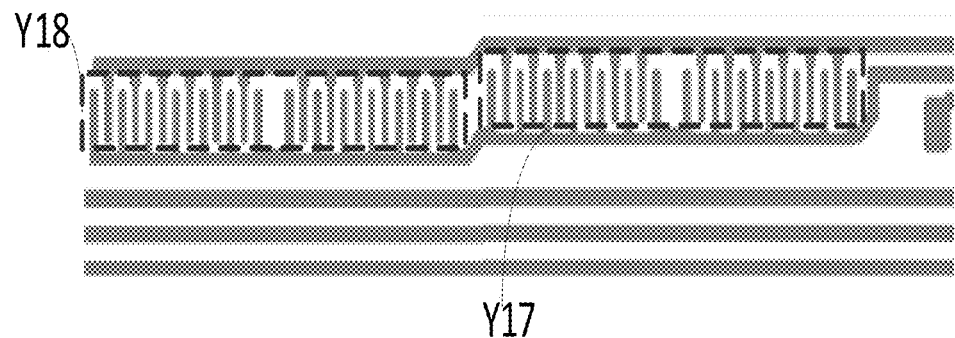
Figure 24:
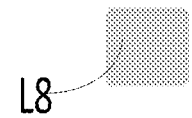
FIG. 24 is a layout diagram of the conductive layer in FIG. 20.

FIG. 21 is a layout diagram of the gate metal layer in FIG. 20, FIG. 22 is a layout diagram of the semiconductor layer in FIG. 20, FIG. 23A and FIG. 23B are the layout diagrams of the source-drain metal layer in FIG. 20, FIG. 24 is a layout diagram of the conductive layer in FIG. 20.

Figure 25:
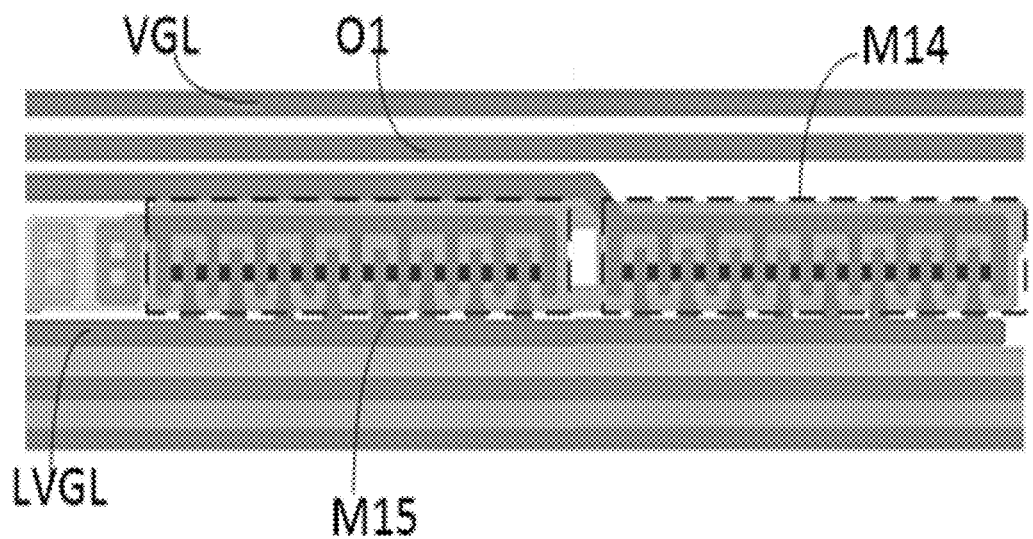
FIG. 25 is a layout diagram of the fifth part of the 17T1C driving circuit shown in FIG. 1.

FIG. 25 is a layout diagram of the fifth part of the 17T1C driving circuit shown in FIG. 1, and FIG. 25 is a layout diagram of the fifth part of the 21T1C driving circuit shown in FIG. 2.

Figure 26:
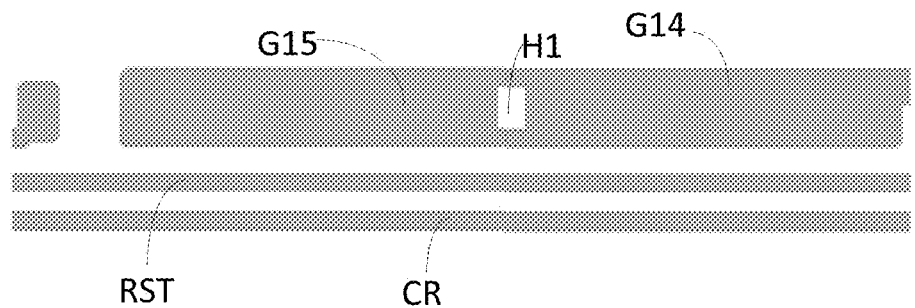
FIG. 26 is a layout diagram of the gate metal layer in FIG. 25.
Figure 27:
FIG. 27 is a layout diagram of the semiconductor layer in FIG. 25.
Figure 28A:
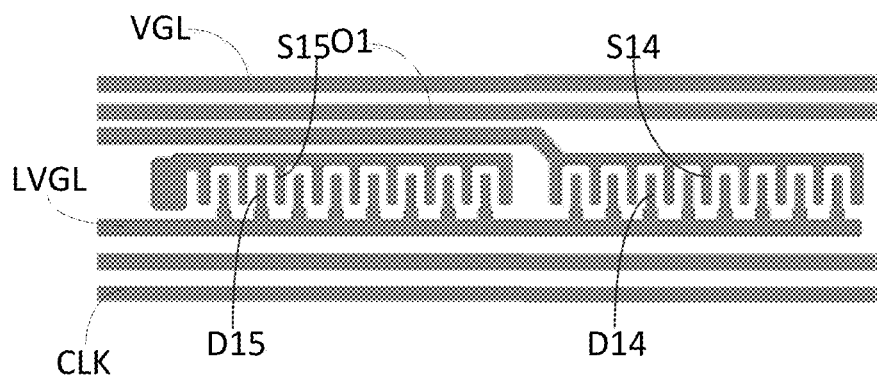
FIGS. 28A and 28B are layout diagrams of the source-drain metal layer in FIG. 25.
Figure 28B:
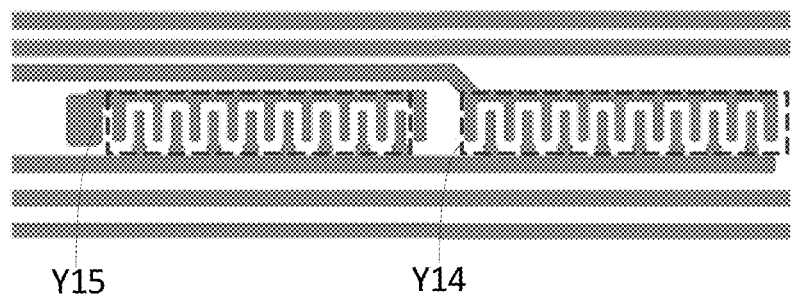
Figure 29:
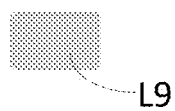
FIG. 29 is a layout diagram of the conductive layer in FIG. 25.

FIG. 26 is a layout diagram of the gate metal layer in FIG. 25, FIG. 27 is a layout diagram of the semiconductor layer in FIG. 25, FIG. 28A and FIG. 28B are the layout diagrams of the source-drain metal layer in FIG. 25, FIG. 29 is the layout diagram of the conductive layer in FIG. 25.

Figure 30:
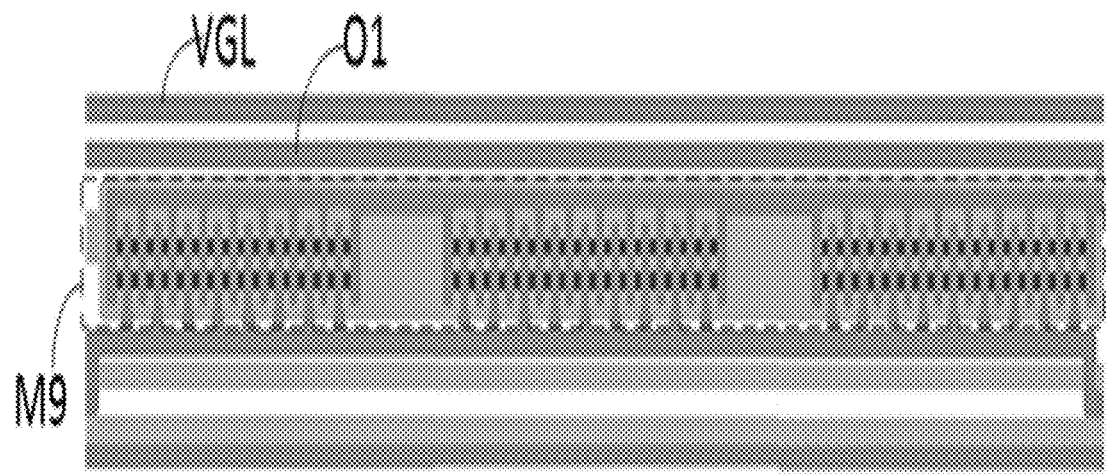
FIG. 30 is a layout diagram of the sixth part of the 17T1C driving circuit shown in FIG. 1.

FIG. 30 is a layout diagram of the sixth part of the 17T1C driving circuit shown in FIG. 1, and FIG. 30 is a layout diagram of the sixth part of the 21T1C driving circuit shown in FIG. 2.

Figure 31:
FIG. 31 is a layout diagram of the gate metal layer in FIG. 30.
Figure 32:
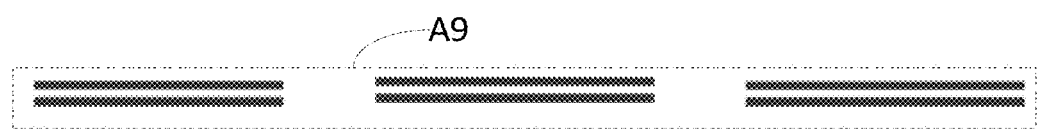
FIG. 32 is a layout diagram of the semiconductor layer in FIG. 30.

FIG. 31 is a layout diagram of the gate metal layer in FIG. 30, FIG. 32 is a layout diagram of the semiconductor layer in FIG. 30, and FIGS. 33A, 33B and 33C are layout diagrams of the source-drain metal layer in FIG. 30.

Figure 34:
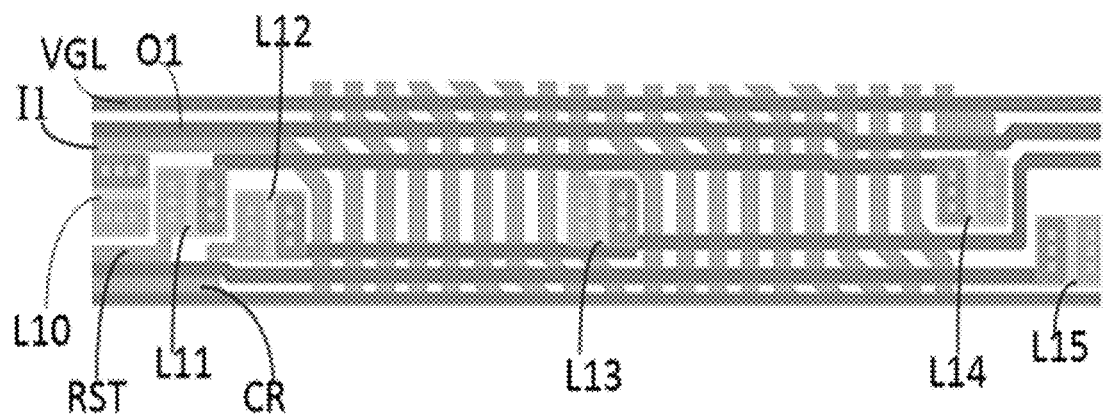
FIG. 34 is a layout diagram of the seventh part of the 17T1C driving circuit shown in FIG. 1.

FIG. 34 is a layout diagram of the seventh part of the 17T1C driving circuit shown in FIG. 1, and FIG. 34 is a layout diagram of the seventh part of the 21T1C driving circuit shown in FIG. 2.

Figure 35:
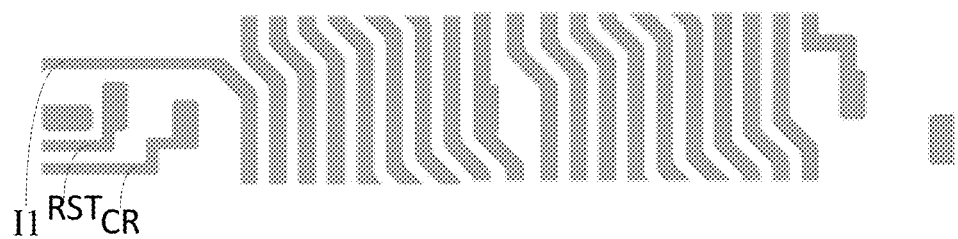
FIG. 35 is a layout diagram of the gate metal layer in FIG. 34.
Figure 36:
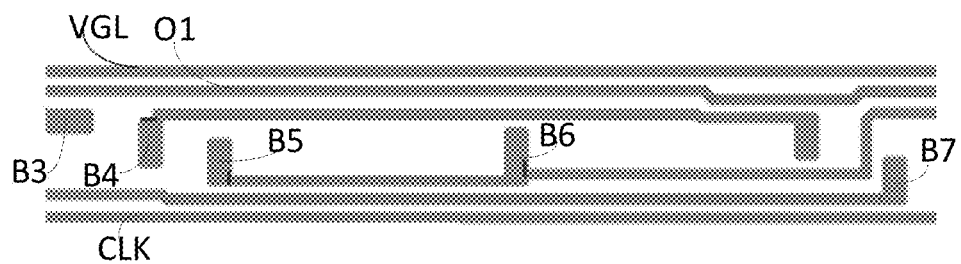
FIG. 36 is a layout diagram of the source-drain metal layer in FIG. 34.
Figure 37:
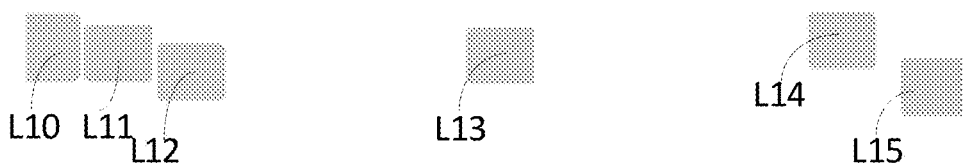
FIG. 37 is a layout diagram of the conductive layer in FIG. 34.

FIG. 35 is a layout diagram of the gate metal layer in FIG. 34, FIG. 36 is a layout diagram of the source-drain metal layer in FIG. 34, and FIG. 37 is a layout diagram of the conductive layer in FIG. 34.

Figure 38:
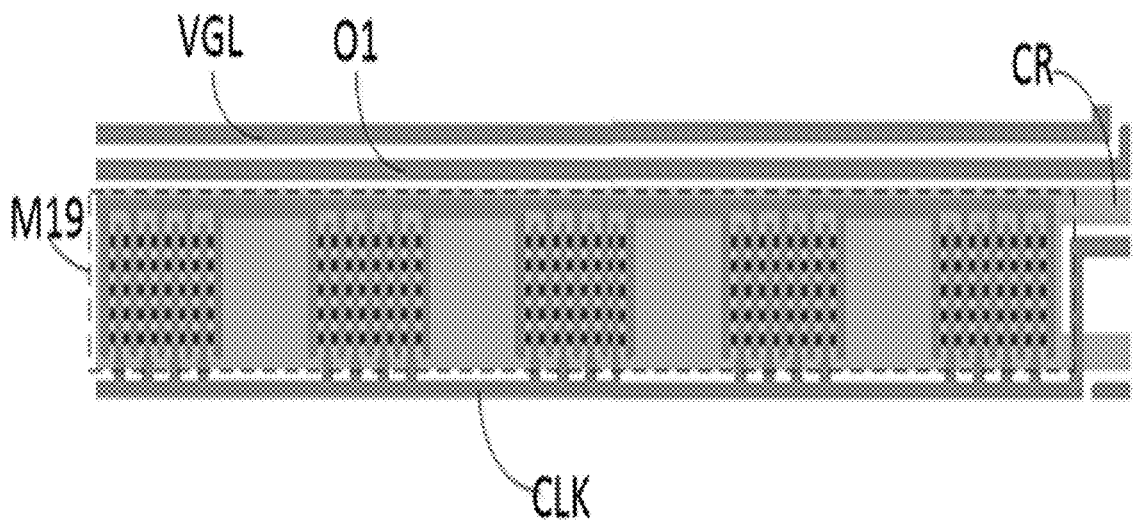
FIG. 38 is a layout diagram of the eighth part of the 17T1C driving circuit shown in FIG. 1.

FIG. 38 is a layout diagram of the eighth part of the 17T1C driving circuit shown in FIG. 1, and FIG. 38 is a layout diagram of the eighth part of the 21T1C driving circuit shown in FIG. 2.

Figure 39:
FIG. 39 is a layout diagram of the gate metal layer in FIG. 38.
Figure 40:
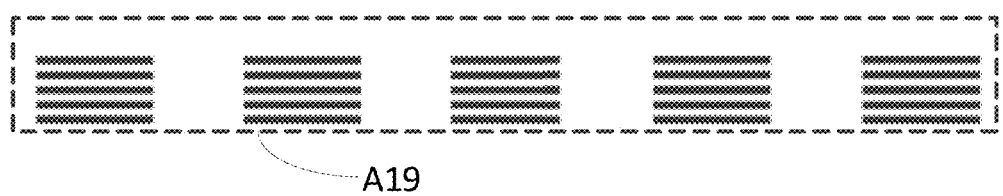
FIG. 40 is a layout diagram of the semiconductor layer in FIG. 38.
Figure 41A:
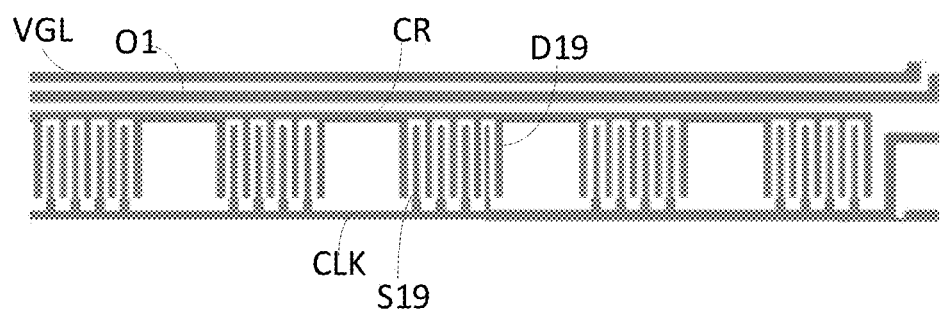
FIGS. 41A and 41B are layout diagrams of the source-drain metal layer in FIG. 38.
Figure 41B:
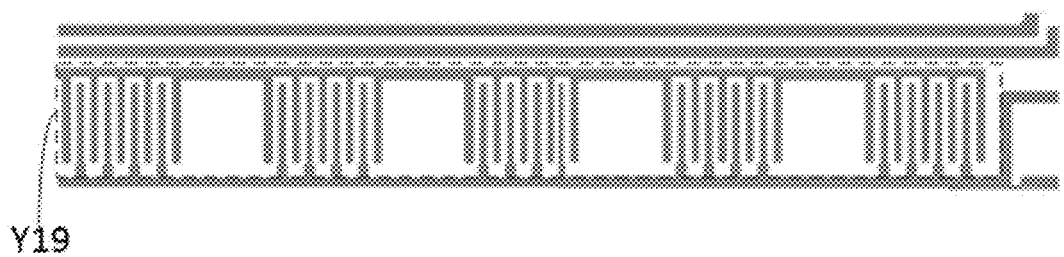

FIG. 39 is a layout diagram of the gate metal layer in FIG. 38, FIG. 40 is a layout diagram of the semiconductor layer in FIG. 38, and FIGS. 41A and 41B are layout diagrams of the source-drain metal layer in FIG. 38.

Figure 42A:
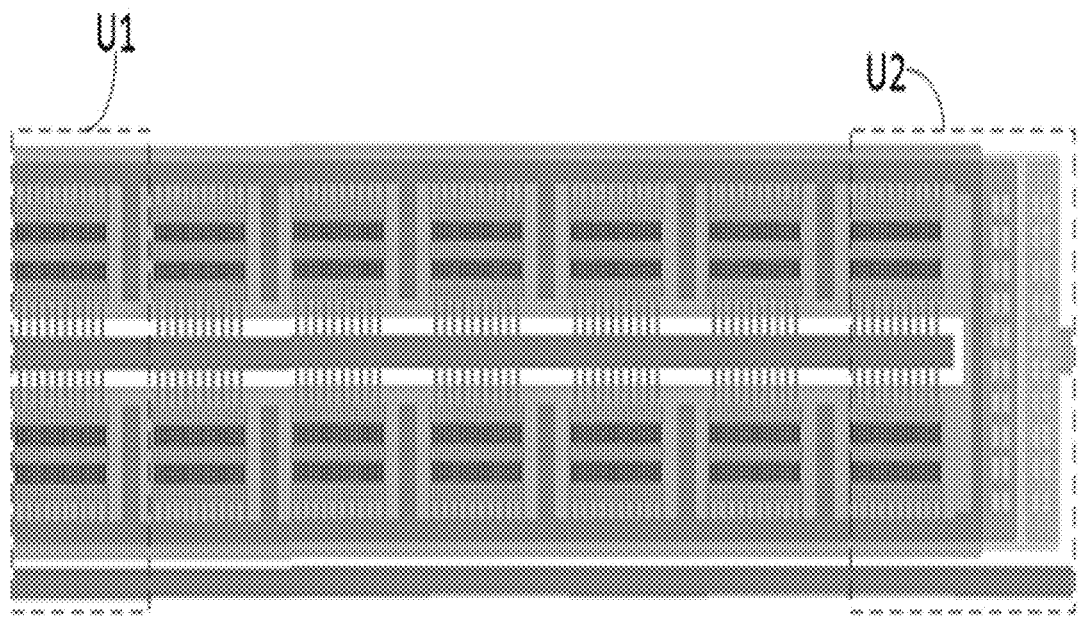
FIGS. 42A and 42B are layout diagrams of the ninth part of the 17T1C driving circuit shown in FIG. 1, and FIG. 42A and FIG. 42B are layout diagrams of the ninth part of the 21T1C driving circuit shown in FIG. 2.
Figure 42B:
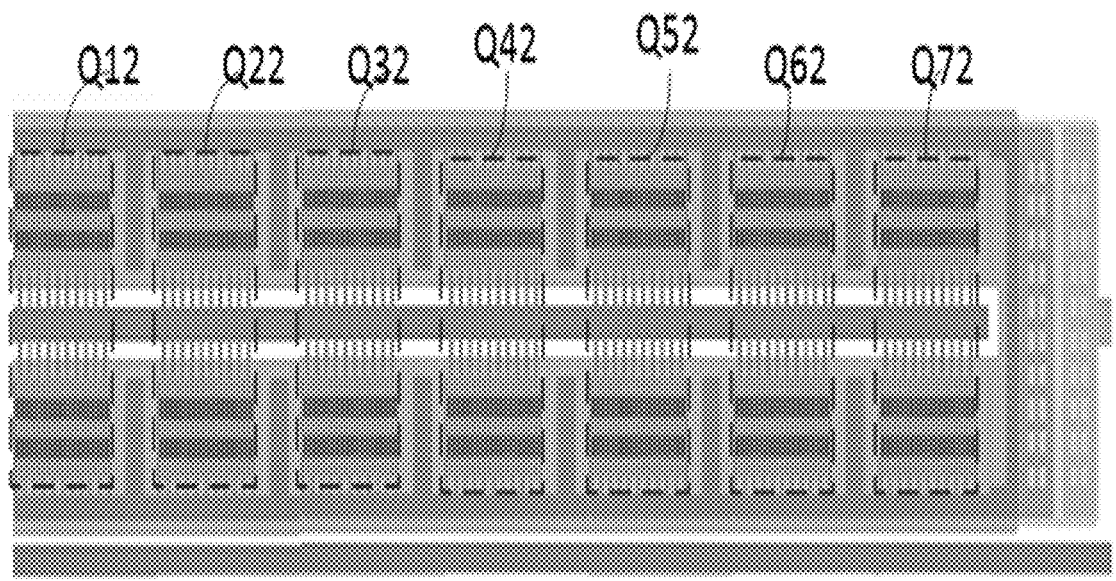

FIGS. 42A and 42B are layout diagrams of the ninth part of the 17T1C driving circuit shown in FIG. 1, and FIG. 42A and FIG. 42B are layout diagrams of the ninth part of the 21T1C driving circuit shown in FIG. 2.

Figure 43:
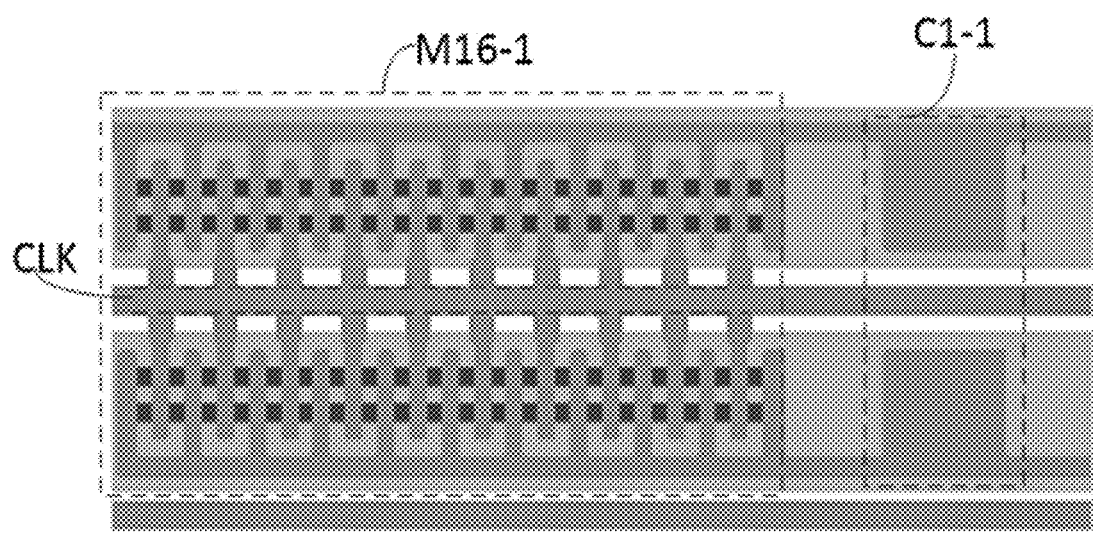
FIG. 43 is a layout diagram of the first circuit unit U1 in FIG. 42A.
Figure 44:
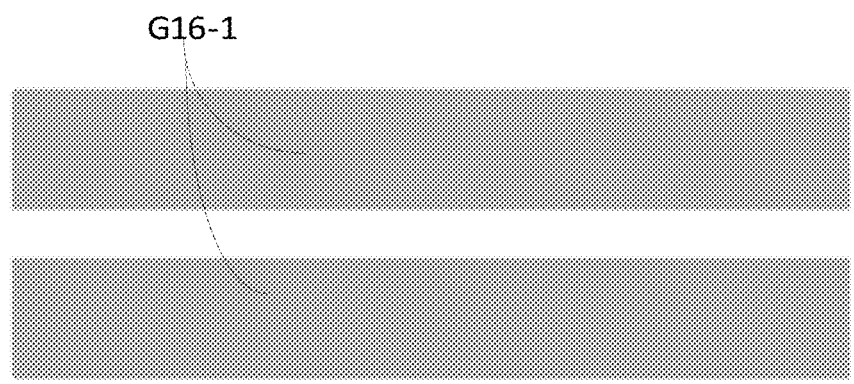
FIG. 44 is a layout diagram of the gate metal layer in FIG. 43.
Figure 45:
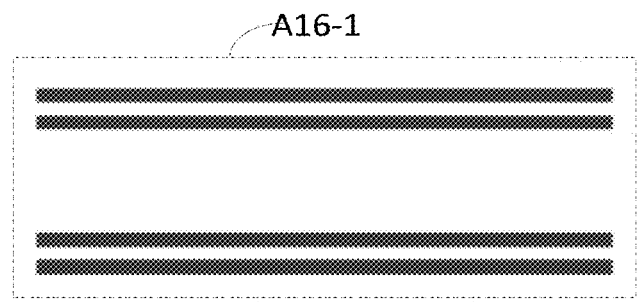
FIG. 45 is a layout diagram of the semiconductor layer in FIG. 43.
Figure 46:
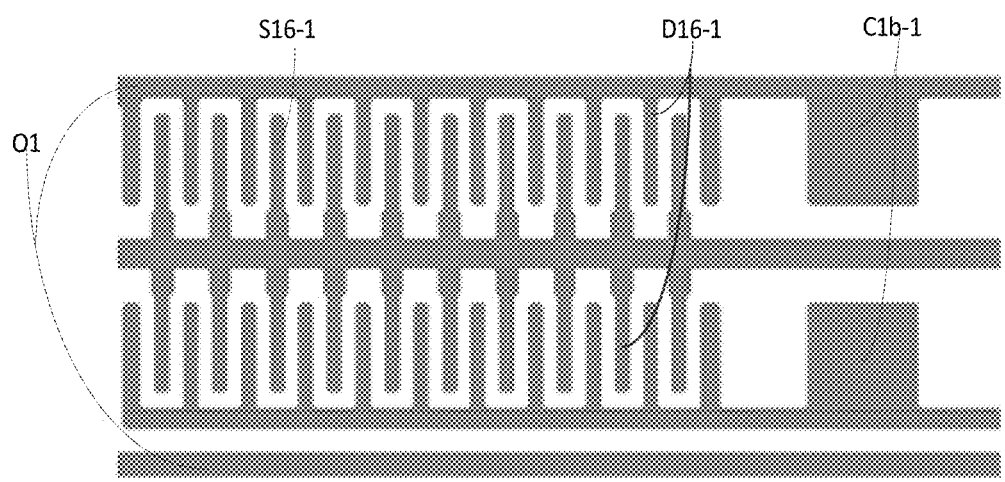
FIG. 46 is a layout diagram of the source-drain metal layer in FIG. 43.

FIG. 43 is a layout diagram of the first circuit unit U1 in FIG. 42A;

FIG. 44 is a layout diagram of the gate metal layer in FIG. 43, FIG. 45 is a layout diagram of the semiconductor layer in FIG. 43, and FIG. 46 is a layout diagram of the source-drain metal layer in FIG. 43.

Figure 47:
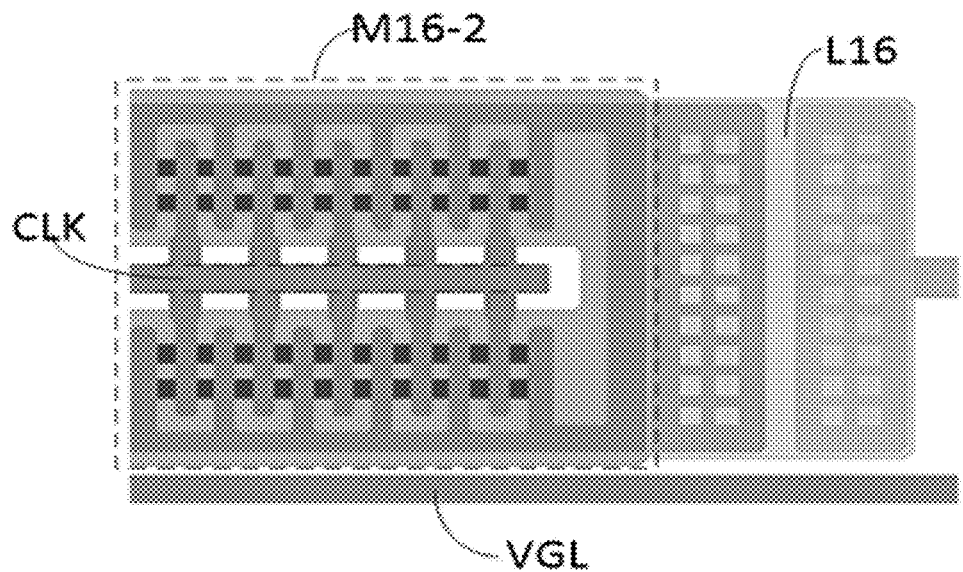
FIG. 47 is a layout diagram of the second circuit unit U2 in FIG. 42A.
Figure 48:
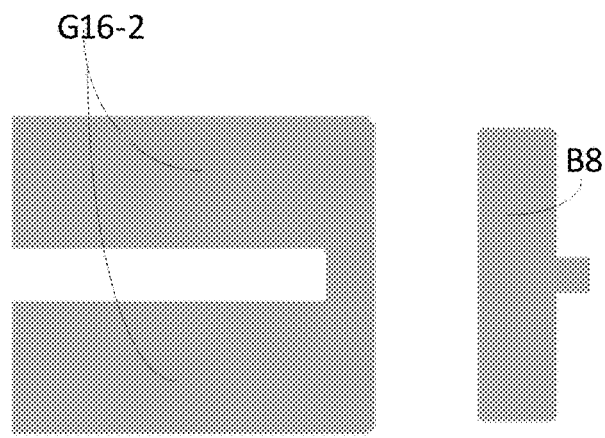
FIG. 48 is a layout diagram of the gate metal layer in FIG. 47.
Figure 49:
FIG. 49 is a layout diagram of the semiconductor layer in FIG. 47.
Figure 50:
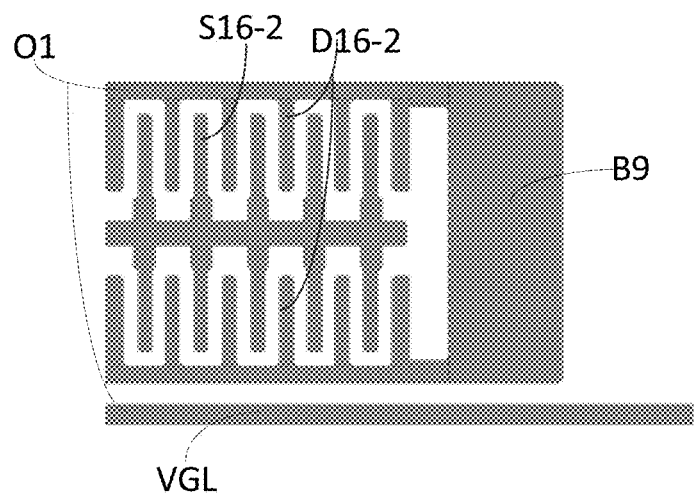
FIG. 50 is a layout diagram of the source-drain metal layer in FIG. 47.
Figure 51:
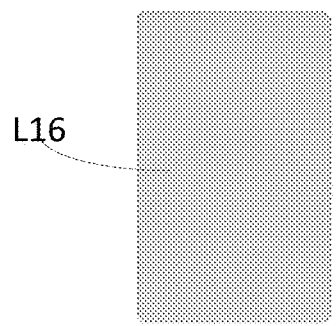
FIG. 51 is a layout diagram of the conductive layer in FIG. 47.

FIG. 47 is a layout diagram of the second circuit unit U2 in FIG. 42A;

FIG. 48 is a layout diagram of the gate metal layer in FIG. 47, FIG. 49 is a layout diagram of the semiconductor layer in FIG. 47, FIG. 50 is a layout diagram of the source-drain metal layer in FIG. 47, FIG. 51 is a layout diagram of the conductive layer layout in FIG. 47.

Figure 52:
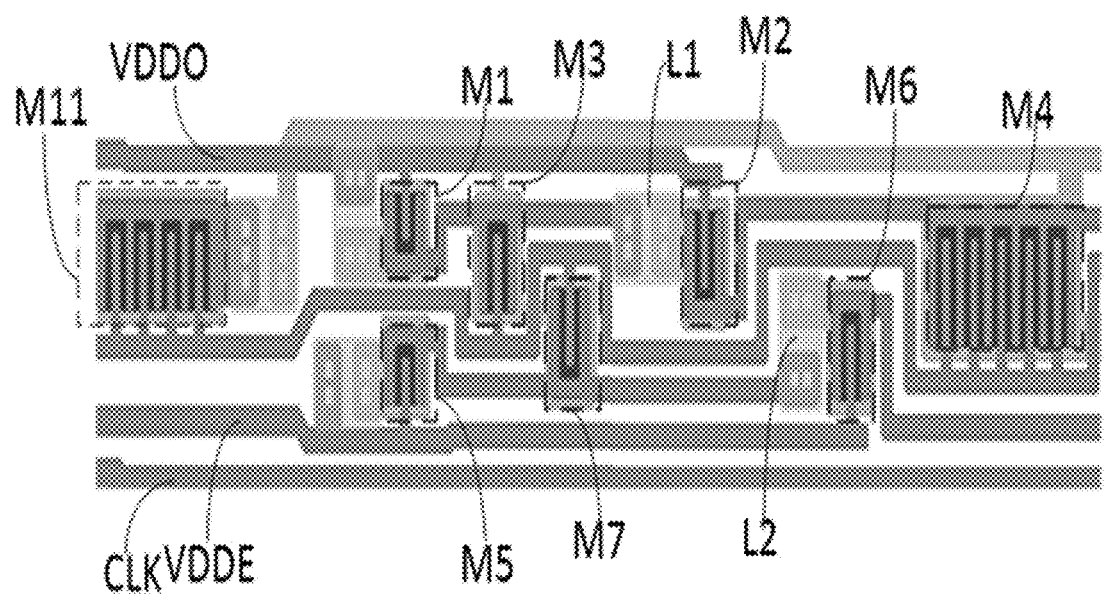
FIG. 52 is a layout diagram of the first part of the 21T1C driving circuit shown in FIG. 2 when the transistors in the 21T1C driving circuit shown in FIG. 2 are amorphous silicon (a-Si) transistors.
Figure 53:
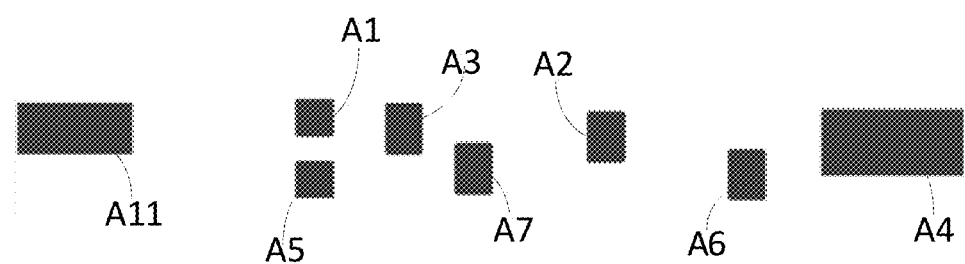
FIG. 53 is a layout diagram of the semiconductor layer in FIG. 52.

FIG. 52 is a layout diagram of the first part of the 21T1C driving circuit shown in FIG. 2 when the transistors in the 21T1C driving circuit shown in FIG. 2 are amorphous silicon (a-Si) transistors, and FIG. 53 is a layout diagram of the semiconductor layer in FIG. 52;

The layout diagram of the gate metal layer in FIG. 52 is shown in FIG. 5, the layout diagram of the source-drain metal layer in FIG. 52 is shown in FIGS. 9A and 9B, and the conductive layer in FIG. 52 is shown in FIG. 8.

In FIG. 3A, the one labeled VDDO is the first control voltage line, the one labeled VDDE is the second control voltage line, the one labeled CLK is the clock signal line, the one labeled LVGL is the first voltage line, and the one labeled G1 is the first gate pattern, the one labeled G3 is the third gate pattern, the one labeled G5 is the fifth gate pattern, the one labeled G7 is the seventh gate pattern, and the one labeled G2 is the gate electrode of the second transistor, the one labeled G4 is the gate electrode of the fourth transistor, the one labeled G6 is the gate electrode of the sixth transistor, the one labeled G11 is the gate electrode of the eleventh transistor, and the one labeled L1 is the first connection structure, the one labeled L2 is the second connection structure, the one labeled B1 is the first connection portion, the one labeled B2 is the second connection portion, the one labeled A1 is the first active pattern, and the one labeled A3 is the third active pattern, the one labeled A5 is the fifth active pattern, and the one labeled A7 is the seventh active pattern.

In FIG. 3B, the one labeled M11 is the eleventh transistor, the one labeled M2 is the second transistor, the one labeled M4 is the fourth transistor, the one labeled M6 is the sixth transistor, the one labeled G1 is the first gate pattern, the one labeled G3 is the third gate pattern, the one labeled G5 is the fifth gate pattern, and the one labeled G7 is the seventh gate pattern.

In FIG. 4A, the one labeled VDDO is the first control voltage line, the one labeled VDDE is the second control voltage line, the one labeled CLK is the clock signal line, the one labeled LVGL is the first voltage line, and the one labeled G11 is the gate electrode of the eleventh transistor, the one labeled G1 is the first gate pattern, the one labeled G3 is the third gate pattern, the one labeled G5 is the fifth gate pattern, and the one labeled G7 is the seventh gate pattern, the one labeled G2 is the gate electrode of the second transistor, the one labeled G4 is the gate electrode of the fourth transistor, the one labeled G6 is the gate electrode of the sixth transistor, the one labeled L1 is the first connection structure, the one labeled L2 is the second connection structure, the one labeled B1 is the first connection portion, the one labeled B2 is the second connection portion; the one labeled S1 is the first electrode of the first transistor, and the one labeled D1 is the second electrode of the first transistor, the one labeled S3 is the first electrode of the third transistor, the one labeled D3 is the second electrode of the third transistor, the one labeled S5 is the first electrode of the fifth transistor, and the one labeled D5 is the second electrode of the fifth transistor, the one labeled S7 is the first electrode of the seventh transistor, and the one labeled D7 is the second electrode of the seventh transistor.

In FIG. 4B, the one labeled M11 is the eleventh transistor, the one labeled M1 is the first transistor, the one labeled M3 is the third transistor, the one labeled M5 is the fifth transistor, and the one labeled M7 is the seventh transistor, the one labeled M2 is the second transistor, the one labeled M4 is the fourth transistor, and the one labeled M6 is the sixth transistor.

In FIG. 5, the one labeled G11 is the gate electrode of the eleventh transistor, the one labeled G1 is the first gate pattern, the one labeled G3 is the third gate pattern, and the one labeled G5 is the fifth gate pattern, the one labeled G7 is the seventh gate pattern, the one labeled G2 is the gate electrode of the second transistor, the one labeled G4 is the gate electrode of the fourth transistor, and the one labeled G6 is the gate electrode of the sixth transistor, and the one labeled PU is the pull-up node.

In FIG. 6, the one labeled A11 is the eleventh active pattern, the one labeled A1 is the first active pattern, the one labeled A3 is the third active pattern, and the one labeled A5 is the fifth active pattern, the one labeled A7 is the seventh active pattern, the one labeled A2 is the second active pattern, the one labeled A4 is the fourth active pattern, and the one labeled A6 is the sixth active pattern.

In at least one embodiment of the present disclosure, the eleventh active pattern may be the active pattern of the eleventh transistor, the second active pattern may be the active pattern of the second transistor, and the fourth active pattern may be the active pattern of the fourth transistor, the sixth active pattern may be the active pattern of the sixth transistor.

In FIG. 7A, the one labeled VDDO is the first control voltage line, the one labeled VDDE is the second control voltage line, the one labeled CLK is the clock signal line, the one labeled LVGL is the first voltage line, and the one labeled PD1 is the first pull-down node, the one labeled PD2 is the second pull-down node, the one labeled S2 is the first electrode of the second transistor, the one labeled D2 is the second electrode of the second transistor, and the one labeled S4 is the first electrode of the fourth transistor, the one labeled D4 is the second electrode of the fourth transistor, the one labeled S6 is the first electrode of the sixth transistor, the one labeled D6 is the second electrode of the sixth transistor, and the one labeled S11 is the first electrode of the eleventh transistor, the one labeled D11 is the second electrode of the eleventh transistor.

In FIG. 7B, the one labeled Y11 is the eleventh source-drain pattern, the one labeled Y2 is the second source-drain pattern, the one labeled Y4 is the fourth source-drain pattern, and the one labeled Y6 is the sixth source-drain pattern.

In at least one embodiment of the present disclosure, the eleventh source-drain pattern includes the first electrode of the eleventh transistor and the second electrode of the eleventh transistor; the second source-drain pattern includes the first electrode of the second transistor and the second electrode of the second transistor; the fourth source-drain pattern includes the first electrode of the fourth transistor and the second electrode of the fourth transistor; the sixth source-drain pattern includes the first electrode of the sixth transistor and the second electrode of the sixth transistor.

In FIG. 8, the one labeled L1 is the first connection structure, the one labeled L2 is the second connection structure, the one labeled B1 is the first connection portion, and the one labeled B2 is the second connection portion.

In FIG. 9A, the one labeled VDDO is the first control voltage line, the one labeled VDDE is the second control voltage line, the one labeled CLK is the clock signal line, the one labeled LVGL is the first voltage line, and the one labeled PD1 is the first pull-down node, the one labeled PD2 is the second pull-down node, the one labeled S2 is the first electrode of the second transistor, the one labeled D2 is the second electrode of the second transistor, and the one labeled S4 is the first electrode of the fourth transistor, the one labeled D4 is the second electrode of the fourth transistor, the one labeled S6 is the first electrode of the sixth transistor, the one labeled D6 is the second electrode of the sixth transistor, and the one labeled S1 is the first electrode of the first transistor, the one labeled D1 is the second electrode of the first transistor, the one labeled S3 is the first electrode of the third transistor, and the one labeled D3 is the second electrode of the third transistor, the one labeled S5 is the first electrode of the fifth transistor, the one labeled D5 is the second electrode of the fifth transistor, the one labeled S11 is the first electrode of the eleventh transistor, and the one labeled D11 is the second electrode of the eleventh transistor.

In FIG. 9B, the one labeled Y11 is the eleventh source-drain pattern, the one labeled Y2 is the second source-drain pattern, the one labeled Y4 is the fourth source-drain pattern, and the one labeled Y6 is the sixth source-drain pattern, the one labeled Y1 is the first source-drain pattern, the one labeled Y3 is the third source-drain pattern, the one labeled Y5 is the fifth source-drain pattern, and the one labeled Y7 is the seventh source-drain pattern.

In at least one embodiment of the present disclosure, the first source-drain pattern includes the first electrode of the first transistor and the second electrode of the first transistor; the third source-drain pattern includes the first electrode of the third transistor and the second electrode of the third transistor; the fifth source-drain pattern includes the first electrode of the fifth transistor and the second electrode of the fifth transistor; the seventh source-drain pattern includes the first electrode of the seventh transistor and the second electrode of the seventh transistor.

In FIG. 10, the one labeled LVGL is the first voltage line, the one labeled CLK is the clock signal line, the one labeled M8 is the eighth transistor, the one labeled M12 is the twelfth transistor, the one labeled M13 is the thirteenth transistor, and the one labeled M20 is the twentieth transistor.

In FIG. 11, the one labeled G8 is the gate electrode of the eighth transistor, the one labeled G12 is the gate electrode of the twelfth transistor, the one labeled G13 is the gate electrode of the thirteenth transistor, and the one labeled G20 is the gate electrode of the twentieth transistor.

In FIG. 12, the one labeled A8 is the eighth active pattern, the one labeled A12 is the twelfth active pattern, the one labeled A13 is the thirteenth active pattern, and the one labeled A20 is the twentieth active pattern.

In at least one embodiment of the present disclosure, the eighth active pattern A8 is the active pattern of the eighth transistor, the twelfth active pattern A12 is the active pattern of the twelfth transistor, and the thirteenth active pattern A13 is the active pattern of the thirteenth transistor, the twentieth active pattern A20 is the active pattern of the twentieth transistor.

In FIG. 13A, the one labeled LVGL is the first voltage line, the one labeled CLK is the clock signal line, the one labeled S8 is the first electrode of the eighth transistor, and the one labeled D8 is the second electrode of the eighth transistor, the one labeled S12 is the first electrode of the twelfth transistor, the one labeled D12 is the second electrode of the twelfth transistor, the one labeled S13 is the first electrode of the thirteenth transistor, and the one labeled D13 is the second electrode of the thirteenth transistor, the one labeled S20 is the first electrode of the twentieth transistor, and the one labeled D20 is the second electrode of the twentieth transistor.

In FIG. 13B, the one labeled Y8 is the eighth source-drain pattern, the one labeled Y12 is the twelfth source-drain pattern, the one labeled Y13 is the thirteenth source-drain pattern, and the one labeled Y20 is the twentieth source-drain pattern.

In at least one embodiment of the present disclosure, the eighth source-drain pattern includes the first electrode of the eighth transistor and the second electrode of the eighth transistor; the twelfth source-drain pattern includes the first electrode of the twelfth transistor and the second electrode of the twelfth transistor; the thirteenth source-drain pattern includes the first electrode of the thirteenth transistor and the second electrode of the thirteenth transistor; the twentieth source-drain pattern includes the first electrode of the twentieth transistor and the second electrode of the twentieth transistor.

In FIG. 14, the one labeled L3 is the third connection structure, the one labeled L4 is the fourth connection structure, the one labeled L5 is the fifth connection structure, and the one labeled L6 is the sixth connection structure.

In FIG. 15, the one labeled LVGL is the first voltage line, the one labeled CR is the carry signal output terminal, the one labeled L7 is the seventh connection structure, and the one labeled S21 is the first electrode of the twenty-first transistor, the one labeled M21 is the twenty-first transistor, and the one labeled M10 is the tenth transistor.

In FIG. 16, the one labeled G21 is the gate electrode of the twenty-first transistor, the one labeled G10 is the gate electrode of the tenth transistor, and the one labeled CR is the carry signal output terminal.

In FIG. 17, the one labeled A21 is the twenty-first active pattern, and the one labeled A10 is the eleventh active pattern.

In at least one embodiment of the present disclosure, the twenty-first active pattern A21 may be an active pattern of a twenty-first transistor, and the tenth active pattern A10 may be an active pattern of a tenth transistor.

In FIG. 18A, the one labeled S21 is the first electrode of the twenty-first transistor, the one labeled D21 is the second electrode of the twenty-first transistor, the one labeled LVGL is the first voltage line, and the one labeled S10 is the first electrode of the tenth transistor, the one labeled D10 is the second electrode of the tenth transistor.

In FIG. 18B, the one labeled Y21 is the twenty-first source-drain pattern, and the one labeled Y10 is the tenth source-drain pattern.

In at least one embodiment of the present disclosure, the twenty-first source-drain pattern includes the first electrode of the twenty-first transistor and the second electrode of the twenty-first transistor, and the tenth source-drain pattern includes the first electrode of the tenth transistor and the second electrode of the tenth transistor.

In FIG. 19, the one labeled L7 is the seventh connection structure.

In FIG. 20, the one labeled M18 is the eighteenth transistor, and the one labeled M17 is the seventeenth transistor.

In FIG. 21, the one labeled RST is the reset terminal, the one labeled CR is the carry signal output terminal, the one labeled G18 is the gate electrode of the eighteenth transistor, and the one labeled G17 is the gate electrode of the seventeenth transistor.

In FIG. 22, the one labeled A18 is the eighteenth active pattern, and the one labeled A17 is the seventeenth active pattern.

In at least one embodiment of the present disclosure, the eighteenth active pattern may be an active pattern of an eighteenth transistor, and the seventeenth active pattern may be an active pattern of a seventeenth transistor.

In FIG. 23A, the one labeled LVGL is the first voltage line, the one labeled CLK is the clock signal line, the one labeled VGL is the second voltage line, labeled S18 is the first electrode of the eighteenth transistor, the one labeled D18 is the second electrode of the eighteenth transistor, the one labeled S17 is the first electrode of the seventeenth transistor, and the one labeled D17 is the second electrode of the seventeenth transistor.

In FIG. 23B, the one labeled Y18 is the eighteenth source-drain pattern, and the one labeled Y17 is the seventeenth source-drain pattern.

In at least one embodiment of the present disclosure, the eighteenth source-drain pattern may include the first electrode of the eighteenth transistor and the second electrode of the eighteenth transistor, and the seventeenth source-drain pattern may include the first electrode of the seventeenth transistor and the second electrode of the seventeenth transistor.

In FIG. 24, the one labeled L8 is the eighth connection structure.

In FIG. 25, the one labeled LVGL is the first voltage line, the one labeled VGL is the second voltage line, the one labeled O1 is the driving signal output terminal, the one labeled M15 is the fifteenth transistor, and the one labeled M14 is the fourteenth transistor.

In FIG. 26, the one labeled RST is the reset terminal, the one labeled CR is the carry signal output terminal, the one labeled G15 is the gate electrode of the fifteenth transistor, and the one labeled G14 is the gate electrode of the fourteenth transistor.

As shown in FIG. 26, a first via hole H1 is provided between G14 and G15 to facilitate heat dissipation.

In FIG. 27, the one labeled A15 is the fifteenth active pattern, and the one labeled A14 is the fourteenth active pattern.

In at least one embodiment of the present disclosure, the fifteenth active pattern may be an active pattern of a fifteenth transistor, and the fourteenth active pattern may be an active pattern of a fourteenth transistor.

In FIG. 28A, the one labeled LVGL is the first voltage line, the one labeled VGL is the second voltage line, the one labeled CLK is the clock signal line, the one labeled O1 is the driving signal output terminal, and the one labeled S15 is the first electrode of the fifteenth transistor, the one labeled D15 is the second electrode of the fifteenth transistor, the one labeled S14 is the first electrode of the fourteenth transistor, and the one labeled D14 is the second electrode of the fourteenth transistor.

In FIG. 28B, the one labeled Y15 is the fifteenth source-drain pattern, and the one labeled Y14 is the fourteenth source-drain pattern.

In at least one embodiment of the present disclosure, the fifteenth source-drain pattern may include the first electrode of the fifteenth transistor and the second electrode of the fifteenth transistor, and the fourteenth source-drain pattern may include the first electrode of the fourteenth transistor and the second electrode of the fourteenth transistor.

In FIG. 29, the one labeled L9 is the ninth connection structure.

In FIG. 30, the one labeled M9 is the ninth transistor, the one labeled VGL is the second voltage line, and the one labeled O1 is the driving signal output terminal.

In FIG. 31, the one labeled G9 is the gate electrode of the ninth transistor, the one labeled RST is the reset terminal, and the one labeled CR is the carry signal output terminal.

In FIG. 32, the one labeled A9 is the ninth active pattern.

In at least one embodiment of the present disclosure, the ninth active pattern may be an active pattern of a ninth transistor.

Figure 33A:
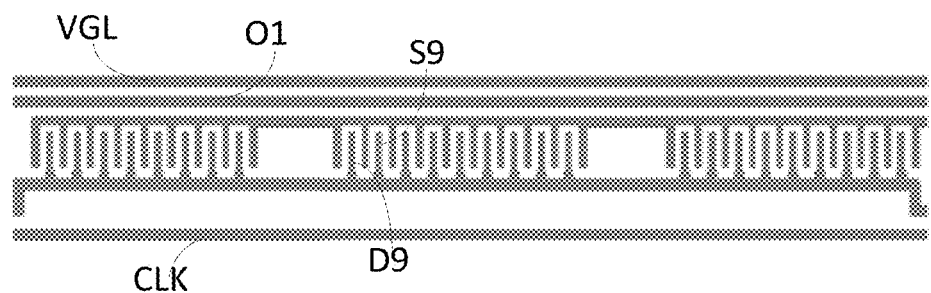
FIGS. 33A, 33B and 33C are layout diagrams of the source-drain metal layer in FIG. 30.

In FIG. 33A, the one labeled VGL is the second voltage line, the one labeled CLK is the clock signal line, the one labeled O1 is the driving signal output terminal, the one labeled S9 is the first electrode of the ninth transistor, and the one labeled D9 is the second electrode of the ninth transistor.

Figure 33B:
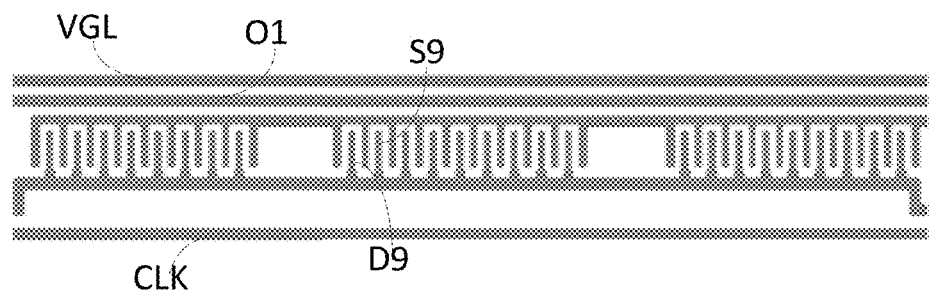

In FIG. 33B, the one labeled VGL is the second voltage line, the one labeled CLK is the clock signal line, the one labeled O1 is the driving signal output terminal, and the one labeled Y9 is the ninth source-drain pattern.

In at least one embodiment of the present disclosure, the ninth source-drain pattern includes a first electrode of the ninth transistor and a second electrode of the ninth transistor.

In FIG. 34, the one labeled I1 is the first input terminal, the one labeled RST is the reset terminal, the one labeled O1 is the driving signal output terminal, the one labeled CR is the carry signal output terminal, and the one labeled L10 is the tenth connection structure, the one labeled L11 is the eleventh connection structure, the one labeled L12 is the twelfth connection structure, the one labeled L13 is the thirteenth connection structure, and the one labeled L14 is the fourteenth connection structure, the one labeled L15 is the fifteenth connection structure.

In FIG. 35, the one labeled I1 is the first input terminal, the one labeled RST is the reset terminal, and the one labeled CR is the carry signal output terminal.

In FIG. 36, the one labeled VGL is the second voltage line, the one labeled CLK is the clock signal line, the one labeled O1 is the driving signal output terminal, the one labeled B3 is the third connection portion, and the one labeled B4 is the fourth connection portion, the one labeled with B5 is the fifth connection portion, the one labeled with B6 is the sixth connection portion, and the one labeled with B7 is the seventh connection portion.

In FIG. 37, the one labeled L10 is the tenth connection structure, the one labeled L11 is the eleventh connection structure, the one labeled L12 is the twelfth connection structure, the one labeled L13 is the thirteenth connection structure, and the one labeled L14 is the fourteenth connection structure, and the one labeled L15 is the fifteenth connection structure.

In FIG. 38, the one labeled VGL is the second voltage line, the one labeled O1 is the driving signal output terminal, the one labeled CR is the carry signal output terminal, the one labeled CLK is the clock signal line, and the one labeled M19 is the nineteenth transistor.

In FIG. 39, the one labeled G19 is the gate electrode of the nineteenth transistor.

In FIG. 40, the one labeled A19 is the nineteenth active pattern.

In at least one embodiment of the present disclosure, the nineteenth active pattern may be an active pattern of a nineteenth transistor.

In FIG. 41A, the one labeled VGL is the first voltage line, the one labeled O1 is the driving signal output terminal, the one labeled CR is the carry signal output terminal, the one labeled CLK is the clock signal line, and the one labeled S19 is the first electrode of the nineteenth transistor, the one labeled D19 is the second electrode of the nineteenth transistor.

In FIG. 41B, the one labeled Y19 is the nineteenth source-drain pattern.

In at least one embodiment of the present disclosure, the nineteenth source-drain pattern includes a first electrode of the nineteenth transistor and a second electrode of the nineteenth transistor.

In FIG. 42A, the one labeled U1 is the first circuit unit, and the one labeled U2 is the second circuit unit. There may be five repeating units between the first circuit unit U1 and the second circuit unit U2. The structure of the repeating unit is the same as that of the first circuit unit U1.

In FIG. 43, the one labeled CLK is the clock signal line, the one labeled M16-1 is the first part of the sixteenth transistor, and the one labeled C1-1 is the first part of the first capacitor.

In FIG. 44, the one labeled G16-1 is the first part of the gate electrode of the sixteenth transistor, the first part of the gate electrode of the sixteenth transistor G16-1 is multiplexed as the first part of the first electrode plate of the first capacitor.

In FIG. 45, the one labeled A16-1 is the first part of the active pattern of the sixteenth transistor.

In FIG. 46, the one labeled O1 is the driving signal output terminal, the one labeled S16-1 is the first part of the first electrode of the sixteenth transistor, and the one labeled D16-1 is the first part of the second electrode of the sixteenth transistor, the one labeled C1b-1 is the first part of the second electrode plate of the first capacitor. Referring to FIG. 43, in order to improve the driving capability of the sixteenth transistor M16 included in the output circuit, multiple groups of repeating units whose structure is the same as M16-1 are set, and M16-1 is connected to the multiple groups of repeating units together, the first part C1-1 of the first capacitor is set between M16-1 and an adjacent repeating unit, and a part of the first capacitor may be provided between two adjacent repeating units; that is, multiple sets of repeating M16-1 and C1-1 are alternately arranged and arranged along one direction, for example, along the extending direction of the gate lines included in the display panel. Such setting can not only ensure the driving capability of the output transistor (the output transistor can be the sixteenth transistor included in the output circuit), but also reduce the position occupied by the transistor arrangement in the column direction for high-resolution products, such as 8K or 16K products.

In FIG. 47, the one labeled CLK is the clock signal line, the one labeled M16-2 is the second part of the sixteenth transistor, the one labeled VGL is the second voltage line, and the one labeled L16 is the sixteenth connection structure.

In at least one embodiment of the present disclosure, as shown in FIG. 51, the sixteenth connection structure L16 may be formed on the conductive layer to realize the electrical connection between the driving signal output terminal of the driving circuit and the second electrode of the sixteenth transistor included in the output circuit, the driving signal output terminal may be formed on the gate metal layer, and the second electrode of the sixteenth transistor may be formed on the source-drain metal layer.

In FIG. 48, the one labeled G16-2 is the second part of the gate electrode of the sixteenth transistor, and the one labeled B8 is the eighth connection portion.

In FIG. 49, the one labeled A16-2 is the second part of the active pattern of the sixteenth transistor.

In FIG. 50, the one labeled O1 is the driving signal output terminal, the one labeled S16-2 is the second part of the first electrode of the sixteenth transistor, and the one labeled D16-2 is the second part of the second electrode of the sixteenth transistor, the one labeled VGL is the second voltage line, and the one labeled B9 is the ninth connection portion.

In FIG. 51, the one labeled L16 is the sixteenth connection structure.

In FIG. 52, the one labeled VDDO is the first control voltage line, the one labeled VDDE is the second control voltage line, the one labeled CLK is the clock signal line, the one labeled L1 is the first connection structure, and the one labeled L2 is the second connection structure, the one labeled M11 is the eleventh transistor, the one labeled M1 is the first transistor, the one labeled M2 is the second transistor, the one labeled M3 is the third transistor, and the one labeled M4 is the fourth transistor, the one labeled M5 is the fifth transistor, the one labeled M6 is the sixth transistor, and the one labeled M7 is the seventh transistor.

In FIG. 53, the one labeled A11 is the eleventh active pattern, the one labeled A1 is the first active pattern, the one labeled A2 is the second active pattern, and the one labeled A3 is the third active pattern, the one labeled A4 is the fourth active pattern, the one labeled A5 is the fifth active pattern, the one labeled A6 is the sixth active pattern, and the one labeled A7 is the seventh active pattern.

FIG. 3A and FIG. 3B are the layout diagrams of the first part of the 17T1C driving circuit shown in FIG. 1, FIG. 10 is the layout diagram of the second part of the 17T1C driving circuit shown in FIG. 1, and FIG. 15 is the layout diagram of the third part of the 17T1C driving circuit shown in FIG. 1, FIG. 20 is the layout diagram of the fourth part of the 17T1C driving circuit shown in FIG. 1, FIG. 25 is the layout diagram of the fifth part of the 17T1C driving circuit shown in FIG. 1, and FIG. 30 is the layout diagram of the sixth part of the 17T1C driving circuit shown in FIG. 1, FIG. 34 is the layout diagram of the seventh part of the 17T1C driving circuit shown in FIG. 1, and FIG. 38 is the layout diagram of the eighth part of the 17T1C driving circuit shown in FIG. 1, FIG. 42A is a layout diagram of the ninth part of the 17T1C driving circuit shown in FIG. 1.

In FIG. 3A, FIG. 3B, FIG. 10, FIG. 15, FIG. 20, FIG. 25, FIG. 30, FIG. 34, FIG. 38 and FIG. 42A, the transistors included in the 17T1C driving circuit are all oxide transistors.

In at least one embodiment of the present disclosure, the first part of the 17T1C driving circuit shown in FIG. 3A, the second part of the 17T1C driving circuit shown in FIG. 10, the third part of the 17T1C driving circuit shown in FIG. 15, the fourth part of the 17T1C driving circuit shown in FIG. 20, the fifth part of the 17T1C driving circuit shown in FIG. 25, the sixth part of the 17T1C driving circuit shown in FIG. 30, and the seventh part of the 17T1C driving circuit shown in FIG. 34, the eighth part of the 17T1C driving circuit shown in FIG. 38 and the ninth part of the 17T1C driving circuit shown in FIG. 42A are arranged in sequence along the direction close to the display area.

FIG. 4A and FIG. 4B are the layout diagrams of the first part of the 21T1C driving circuit shown in FIG. 2, FIG. 10 is the layout diagram of the second part of the 21T1C driving circuit shown in FIG. 2, and FIG. 15 is the layout diagram of the third part of the 21T1C driving circuit shown in FIG. 2, FIG. 20 is the layout diagram of the fourth part of the 21T1C driving circuit shown in FIG. 2, FIG. 25 is the layout diagram of the fifth part of the 21T1C driving circuit shown in FIG. 2, FIG. 30 is the layout diagram of the sixth part of the 21T1C driving circuit shown in FIG. 2, FIG. 34 is the layout diagram of the seventh part of the 21T1C driving circuit shown in FIG. 2, and FIG. 38 is the eighth part of the 21T1C driving circuit shown in FIG. 2, FIG. 42A is a layout diagram of the ninth part of the 21T1C driving circuit shown in FIG. 2.

In FIG. 4A, FIG. 4B, FIG. 10, FIG. 15, FIG. 20, FIG. 25, FIG. 30, FIG. 34, FIG. 38 and FIG. 42A, the transistors included in the 21T1C driving circuit are all oxide transistors.

In at least one embodiment of the present disclosure, the first part of the 21T1C driving circuit shown in FIG. 4A, the second part of the 21T1C driving circuit shown in FIG. 10, the third part of the 21T1C driving circuit shown in FIG. 15, the fourth part of the 21T1C driving circuit shown in FIG. 20, the fifth part of the 21T1C driving circuit shown in FIG. 25, the sixth part of the 21T1C driving circuit shown in FIG. 30, and the seventh part of the circuit, the eighth part of the 21T1C driving circuit shown in FIG. 38 and the ninth part of the 21T1C driving circuit shown in FIG. 42A are arranged in sequence along the direction close to the display area.

As shown in FIG. 3A, although the 17T1C driving circuit does not include the first transistor, the third transistor, the fifth transistor, and the seventh transistor, the layout diagram of the 17T1C driving circuit shown in FIG. 3A is provided with the first conductive portion, the second conductive portion, the third conductive portion and the fourth conductive portion, the first conductive portion is formed by the first gate pattern G1 and the first active pattern A1, and the second conductive portion is formed by the third gate pattern G3 and the third active pattern A3, the third conductive portion is formed by the fifth gate pattern G5 and the fifth active pattern A5, and the fourth conductive portion is formed by the seventh gate pattern G7 and the seventh active pattern A7, so that the conversion between the 17T1C driving circuit using the oxide transistor and the 21T1C driving circuit using the oxide transistor can be achieved by only changing the mask of the source-drain metal layer.

In at least one embodiment of the present disclosure, in the 15T1C driving circuit structure, the first conductive portion, the second conductive portion, the third conductive portion and the fourth conductive portion can be reserved, and the 15T1C driving circuit can be converted into a 19T1C driving circuit by only changing the mask of the source-drain metal layer.

Figure 54:
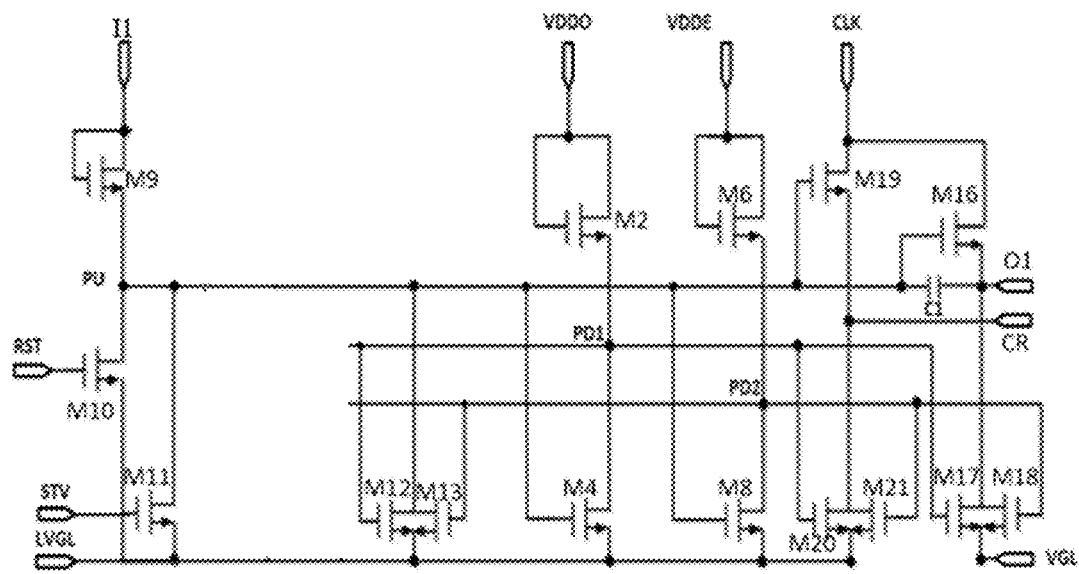
FIG. 54 is a circuit diagram of a 15T1C driving circuit according to at least one embodiment of the present disclosure.
Figure 55:
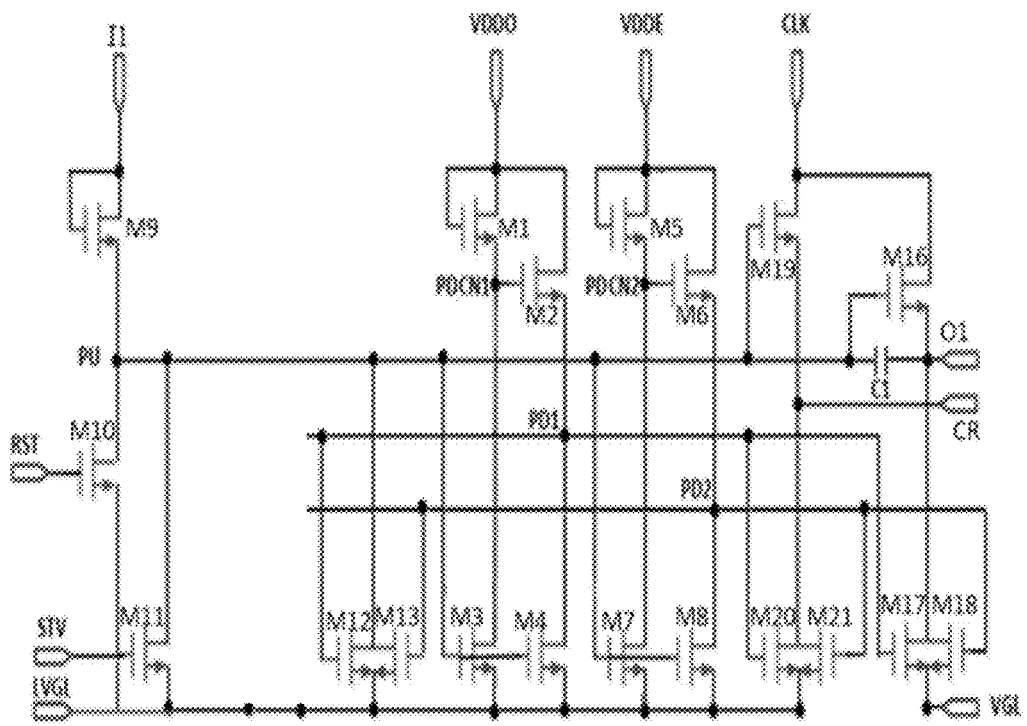
FIG. 55 is a circuit diagram of a 19T1C driving circuit according to at least one embodiment of the present disclosure.

FIG. 54 is a circuit diagram of a 15T1C driving circuit, and FIG. 55 is a circuit diagram of a 19T1C driving circuit.

The difference between at least one embodiment of the 15T1C driving circuit shown in FIG. 54 and at least one embodiment of the 17T1C driving circuit shown in FIG. 1 is that M14 and M15 are not provided.

The difference between at least one embodiment of the 15T1C driving circuit shown in FIG. 55 and at least one embodiment of the 17T1C driving circuit shown in FIG. 2 is that M14 and M15 are not provided.

Optionally, the output circuit includes a sixteenth transistor; a gate electrode of the sixteenth transistor is electrically connected to the pull-up node, a first electrode of the sixteenth transistor is electrically connected to the clock signal line, and a second electrode of the sixteenth transistor is electrically connected to the driving signal output terminal;

The first electrode of the ninth transistor includes N first electrode portions, and the second electrode of the ninth transistor includes N second electrode portions;

The first electrode of the sixteenth transistor includes M first electrode portions, and the second electrode of the sixteenth transistor includes M second electrode portions;

The nth first electrode portion of the ninth transistor and the nth second electrode portion of the ninth transistor are arranged in the nth first source-drain area;

The mth first electrode portion of the sixteenth transistor and the mth second electrode portion of the sixteenth transistor are arranged in the mth second source-drain area;

N and M are integers greater than 1, n is a positive integer less than or equal to N, and m is a positive integer less than or equal to M.

Optionally, the active pattern included in the transistor in the driving circuit includes at least one strip-shaped active pattern portion; or, The active pattern included in the transistor in the driving circuit are block-shaped active patterns.

In at least one embodiment of the present disclosure, the oxide transistor may be an Indium Gallium Zinc Oxide (IGZO) transistor.

Since the conduction current of the IGZO transistor is larger than that of the amorphous silicon (a-Si) transistor, the heat dissipation value is high, and the threshold voltage drift of the transistor increases with the increase of temperature. In order to prolong the high-temperature life of the driving circuit, it is necessary to reserve enough heat dissipation space when making a driving circuit using oxide transistors. The active pattern of the oxide transistor can be set as a single row or multi-row striped active pattern. At the same time, the oxide transistor with a larger size uses multiple branch structure.

As shown in FIG. 6, the eleventh active pattern A11 includes two strip-shaped active pattern portions, the third active pattern A3 includes two strip-shaped active pattern portions, and the seventh active pattern A7 includes two strip-shaped active pattern portions, the second active pattern A2 includes two strip-shaped active pattern portions, the sixth active pattern A6 includes two strip-shaped active pattern portions, and the fourth active pattern A4 includes two strip-shaped active pattern portions.

As shown in FIG. 12, the eighth active pattern A8 includes three strip-shaped active pattern portions, the twelfth active pattern A12 includes four strip-shaped active pattern portions, and the thirteenth active pattern A13 includes four strip-shaped active pattern portions. The twentieth active pattern A20 includes two strip-shaped active pattern portions.

As shown in FIG. 17, the twenty-first active pattern A21 includes two strip-shaped active pattern portions, and the tenth active pattern A10 includes eight strip-shaped active pattern portions.

As shown in FIG. 22, the eighteenth active pattern A18 includes four strip-shaped active pattern portions, and the seventeenth active pattern A17 includes four strip-shaped active pattern portions.

As shown in FIG. 32, the ninth active pattern A9 includes six strip-shaped active pattern portions.

As shown in FIG. 40, the nineteenth active pattern A19 includes twenty-five stripe-shaped active pattern portions.

As shown in FIG. 42A, the active pattern of the sixteenth transistor includes twenty-eight stripe-shaped active pattern portions.

As shown in FIG. 3A-FIG. 51, in the driving circuit using oxide transistors, the active pattern of each transistor may include at least one strip-shaped active pattern portion to facilitate heat dissipation.

In at least one embodiment of the present disclosure, when the size of the oxide transistor is larger, the active pattern of the oxide transistor includes more strip-shaped active pattern portions, but the invention is not limited thereto.

In at least one embodiment of the present disclosure, when the active pattern of the oxide transistor includes at least two strip-shaped active pattern portions, the shortest distance between adjacent strip-shaped active pattern portions is greater than or equal to 4.5 um, so as to facilitate good heat dissipation.

Figure 33C:
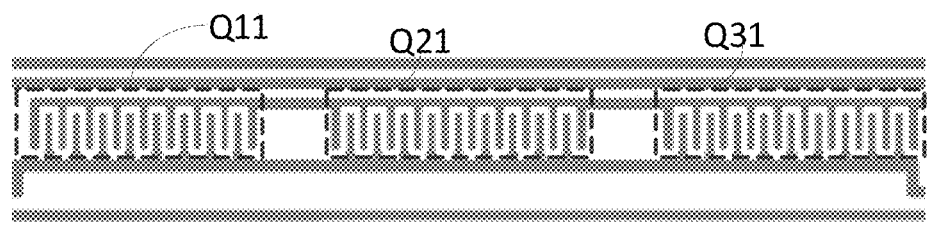

As shown in FIG. 33A, FIG. 33B and FIG. 33C, the first electrode of the ninth transistor includes three first electrode portions, and the second electrode of the ninth transistor includes three second electrode portions;

As shown in FIG. 33C, the first first electrode portion included in the first electrode of the ninth transistor and the first second electrode portion included in the second electrode of the ninth transistor are arranged in the first first source-drain area Q11;

The second first electrode portion included in the first electrode of the ninth transistor and the second second electrode portion included in the second electrode of the ninth transistor are arranged in the second first source-drain area Q21;

The third first electrode portion included in the first electrode of the ninth transistor and the third second electrode portion included in the second electrode of the ninth transistor are arranged in the third first source-drain area Q31.

In at least one embodiment of the present disclosure, by dividing the source-drain pattern of the ninth transistor into three portions and respectively arranging the same in three different first source-drain areas, it is easy to dissipate heat and lay out the transistors in the driving circuit in a high-resolution display product.

As shown in FIG. 42B, the first electrode of the ninth transistor includes three first electrode portions, and the second electrode of the ninth transistor includes three second electrode portions;

As shown in FIG. 42B, the first first electrode portion included in the first electrode of the sixteenth transistor and the first second electrode portion included in the second electrode of the sixteenth transistor are arranged in the first second source-drain area Q12;

The second first electrode portion included in the first electrode of the sixteenth transistor and the second second electrode portion included in the second electrode of the sixteenth transistor are arranged in the second second source-drain area Q22;

The third first electrode portion included in the first electrode of the sixteenth transistor and the third second electrode portion included in the second electrode of the sixteenth transistor are arranged in the third second source-drain area Q32;

The fourth first electrode portion included in the first electrode of the sixteenth transistor and the fourth second electrode portion included in the second electrode of the sixteenth transistor are arranged in the fourth second source-drain area Q42;

The fifth first electrode portion included in the first electrode of the sixteenth transistor and the fifth second electrode portion included in the second electrode of the sixteenth transistor are arranged in the fifth second source-drain area Q52;

The sixth first electrode portion included in the first electrode of the sixteenth transistor and the sixth second electrode portion included in the second electrode of the sixteenth transistor are arranged in the sixth second source-drain area Q62;

A seventh first electrode portion included in the first electrode of the sixteenth transistor and a seventh second electrode portion included in the second electrode of the sixteenth transistor are arranged in the seventh second source-drain area Q72.

In at least one embodiment of the present disclosure, by dividing the source-drain pattern of the sixteenth transistor into seven portions and respectively arranging the same in seven different second source-drain areas, it is easy to dissipate heat and lay out transistors in driving circuits in the high-resolution display product.

As shown in FIG. 18A and FIG. 18B, the source-drain pattern of the tenth transistor can be divided into four portions, which are respectively arranged in four different source-drain areas, so as to dissipate heat, and lay out transistors in the driving circuit in the high-resolution display products;

As shown in FIG. 23A and FIG. 23B, the source-drain pattern of the seventeenth transistor can be divided into two portions, which are respectively arranged in two different source-drain areas; the source-drain pattern of the eighteenth transistor can be divided into two portions, which are respectively arranged in two different source-drain areas, so as to dissipate heat, and facilitate the layout of transistors in the driving circuit in high-resolution display products.

As shown in FIG. 41A and FIG. 41B, the source-drain pattern of the nineteenth transistor can be divided into five portions, which are respectively arranged in different source-drain areas, so as to dissipate heat, and to facilitate the layout of the transistors in the driving circuit in the high-resolution display products.

Optionally, the driving circuit further includes a carry output circuit, and the carry output circuit includes a nineteenth transistor;

A gate electrode of the nineteenth transistor is electrically connected to the pull-up node, a first electrode of the nineteenth transistor is electrically connected to the clock signal line, and a second electrode of the nineteenth transistor is electrically connected to the carry signal output terminal;

The ninth transistor is an oxide transistor, and the width-to-length ratio of the ninth transistor is greater than or equal to 300/9 and less than or equal to 900/5; or, the ninth transistor is an amorphous silicon transistor, and the widthto-length ratio of the ninth transistor is greater than or equal to 1400/4.6 and less than or equal to 2200/3.9;

The tenth transistor is an oxide transistor, and the width-to-length ratio of the tenth transistor is greater than or equal to 150/9 and less than or equal to 200/5; or, the tenth transistor is an amorphous silicon transistor, and the width-to-length ratio of the tenth transistor is greater than or equal to 800/4.6 and less than or equal to 1400/3.9;

The sixteenth transistor is an oxide transistor, and the width-to-length ratio of the sixteenth transistor is greater than or equal to 1000/9 and less than or equal to 3000/5; or, the sixteenth transistor is an amorphous silicon transistor, and the width-to-length ratio of the sixteenth transistor is greater than or equal to 10000/4.6 and less than or equal to 22000/3.9;

The nineteenth transistor is an oxide transistor, and the width-to-length ratio of the nineteenth transistor is greater than or equal to 750/9 and less than or equal to 1000/5; or, the nineteenth transistor is an amorphous silicon transistor, and the width-to-length ratio of the nineteenth transistor is greater than or equal to 1500/4.6 and less than or equal to 2200/3.9.

In at least one embodiment of the present disclosure, when each transistor is an oxide transistor, the width of the channel of the ninth transistor can be greater than or equal to 300 um and less than or equal to 900 um, and the width of the channel of the tenth transistor can be greater than or equal to 150 um and less than or equal to 200 um, the width of the channel of the sixteenth transistor can be greater than or equal to 1000 um and less than or equal to 3000 um, the width of the channel of the second transistor and the width of the channel of the sixth transistor can be greater than or equal to 15 um and less than or equal to 30 um, the width of the channel of the fourth transistor and the width of the channel of the eighth transistor can be greater than or equal to 110 um and less than or equal to 250 um, the width of the channel of the eleventh transistor can be greater than or equal to 70 um and less than or equal to 90 um, the width of the channel of the third transistor and the width of the channel of the seventh transistor may be greater than or equal to 20 um and less than or equal to 60 um, the width of the channel of the first transistor and the width of the channel of the fifth transistor may be greater than or equal to 10 um and less than or equal to 30 um, and the width of the channel of the twelfth transistor and the width of the channel of the thirteenth transistor can be greater than or equal to 90 um and less than or equal to 120 um, the width of the channel of the seventeenth transistor and the width of the channel of the eighteenth transistor can be greater than or equal to 160 um and less than or equal to 240 um, the width of the channel of the tenth transistor and the width of the channel of the twenty-first transistor may be greater than or equal to 40 um and less than or equal to 80 um, the width of the channel of the nineteenth transistor may be greater than or equal to 750 um and less than or equal to 1000 um, and the width of the channel of the fourteenth transistor and the width of the channel of the fifteenth transistor can be greater than or equal to 80 um and less than or equal to 120 um, and the length of the channel of each of the above transistors can be greater than or equal to 5 um and less than or equal to 9 um.

In at least one embodiment of the present disclosure, when each transistor is an amorphous silicon transistor, the width of the channel of the ninth transistor may be greater than or equal to 1400 um and less than or equal to 2200 um, and the width of the channel of the tenth transistor may be greater than or equal to 800 um and less than or equal to 1000 um, the width of the channel of the sixteenth transistor can be greater than or equal to 10000 um and less than or equal to 22000 um, the width of the channel of the second transistor and the width of the channel of the sixth transistor can be greater than or equal to 100 um and less than or equal to 160 um, the width of the channel of the fourth transistor and the width of the channel of the eighth transistor can be greater than or equal to 500 um and less than or equal to 800 um, the width of the channel of the eleventh transistor can be greater than or equal to 400 um and less than or equal to 600 um, the width of the channel of the third transistor and the width of the channel of the seventh transistor can be greater than or equal to 60 um and less than or equal to 350 um, the width of the channel of the first transistor and the width of the channel of the fifth transistor can be greater than or equal to 30 um and less than or equal to 60 um, the width of the channel of the twelfth transistor and the width of the channel of the thirteenth transistor can be greater than or equal to 500 um and less than or equal to 700 um, the width of the channel of the seventeenth transistor and the width of the channel of the eighteenth transistor can be greater than or equal to 1000 um and less than or equal to 1500 um, the width of the channel of the twentieth transistor and the channel of the twenty-first transistor can be greater than or equal to 300 um and less than or equal to 600 um, the width of the channel of the nineteenth transistor can be greater than or equal to 1500 um and less than or equal to 2200 um, the width of the channel of the fourteenth transistor and the width of the channel of the fifteenth transistor can be greater than or equal to 300 um and less than or equal to 800 um, and the length of the channels of the above transistors can be greater than or equal to 3.9 um and less than or equal to 4.6 m.

FIG. 52 is a layout diagram of the first part of the 21T1C driving circuit shown in FIG. 2 when the transistors in the 21T1C driving circuit shown in FIG. 2 are a-Si transistors, and FIG. 53 is a layout diagram of the semiconductor layer shown in FIG. 52;

The layout diagram of the gate metal layer in FIG. 52 is shown in FIG. 5, the layout diagram of the source-drain metal layer in FIG. 52 is shown in FIGS. 9A and 9B, and the conductive layer in FIG. 52 is shown in FIG. 8.

The difference between the layout diagram of the first part of the 21T1C driving circuit using amorphous silicon transistors shown in FIG. 52 and the layout diagram of the first part of the 21T1C driving circuit using oxide transistors shown in FIG. 4A is that: in the semiconductor layer, the active pattern of each transistor is a block-shaped active pattern.

In at least one embodiment of the present disclosure, the difference between the layout diagram of the 21T1C driving circuit using amorphous silicon transistors and the layout diagram of the 21T1C driving circuit using oxide transistors is that:

In the semiconductor layer, the active pattern of each transistor is a block-shaped active pattern;

In the layout diagram of the 21T1C driving circuit using oxide transistors, in the source-drain metal layer, the source-drain patterns of some transistors in the 21T1C driving circuit are divided into at least two portions, and in the layout diagram of the 21T1C driving circuit using amorphous silicon oxide transistors, in the source-drain metal layer, the source-drain patterns of the transistors in the 21T1C driving circuit are all one portion, that is, by changing two masks (the two masks can be a mask used when making the semiconductor layer and a mask used when making the source-drain metal layer), the conversion between the driving circuit using the oxide transistor and the driving circuit using the amorphous silicon transistor can be realized.

Figure 56:
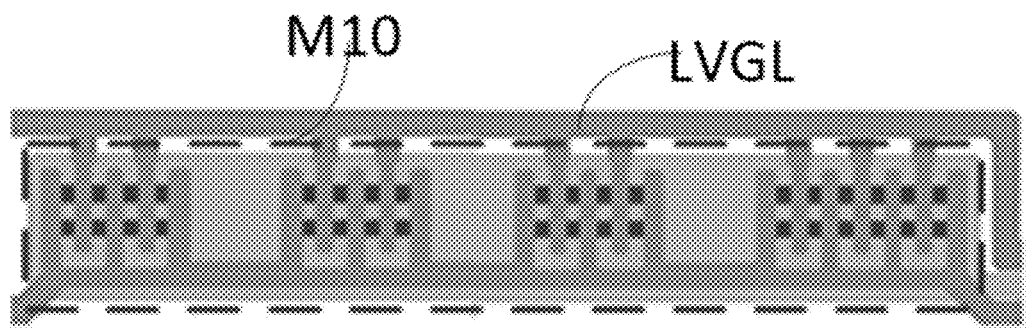
FIG. 56 is a layout diagram of the tenth transistor when the tenth transistor is an oxide transistor.
Figure 57:
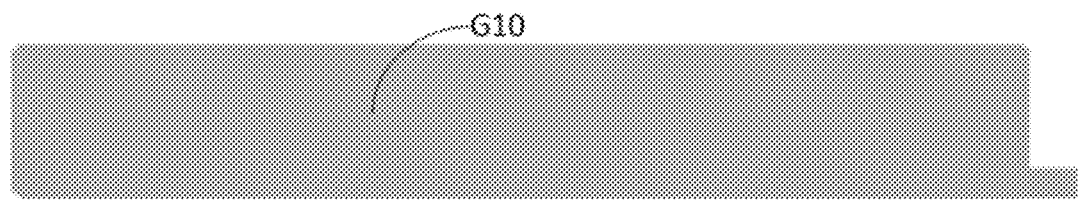
FIG. 57 is a layout diagram of the gate metal layer in FIG. 56.
Figure 58:
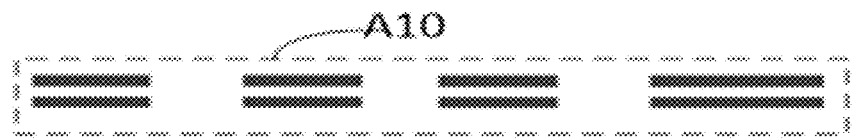
FIG. 58 is a layout diagram of the semiconductor layer in FIG. 56.

FIG. 56 is a layout diagram of the tenth transistor when the tenth transistor is an oxide transistor, FIG. 57 is a layout diagram of the gate metal layer in FIG. 56, FIG. 58 is a layout diagram of the semiconductor layer in FIG. 56, and FIG. 58 is the layout diagram of the source-drain metal layers in FIG. 56.

Figure 60:
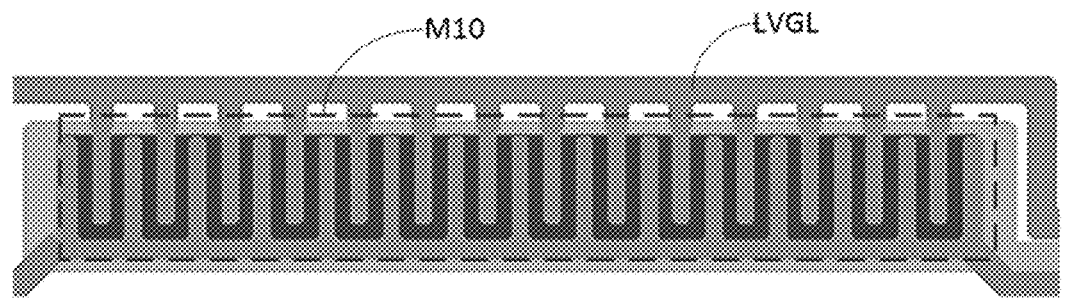
FIG. 60 is a layout diagram of the tenth transistor when the tenth transistor is an amorphous silicon transistor.
Figure 61:
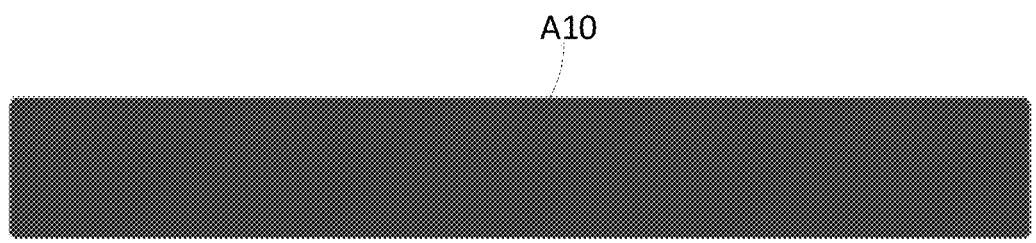
FIG. 61 is a layout diagram of the semiconductor layer in FIG. 60.
Figure 62:
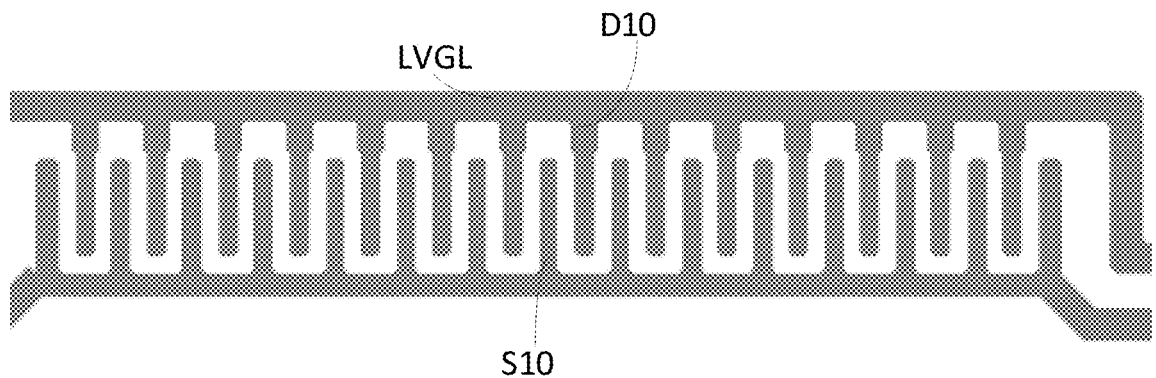
FIG. 62 is a layout diagram of the source-drain metal layer in FIG. 60.

FIG. 60 is a layout diagram of the tenth transistor when the tenth transistor is an amorphous silicon transistor, FIG. 61 is a layout diagram of the semiconductor layer in FIG. 60, and FIG. 62 is a layout diagram of the source-drain metal layer in FIG. 60;

The layout diagram of the gate metal layer in FIG. 60 is shown in FIG. 57.

In FIG. 56, the one labeled M10 is the tenth transistor and the one labeled LVGL is the first voltage line.

In FIG. 57, the one labeled G10 is the gate electrode of the tenth transistor.

In FIG. 58, the one labeled A10 is the tenth active pattern.

Figure 59:
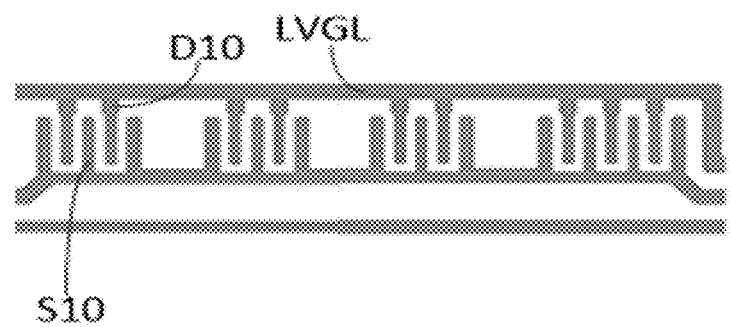
FIG. 59 is a layout diagram of the source-drain metal layer in FIG. 56.

In FIG. 59, the one labeled S10 is the first electrode of the tenth transistor, the one labeled D10 is the second electrode of the tenth transistor, and the one labeled LVGL is the first voltage line.

In FIG. 60, the one labeled M10 is the tenth transistor and the one labeled LVGL is the first voltage line.

In FIG. 61, the one labeled A10 is the tenth active pattern.

In FIG. 62, the one labeled S10 is the first electrode of the tenth transistor, the one labeled D10 is the second electrode of the tenth transistor, and the one labeled LVGL is the first voltage line.

Figure 63:
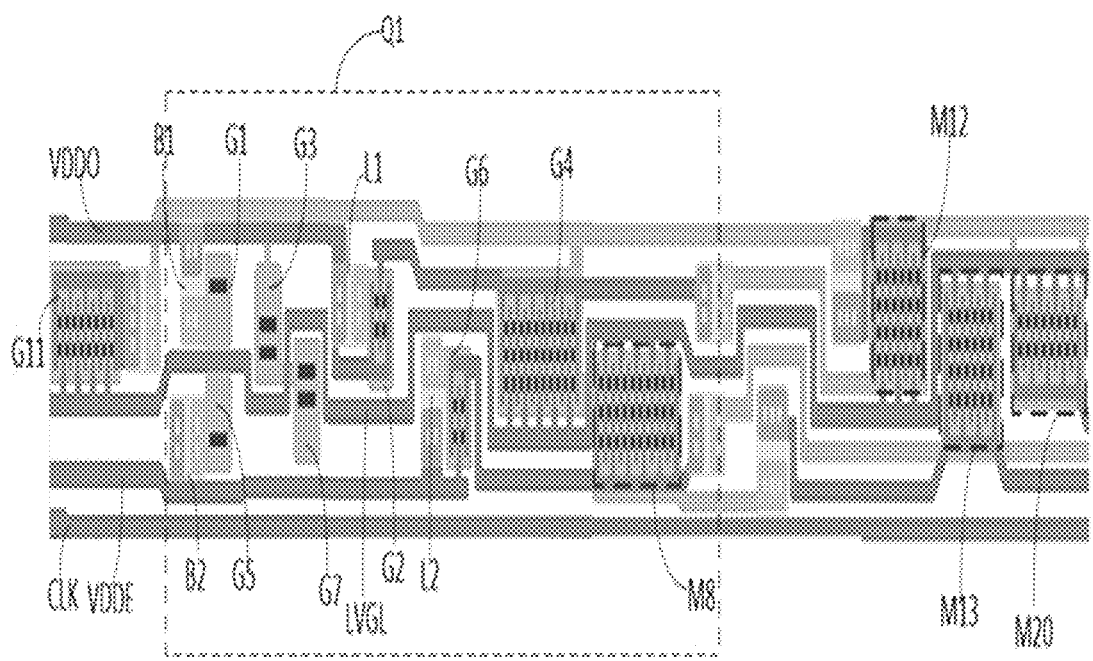
FIG. 63 is a combined diagram of the layout diagram of the first part of the 17T1C driving circuit shown in FIG. 3A and the layout diagram of the second part of the driving circuit shown in FIG. 10.

FIG. 63 is a combined diagram of the layout diagram of the first part of the 17T1C driving circuit shown in FIG. 3A and the layout diagram of the second part of the driving circuit shown in FIG. 10. In FIG. 63, the one labeled Q1 is the first area.

Figure 64:
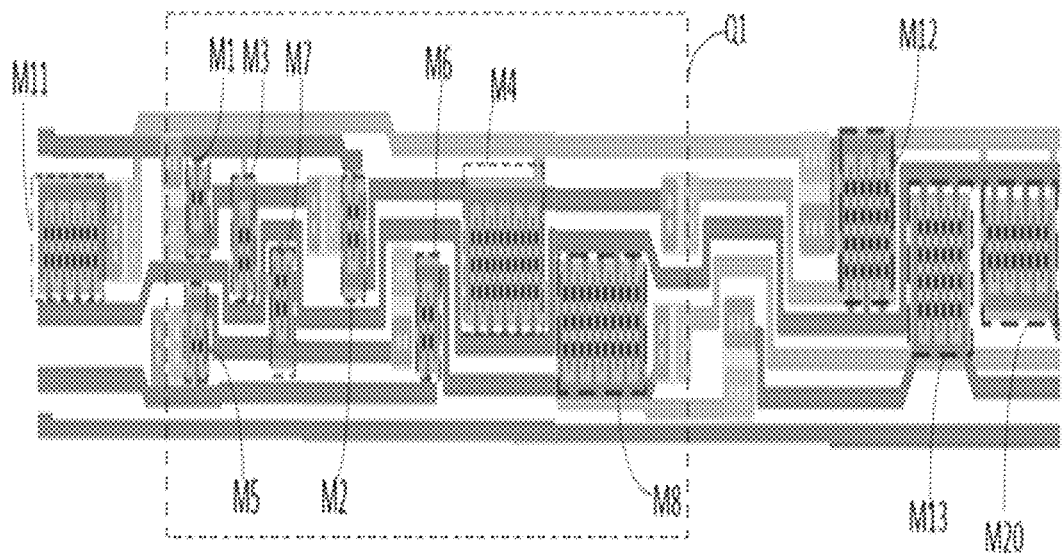
FIG. 64 is a combined diagram of the layout diagram of the first part of the 21T1C driving circuit shown in FIG. 4A and the layout diagram of the second part of the driving circuit shown in FIG. 10.

FIG. 64 is a combined diagram of the layout diagram of the first part of the circuit of the 21T1C driving circuit shown in FIG. 4A and the layout diagram of the second part of the circuit of the driving circuit shown in FIG. 10. In FIG. 64, the one labeled Q1 is the first area.

As shown in FIG. 63 and FIG. 64, the first pull-down node control circuit included in the driving circuit and the second pull-down node control circuit included in the driving circuit are arranged in the first area Q1.

In at least one embodiment of the present disclosure, when the number of clock signal lines used by the driving module (the driving module includes a plurality of stages of driving circuits) is the same, the cascading relationship of the 17T1C driving circuit and the cascading relationship of the 21T1C driving circuit are the same, the timing of the 17T1C driving circuit and the timing of the 21T1C driving circuit are the same, and the cascading relationship and timing are not affected by the design of reserving the first conductive portion, the second conductive portion, the third conductive portion and the fourth conductive portion in at least one embodiment of the present disclosure, taking the driving module including 16 clock signal lines as an example, the input signals connected to the first input terminals of the first eight rows of driving circuits are all provided by the start signal line S0, and the input signal connected to the first input terminal of the ath row of the driving circuit are all provided by the carry signal output terminal of the (a+8)th row of driving circuit, and the carry signal output terminal of the ath row of driving circuit provides a reset signal to the reset terminal of the (a−10)th row of driving circuit; a is a positive integer.

Figure 65:
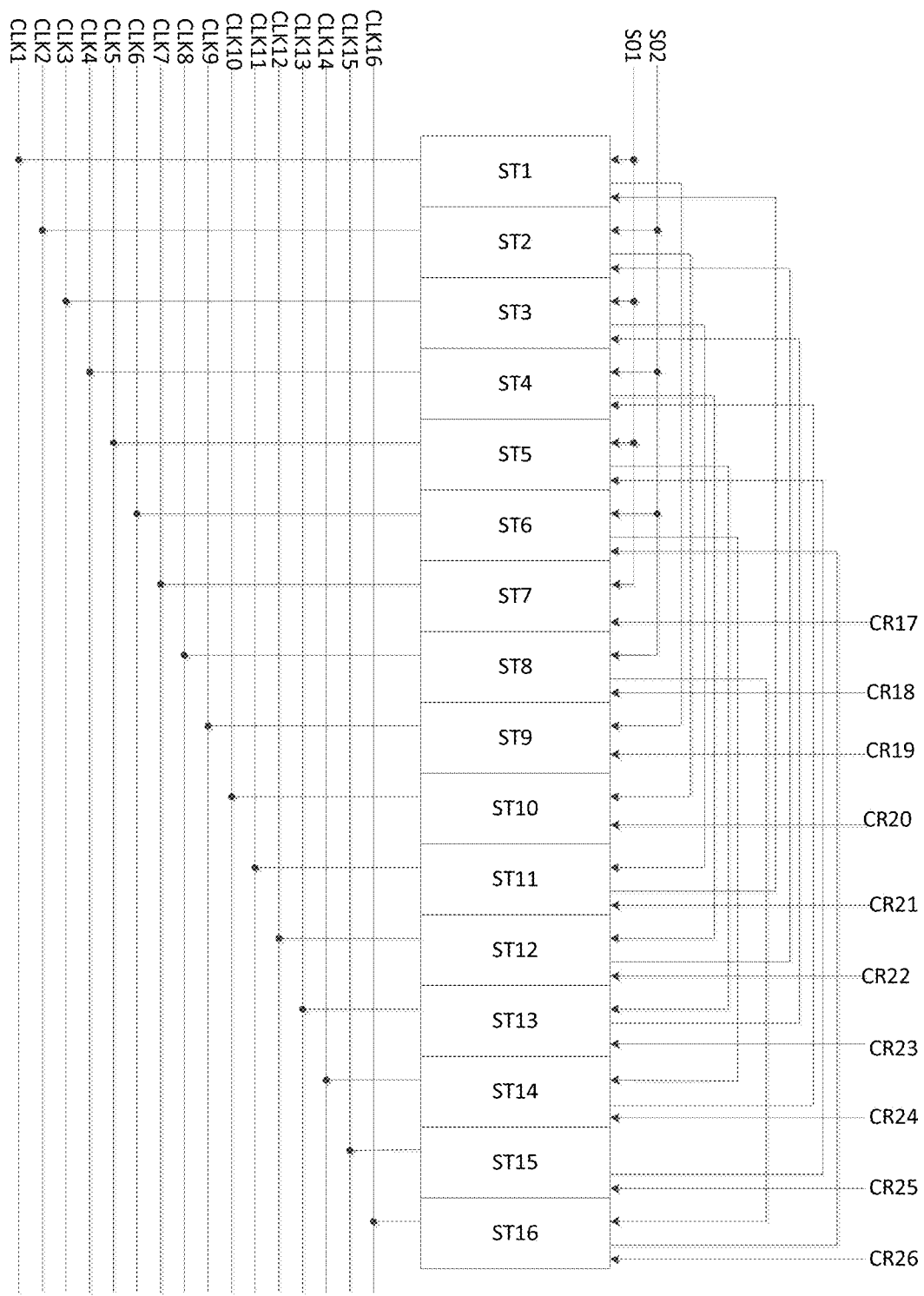
FIG. 65 is a structural diagram of a driving module according to at least one embodiment of the present disclosure.

In FIG. 65, the one labeled ST1 is the first row of driving circuit included in the driving module, the one labeled ST2 is the second row of driving circuit included in the driving module, and the one labeled ST3 is the third row of driving circuit included in the driving module, the one labeled ST4 is the fourth row of driving circuit included in the driving module, the one labeled ST5 is the fifth row of driving circuit included in the driving module, and the one labeled ST6 is the sixth row of driving circuit included in the driving module, the one labeled ST7 is the seventh row of driving circuit included in the driving module, the one labeled ST8 is the eighth row of driving circuit included in the driving module, and the one labeled ST9 is the ninth row of driving circuit included in the driving module, and the one labeled ST10 is the tenth row of driving circuit included in the driving module, the one labeled ST11 is the eleventh row of driving circuit included in the driving module, the one labeled ST12 is the twelfth row of driving circuit included in the driving module, and the one labeled ST13 is the thirteenth row of driving circuit included in the driving module, the one labeled ST14 is the fourteenth row of driving circuit included in the driving module, the one labeled ST15 is the fifteenth row of driving circuit included in the driving module, and the one labeled ST16 is the sixteenth row of driving circuit included in the driving module;

ST1 is electrically connected to the first clock signal line CLK1, ST2 is electrically connected to the second clock signal line CLK2, ST3 is electrically connected to the third clock signal line CLK3, ST4 is electrically connected to the fourth clock signal line CLK4, and ST5 is electrically connected to the fifth clock signal line CLK5, ST6 is electrically connected to the sixth clock signal line CLK6, ST7 is electrically connected to the seventh clock signal line CLK7, ST8 is electrically connected to the eighth clock signal line CLK8, ST9 is electrically connected to the ninth clock signal line CLK9, ST10 is electrically connected to the tenth clock signal line CLK10, ST11 is electrically connected to the eleventh clock signal line CLK11, ST12 is electrically connected to the twelfth clock signal line CLK12, ST13 is electrically connected to the thirteenth clock signal line CLK13, and ST14 is electrically connected to the fourteenth clock signal line CLK14, ST15 is electrically connected to the fifteenth clock signal line CLK15, and ST16 is electrically connected to the sixteenth clock signal line CLK16;

The first input terminal of ST1, the first input terminal of ST3, the first input terminal of ST5 and the first input terminal of ST7 are electrically connected to the first start signal line S01, the first input terminal of ST2, the first input terminal of ST4, the first input terminal of ST6 and the first input terminal of ST8 are electrically connected to the second start signal line S02, the first input terminal of ST9 is electrically connected to the carry signal output terminal of ST1, the first input terminal of ST10 is electrically connected to the carry signal output terminal of ST2, the first input terminal of ST11 is electrically connected to the carry signal output terminal of ST3, the first input terminal of ST12 is electrically connected to the carry signal output terminal of ST4, and the first input terminal of ST13 is electrically connected to the carry signal output terminal of ST5, the first input terminal of ST14 is electrically connected to the carry signal output terminal of ST6, the first input terminal of ST15 is electrically connected to the carry signal output terminal of ST7, and the first input terminal of ST16 is electrically connected to the carry signal output terminal of ST8;

The reset terminal of ST1 is electrically connected to the carry signal output terminal of ST11, the reset terminal of ST2 is electrically connected to the carry signal output terminal of ST12, the reset terminal of ST3 is electrically connected to the carry signal output terminal of ST13, and the reset terminal of ST4 is electrically connected to the carry signal output terminal of ST14, the reset terminal of ST5 is electrically connected to the carry signal output terminal of ST15, the reset terminal of ST6 is electrically connected to the carry signal output terminal of ST16, and the reset terminal of ST7 is connected to the carry signal output terminal of the seventeenth row of driving circuit CR17, the reset terminal of ST8 is electrically connected with the carry signal output terminal CR18 of the eighteenth row of driving circuit, the reset terminal of ST9 is electrically connected to the carry signal output terminal CR19 of the nineteenth row of driving circuit, and the reset terminal of ST10 is electrically connected to the carry signal output terminal CR20 of the twentieth row of driving circuit, the reset terminal of ST11 is electrically connected to the carry signal output terminal CR21 of the twenty-first row of driving circuit, and the reset terminal of ST12 is electrically connected to the carry signal output terminal CR22 of the twenty-second row of driving circuit, the reset terminal of ST13 is electrically connected to the carry signal output terminal CR23 of the twenty-third row of driving circuit, the reset terminal of ST14 is electrically connected to the carry signal output terminal CR24 of the twenty-fourth row of driving circuit, and the reset terminal of ST15 is electrically connected to the carry signal output terminal CR25 of the twenty-fifth row of driving circuit, and the reset terminal of ST16 is electrically connected to the carry signal output terminal CR26 of the twenty-sixth row of driving circuit.

Figure 66:
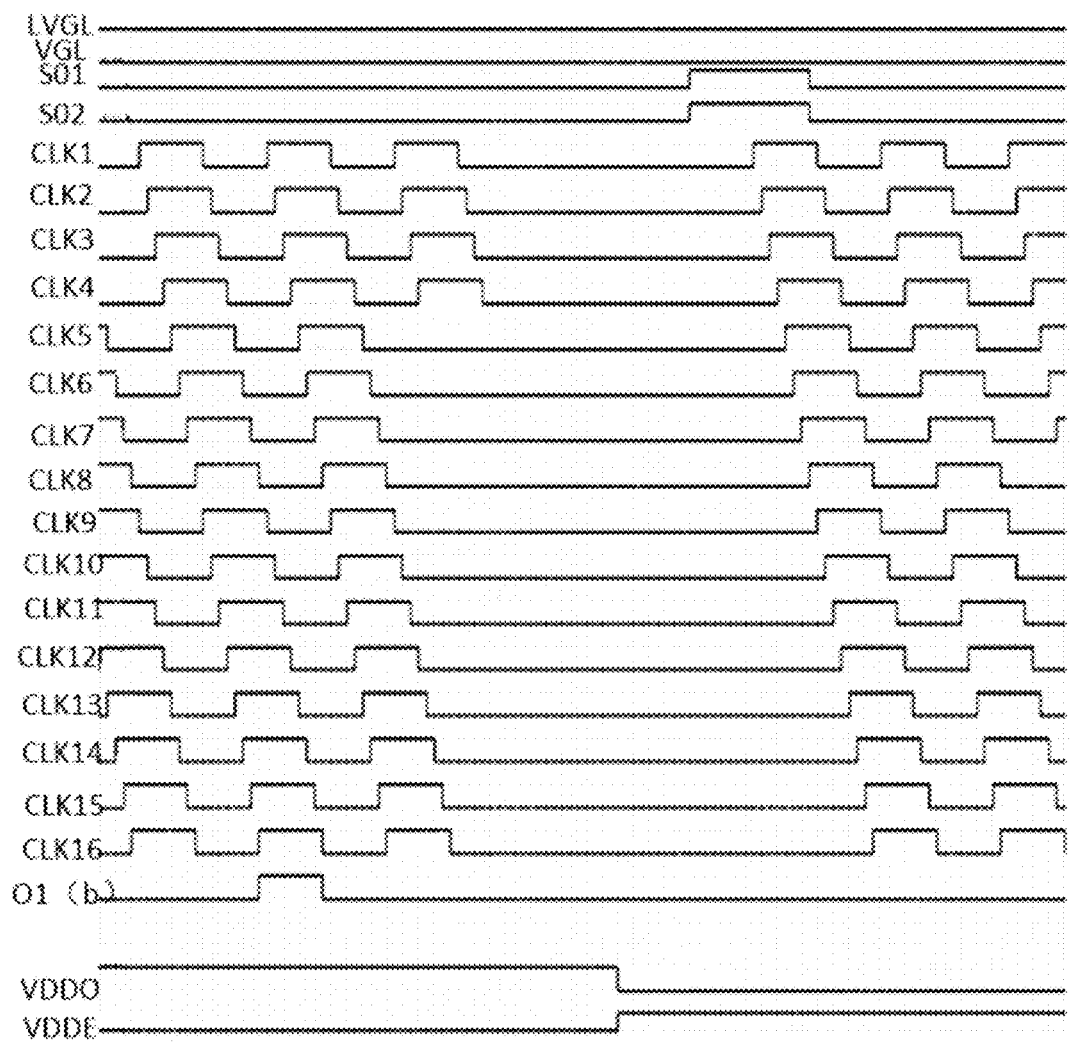
FIG. 66 is a working timing diagram of the driving module shown in FIG. 65.

FIG. 66 is a working timing diagram of the driving module shown in FIG. 65.

In FIG. 66, the one labeled O1(b) is the bth row of driving signal output terminal, and b is a positive integer.

The method of manufacturing the array substrate described in the embodiment of the present disclosure is configured to manufacture the above-mentioned array substrate, and the method of manufacturing the array substrate includes:
   forming a pull-up node control circuit, a first pull-down node control circuit, and an output circuit on a base substrate;
   forming a first conductive portion and a first control voltage line on the base substrate, and electrically connecting the first conductive portion to the first control voltage line. In at least one embodiment of the present disclosure, the step of forming a first conductive portion and a first control voltage line on the base substrate, and electrically connecting the first conductive portion to the first control voltage line includes:
   forming a first metal layer on the base substrate, performing a patterning process on the first metal layer to form a first gate pattern, the first gate pattern including the first conductive portion;
   Forming a second metal layer on a side of the first metal layer away from the base substrate, performing patterning on the second metal layer using a first mask to form a first control voltage line;
   Electrically connecting the first gate pattern to the first control voltage line, wherein the first conductive portion and the second metal layer do not overlap in a direction perpendicular to the base substrate.

During specific implementation, the first conductive portion and the second metal layer do not overlap in a direction perpendicular to the base substrate, that is, the orthographic projection of the first conductive portion on the base substrate does not overlap the orthographic projection of the second metal layer on the base substrate.

In at least one embodiment of the present disclosure, when preparing the 17T1C driving circuit, the first mask can be used to perform patterning on the second metal layer (the second metal layer can be a source-drain metal layer) to form the first control voltage line, the first control voltage line is electrically connected to the first gate pattern included in the first conductive portion, and at this time, above the first conductive portion, there is no second metal layer whose orthographic projection overlaps the first conductive portion.

Optionally, the first metal layer may be a gate metal layer, and the second metal layer may be a source-drain metal layer.

The step of forming the first conductive portion and the first control voltage line on the base substrate, and electrically connecting the first conductive portion to the first control voltage line includes:
   forming a first metal layer on the base substrate, performing a patterning process on the first metal layer to form a first gate pattern, the first gate pattern including the first conductive portion;
   Forming a second metal layer on a side of the first metal layer away from the base substrate, performing a patterning process on the second metal layer using a second mask, forming a first control voltage line, and forming a first electrode of a first transistor and a second electrode of the first transistor; wherein an orthographic projection of the first electrode of the first transistor on the base substrate at least partially overlaps an orthographic projection of the first conductive portion on the base substrate, and an orthographic projection of the second electrode of the first transistor on the base substrate at least partially overlaps the orthographic projection of the first conductive portion on the base substrate.

In at least one embodiment of the present disclosure, when preparing the 21T1C driving circuit, a second mask plate can be used to perform a patterning process on the second metal layer (the second metal layer can be a source-drain metal layer) to form the first control voltage line, the first electrode of the first transistor and the second electrode of the first transistor, in a direction perpendicular to the base substrate, the projection of the first electrode of the first transistor at least partially overlaps the projection of the first conductive portion, the projection of the second electrode of the first transistor at least partially overlaps the projection of the first conductive portion.

In at least one embodiment of the present disclosure, when performing a patterning process on the second metal layer, the pattern formed on the second metal layer included in the 17T1C driving circuit or the pattern formed on the second metal layer included in the 21TT1C driving circuit are formed by using the first mask or the second mask, and the other masks used in preparing the 17T1C driving circuit and the 21T1C driving circuit can be the same. At least one embodiment of the present disclosure can realize the conversion between the 17T1C driving circuit and the 21T1C driving circuit only by adding a new mask (the mask can be the mask used when making the source-drain metal layer), which effectively improves product compatibility, and saves mask costs.

In at least one embodiment of the present disclosure, the method of manufacturing the array substrate may further include:

forming a conductive layer on a side of the second metal layer away from the substrate, and performing a patterning process on the conductive layer to form a first connection structure;

electrically connecting the first electrode of the first transistor to the first control voltage line, and electrically connecting the second electrode of the first transistor to the first connection structure;

The orthographic projection of at least part of the first electrode of the first transistor on the base substrate overlaps the orthographic projection of the first conductive portion on the base substrate, and the orthographic projection of at least part of the second electrode of the first transistor on the base substrate overlaps the orthographic projection of the first conductive portion on the base substrate.

The method of manufacturing the array substrate described in at least one embodiment of the present disclosure further includes:

performing a patterning process on the first metal layer to form a third gate pattern included in the second conductive portion;

electrically connecting the third gate pattern to the pull-up node.

The method of manufacturing the array substrate described in at least one embodiment of the present disclosure further includes:

performing a patterning process on the second metal layer to form a first voltage line, a first electrode of the third transistor, and a second electrode of the third transistor;

electrically connecting the first electrode of the third transistor to the first connection structure, and electrically connecting the second electrode of the third transistor to the first voltage line;

The orthographic projection of at least part of the first electrode of the third transistor on the base substrate overlaps the orthographic projection of the second conductive portion on the base substrate, and the orthographic projection of at least part of the second electrode of the third transistor on the base substrate overlaps the orthographic projection of the second conductive portion on the base substrate.

In at least one embodiment of the present disclosure, the method of manufacturing the array substrate further includes:

performing a patterning process on the first metal layer to form a fifth gate pattern included in the third conductive portion;

performing a patterning process on the second metal layer to form a second control voltage line;

electrically connecting the fifth gate pattern to the second control voltage line.

The method of manufacturing the array substrate described in at least one embodiment of the present disclosure further includes:

performing a patterning process on the second metal layer to form the first electrode of the fifth transistor and the second electrode of the fifth transistor;

performing a patterning process on the first conductive portion to form a second connection structure;

electrically connecting the first electrode of the fifth transistor to the second control voltage line, and electrically connecting the second electrode of the fifth transistor to the second connection structure;

The orthographic projection of at least part of the first electrode of the fifth transistor on the base substrate overlaps the orthographic projection of the third conductive portion on the base substrate, and the orthographic projection of at least part of the second electrode of the fifth transistor on the base substrate overlaps the orthographic projection of the third conductive portion on the base substrate.

In at least one embodiment of the present disclosure, the method of manufacturing the array substrate further includes:

performing a patterning process on the first metal layer to form a seventh gate pattern included in the fourth conductive portion;

electrically connecting the seventh gate pattern to the pull-up node.

The method of manufacturing the array substrate described in at least one embodiment of the present disclosure further includes:

performing a patterning process on the second metal layer to form a first voltage line, a first electrode of the seventh transistor, and a second electrode of the seventh transistor;

electrically connecting the first electrode of the seventh transistor to the second connection structure, and electrically connecting the second electrode of the seventh transistor to the first voltage line;

the orthographic projection of at least part of the first electrode of the seventh transistor on the base substrate overlaps the orthographic projection of the fourth conductive portion on the base substrate, and an orthographic projection of at least part of the second electrode of the seventh transistor on the base substrate overlaps an orthographic projection of the fourth conductive portion on the base substrate.

The display device described in the embodiment of the present disclosure includes the above-mentioned array substrate.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. An array substrate, comprising a driving circuit arranged on a base substrate, wherein the driving circuit includes a pull-up node control circuit, a first pull-down node control circuit, and an output circuit;

the pull-up node control circuit is electrically connected to a pull-up node, and is configured to control a potential of the pull-up node;

the first pull-down node control circuit is electrically connected to a first control voltage line and a first pull-down node, and is configured to control to write a first control voltage provided by the first control voltage line into the first pull-down node;

the output circuit is electrically connected to the pull-up node and a driving signal output terminal respectively, and is configured to control the driving signal output terminal to output a driving signal under the control of the potential of the pull-up node;

the array substrate further includes a first conductive portion arranged on the base substrate;

the first conductive portion is electrically connected to the first control voltage line, wherein the first conductive portion is formed by a first gate pattern; or, the first conductive portion is formed by the first gate pattern and a first active pattern;

the first gate pattern is electrically connected to the first control voltage line, wherein the first pull-down node control circuit comprises a second transistor; a gate electrode of the second transistor is electrically connected to a first connection structure, a first electrode of the second transistor is electrically connected to the first control voltage line, a second electrode of the second transistor is electrically connected to the first pull-down node, and wherein the first pull-down node control circuit is further configured to write a first voltage signal provided by a first voltage line into the first pull-down node;

the array substrate further includes a second conductive portion arranged on the base substrate;

the second conductive portion is electrically connected to the pull-up node.

2. The array substrate according to claim 1, wherein a shortest distance between an orthographic projection of the first conductive portion on the base substrate and an orthographic projection of the first control voltage line on the base substrate is greater than or equal to 4 um and less than or equal to 12 um.

3. The array substrate according to claim 1, wherein the first connection structure is electrically connected to the first control voltage line.

4. The array substrate according to claim 1, wherein the second conductive portion is formed by a third gate pattern; or, the second conductive portion is formed by the third gate pattern and a third active pattern; the third gate pattern is electrically connected to the pull-up nodes; or wherein a shortest distance between an orthographic projection of the second conductive portion on the base substrate and an orthographic projection of the first control voltage line on the base substrate is greater than or equal to 4 um; a shortest distance between the orthographic projection of the second conductive portion on the base substrate and an orthographic projection of the first voltage line on the base substrate is greater than or equal to 4 um and less than or equal to 12 um; or wherein the first pull-down node control circuit comprises a fourth transistor; a gate electrode of the fourth transistor is electrically connected to the pull-up node, a first electrode of the fourth transistor is electrically connected to the first pulldown node, and a second electrode of the fourth transistor is electrically connected to the first voltage line.

5. The array substrate according to claim 1, wherein the driving circuit further comprises a second pull-down node control circuit;

the second pull-down node control circuit is electrically connected to a second control voltage line and a second pull-down node, and is configured to control to write a second control voltage provided by the second control voltage line into the second pull-down node;

the array substrate further includes a third conductive portion arranged on the base substrate;

the third conductive portion is electrically connected to the second control voltage line.

6. The array substrate according to claim 5, wherein the third conductive portion is formed by a fifth gate pattern; or, the third conductive portion is formed by the fifth gate pattern and a fifth active pattern;

or wherein a shortest distance between an orthographic projection of the third conductive portion on the base substrate and an orthographic projection of the second control voltage line on the base substrate is greater than or equal to 4 um and less than or equal to 12 um.

7. The array substrate according to claim 6, wherein the second pull-down node control circuit comprises a sixth transistor;

a gate electrode of the sixth transistor is electrically connected to a second connection structure, a first electrode of the sixth transistor is electrically connected to the second control voltage line, and a second electrode of the sixth transistor is electrically connected to the second pull-down node, wherein the second connection structure is electrically connected to the second control voltage line;

or wherein the second pull-down node control circuit is further configured to write the first voltage signal provided by the first voltage line into the second pull-down node;

the array substrate further includes a fourth conductive portion arranged on the base substrate;

the fourth conductive portion is electrically connected to the pull-up node.

8. The array substrate according to claim 7, wherein the fourth conductive portion is formed by a seventh gate pattern; or, the fourth conductive portion is formed by the seventh gate pattern and a seventh active pattern;

the seventh gate pattern is electrically connected to the pull-up node, wherein a shortest distance between an orthographic projection of the fourth conductive portion on the base substrate and an orthographic projection of the second control voltage line on the base substrate is greater than or equal to 4 um, and a shortest distance between the orthographic projection of the fourth conductive portion on the base substrate and an orthographic projection of the first voltage line on the base substrate is greater than or equal to 4 um and less than or equal to 12 um;

or wherein the second pull-down node control circuit comprises an eighth transistor;

a gate electrode of the eighth transistor is electrically connected to the pull-up node, a first electrode of the eighth transistor is electrically connected to the second pull-down node, and a second electrode of the eighth transistor is electrically connected to the first voltage line.

9. The array substrate according to claim 1, wherein the array substrate further comprises a first source-drain metal pattern and a third source-drain metal pattern arranged on the base substrate; the first source-drain metal pattern includes a first electrode of a first transistor and a second electrode of the first transistor; the first electrode of the first transistor is electrically connected to the first control voltage line, and the second electrode of the first transistor is electrically connected to the first connection structure; an orthographic projection of at least part of the first electrode of the first transistor on the base substrate overlaps an orthographic projection of the first conductive portion on the base substrate, and an orthographic projection of at least part of the second electrode of the first transistor on the base substrate overlaps the orthographic projection of the first conductive portion on the base substrate; the third source-drain metal pattern includes a first electrode of a third transistor and a second electrode of the third transistor; the first electrode of the third transistor is electrically connected to the first connection structure, and the second electrode of the third transistor is electrically connected to the first voltage line; an orthographic projection of at least part of the first electrode of the third transistor on the base substrate overlaps an orthographic projection of the second conductive portion on the base substrate, and an orthographic projection of at least part of the second electrode of the third transistor on the base substrate overlaps the orthographic projection of the second conductive portion on the base substrate.

10. The array substrate according to claim 7, wherein the array substrate further comprises a fifth source-drain metal pattern arranged on the base substrate and a seventh source-drain metal pattern arranged on the base substrate;
the fifth source-drain metal pattern includes a first electrode of a fifth transistor and a second electrode of the fifth transistor;
the first electrode of the fifth transistor is electrically connected to the second control voltage line, and the second electrode of the fifth transistor is electrically connected to the second connection structure;
an orthographic projection of at least part of the first electrode of the fifth transistor on the base substrate overlaps an orthographic projection of a third conductive portion on the base substrate, and an orthographic projection of at least part of the second electrode of the fifth transistor on the base substrate overlaps the orthographic projection of the third conductive portion on the base substrate;
the seventh source-drain metal pattern includes a first electrode of a seventh transistor and a second electrode of the seventh transistor;
the first electrode of the seventh transistor is electrically connected to the second connection structure, and the second electrode of the seventh transistor is electrically connected to the first voltage line;
an orthographic projection of at least part of the first electrode of the seventh transistor on the base substrate overlaps an orthographic projection of a fourth conductive portion on the base substrate, and an orthographic projection of at least part of the second electrode of the seventh transistor on the base substrate overlaps the orthographic projection of the fourth conductive portion on the base substrate.

11. The array substrate according to claim 1, wherein the pull-up node control circuit comprises a ninth transistor, a tenth transistor, an eleventh transistor, a twelfth transistor, and a thirteenth transistor;
a gate electrode of the ninth transistor is electrically connected to a first input terminal, a first electrode of the ninth transistor is electrically connected to a second input terminal, and a second electrode of the ninth transistor is electrically connected to the pull-up node;
a gate electrode of the tenth transistor is electrically connected to a reset terminal, a first electrode of the tenth transistor is electrically connected to the pull-up node, and a second electrode of the tenth transistor is electrically connected to the first voltage line;
a gate electrode of the eleventh transistor is electrically connected to a start voltage line, a first electrode of the eleventh transistor is electrically connected to the pull-up node, and a second electrode of the eleventh transistor is electrically connected to the first voltage line;
a gate electrode of the twelfth transistor is electrically connected to the first pull-down node, a first electrode of the twelfth transistor is electrically connected to the pull-up node, and a second electrode of the twelfth transistor is electrically connected to the first voltage line;
a gate electrode of the thirteenth transistor is electrically connected to a second pull-down node, a first electrode of the twelfth transistor is electrically connected to the pull-up node, and a second electrode of the twelfth transistor is connected to the first voltage line,
wherein the output circuit comprises a sixteenth transistor; a gate electrode of the sixteenth transistor is electrically connected to the pull-up node, and a first electrode of the sixteenth transistor is electrically connected to a clock signal line, and a second electrode of the sixteenth transistor is electrically connected to the driving signal output terminal;
the first electrode of the ninth transistor includes N first electrode portions, and the second electrode of the ninth transistor includes N second electrode portions;
the first electrode of the sixteenth transistor includes M first electrode portions, and the second electrode of the sixteenth transistor includes M second electrode portions;
an nth first electrode portion of the ninth transistor and an nth second electrode portion of the ninth transistor are arranged in an nth first source-drain area;
an mth first electrode portion of the sixteenth transistor and an mth second electrode portion of the sixteenth transistor are arranged in an mth second source-drain area;
N and M are integers greater than 1, n is a positive integer less than or equal to N, and m is a positive integer less than or equal to M.

12. The array substrate according to claim 1, wherein an active pattern included in transistors in the driving circuit include at least one strip-shaped active pattern portion; or,
the active pattern included in the transistors in the driving circuit is a block-shaped active pattern.

13. A method of manufacturing an array substrate, the method comprising:
forming a pull-up node control circuit, a first pull-down node control circuit, and an output circuit on the base substrate;
forming a first conductive portion and a first control voltage line on the base substrate, and electrically connecting the first conductive portion to the first control voltage line,
wherein the forming the first conductive portion and the first control voltage line on the base substrate, and electrically connecting the first conductive portion to the first control voltage line includes: forming a first metal layer on the base substrate, performing a patterning process on the first metal layer to form a first gate pattern, the first gate pattern including the first conductive portion; forming a second metal layer on a side of the first metal layer away from the base substrate, performing a patterning on the second metal layer using a first mask to form the first control voltage line; electrically connecting the first gate pattern to the first control voltage line, wherein the first conductive portion and the second metal layer do not overlap in a direction perpendicular to the base substrate,
wherein the array substrate, comprising a driving circuit arranged on a base substrate, wherein the driving circuit includes a pull-up node control circuit, a first pull-down node control circuit, and an output circuit;

the pull-up node control circuit is electrically connected to a pull-up node, and is configured to control a potential of the pull-up node;

the first pull-down node control circuit is electrically connected to a first control voltage line and a first pull-down node, and is configured to control to write a first control voltage provided by the first control voltage line into the first pull-down node; the output circuit is electrically connected to the pull-up node and a driving signal output terminal respectively, and is configured to control the driving signal output terminal to output a driving signal under the control of the potential of the pull-up node; the array substrate further includes a first conductive portion arranged on the base substrate; the first conductive portion is electrically connected to the first control voltage line.

14. The method according to claim 13, wherein the forming the first conductive portion and the first control voltage line on the base substrate, and electrically connecting the first conductive portion to the first control voltage line includes:

forming a first metal layer on the base substrate, performing a patterning process on the first metal layer to form a first gate pattern, the first gate pattern including the first conductive portion;

forming a second metal layer on a side of the first metal layer away from the base substrate, performing a patterning on the second metal layer using a first mask to form the first control voltage line;

electrically connecting the first gate pattern to the first control voltage line, wherein the first conductive portion and the second metal layer do not overlap in a direction perpendicular to the base substrate.

15. The method according to claim 13, wherein, the forming the first conductive portion and the first control voltage line on the base substrate, and electrically connecting the first conductive portion to the first control voltage line includes:

forming a first metal layer on the base substrate, performing a patterning process on the first metal layer to form a first gate pattern, the first gate pattern including the first conductive portion;

forming a second metal layer on a side of the first metal layer away from the base substrate, performing a patterning process on the second metal layer using a second mask to form the first control voltage line, and a first electrode of a first transistor and a second electrode of the first transistor; wherein an orthographic projection of the first electrode of the first transistor on the base substrate at least partially overlaps an orthographic projection of the first conductive portion on the base substrate, and an orthographic projection of the second electrode of the first transistor on the base substrate at least partially overlaps the orthographic projection of the first conductive portion on the base substrate;

wherein the method further comprises:

forming a conductive layer on a side of the second metal layer away from the substrate, and performing a patterning process on the conductive layer to form a first connection structure;

electrically connecting the first electrode of the first transistor to the first control voltage line, and electrically connecting the second electrode of the first transistor to the first connection structure;

an orthographic projection of at least part of the first electrode of the first transistor on the base substrate overlapping the orthographic projection of the first conductive portion on the base substrate, and an orthographic projection of at least part of the second electrode of the first transistor on the base substrate overlapping the orthographic projection of the first conductive portion on the base substrate, performing a patterning process on the first metal layer to form a third gate pattern included in a second conductive portion;

electrically connecting the third gate pattern to the pull-up node;

performing a patterning process on the second metal layer to form a first voltage line, a first electrode of a third transistor, and a second electrode of the third transistor;

electrically connecting the first electrode of the third transistor to the first connection structure, and electrically connecting the second electrode of the third transistor to the first voltage line;

an orthographic projection of at least part of the first electrode of the third transistor on the base substrate overlapping an orthographic projection of the second conductive portion on the base substrate, and an orthographic projection of at least part of the second electrode of the third transistor on the base substrate overlapping the orthographic projection of the second conductive portion on the base substrate.

16. The method according to claim 13, further comprising:

performing a patterning process on the first metal layer to form a fifth gate pattern included in a third conductive portion;

performing a patterning process on the second metal layer to form a second control voltage line;

electrically connecting the fifth gate pattern to the second control voltage lines performing a patterning process on the second metal layer to form a first electrode of a fifth transistor and a second electrode of the fifth transistor;

performing a patterning process on the first conductive portion to form a second connection structure;

electrically connecting the first electrode of the fifth transistor to the second control voltage line, and electrically connecting the second electrode of the fifth transistor to the second connection structure;

an orthographic projection of at least part of the first electrode of the fifth transistor on the base substrate overlapping an orthographic projection of a third conductive portion on the base substrate, and an orthographic projection of at least part of the second electrode of the fifth transistor on the base substrate overlapping the orthographic projection of the third conductive portion on the base substrate;

performing a patterning process on the first metal layer to form a seventh gate pattern included in a fourth conductive portion;

electrically connecting the seventh gate pattern to the pull-up node;

performing a patterning process on the second metal layer to form a first voltage line, a first electrode of a seventh transistor, and a second electrode of the seventh transistor;

electrically connecting the first electrode of the seventh transistor to the second connection structure, and electrically connecting the second electrode of the seventh transistor to the first voltage line;

an orthographic projection of at least part of the first electrode of the seventh transistor on the base substrate overlapping an orthographic projection of a fourth conductive portion on the base substrate, and an orthographic projection of at least part of the second electrode of the seventh transistor on the base substrate overlapping the orthographic projection of the fourth conductive portion on the base substrate.

17. A display device comprising an array substrate including a driving circuit arranged on a base substrate, wherein the driving circuit includes a pull-up node control circuit, a first pull-down node control circuit, and an output circuit;

the pull-up node control circuit is electrically connected to a pull-up node, and is configured to control a potential of the pull-up node; the first pull-down node control circuit is electrically connected to a first control voltage line and a first pull-down node, and is configured to control to write a first control voltage provided by the first control voltage line into the first pull-down node;

the output circuit is electrically connected to the pull-up node and a driving signal output terminal respectively, and is configured to control the driving signal output terminal to output a driving signal under the control of the potential of the pull-up node;

the array substrate further includes a first conductive portion arranged on the base substrate;

the first conductive portion is electrically connected to the first control voltage line, wherein the first conductive portion is formed by a first gate pattern; or, the first conductive portion is formed by the first gate pattern and a first active pattern;

the first gate pattern is electrically connected to the first control voltage line, wherein the first pull-down node control circuit comprises a second transistor; a gate electrode of the second transistor is electrically connected to a first connection structure, a first electrode of the second transistor is electrically connected to the first control voltage line, a second electrode of the second transistor is electrically connected to the first pull-down node, and wherein the first pull-down node control circuit is further configured to write a first voltage signal provided by a first voltage line into the first pull-down node;

the array substrate further includes a second conductive portion arranged on the base substrate; the second conductive portion is electrically connected to the pull-up node.

* * * * *